United States Patent
Sakui

(10) Patent No.: US 7,099,200 B2
(45) Date of Patent: Aug. 29, 2006

(54) NONVOLATILE SEMICONDUCTOR MEMORY

(75) Inventor: Koji Sakui, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 81 days.

(21) Appl. No.: 10/805,460

(22) Filed: Mar. 22, 2004

(65) Prior Publication Data

US 2004/0240273 A1 Dec. 2, 2004

(30) Foreign Application Priority Data

Apr. 22, 2003 (JP) ............................. 2003-117290

(51) Int. Cl.
*G11C 16/04* (2006.01)

(52) U.S. Cl. ..................... 365/185.33; 365/185.29; 365/185.11

(58) Field of Classification Search ........... 365/185.33, 365/185.29, 185.11
See application file for complete search history.

(56) References Cited

U.S. PATENT DOCUMENTS

| | | | |
|---|---|---|---|
| 4,636,984 A | 1/1987 | Neukomm | |
| 5,777,925 A | 7/1998 | Tokushige | |
| 5,949,714 A * | 9/1999 | Hemink et al. | 365/185.17 |
| 6,307,807 B1 | 10/2001 | Sakui et al. | |
| 6,370,081 B1 | 4/2002 | Sakui et al. | |
| 6,512,703 B1 | 1/2003 | Sakui et al. | |
| 6,862,223 B1 * | 3/2005 | Lee et al. | 365/185.33 |
| 2001/0017789 A1 * | 8/2001 | Noda | 365/185.12 |
| 2001/0050377 A1 * | 12/2001 | Ikehashi et al. | 257/200 |

FOREIGN PATENT DOCUMENTS

| | | |
|---|---|---|
| EP | 0 986 067 A2 | 3/2000 |
| JP | 8-87895 | 4/1996 |
| JP | 11-195718 | 7/1999 |
| JP | 11-297081 | 10/1999 |
| JP | 2000-149581 | 5/2000 |
| JP | 2002-43444 | 2/2002 |
| KR | 10-0207972 | 7/1999 |
| KR | 2000-0023005 | 4/2000 |

OTHER PUBLICATIONS

Art Lancaster, et al. "A 5V-Only EEPROM with Internal Program/Erase Control", ISSCC Digest of Technical Papers, 1983 IEEE International Solid-State Circuits Conference, Session XIII: Nonvolatile Memory, Feb. 24, 1983, p. 164-165 and p. 302.

Fujio Masuoka, et al., "New Ultra High Density EPROM and Flash EEPROM with NAND Structure Cell", IEDM 87, pp. 552-555.

Fujio Masuoka, et al., "A New Flash $E^2$PROM Cell Using Triple Polysilicon Technology", IEDM 84, pp. 464-467.

William S. Johnson, et al. "A 16Kb Electrically Erasable Nonvolatile Memory" Digest of Technical Papers, 1980 IEEE International Solid-State Circuits Conference, Session XII: ROMs, PROMs and EROMs, Feb. 14, 1980, p. 152-153 and p. 271.

U.S. Appl. No. 11/083,156, filed Mar. 18, 2005, Hasegawa et al.

* cited by examiner

*Primary Examiner*—Huan Hoang
(74) *Attorney, Agent, or Firm*—Oblon, Spivak, McClelland, Maier & Neustadt, P.C.

(57) ABSTRACT

In a 3Tr. NAND including a cell unit constituted of one memory cell and two select gate transistors between which the cell is held, to renew data by a byte unit, at an erase time, a potential of a bit line or source line can be set by the byte unit, so that erase by the byte unit is possible. Accordingly, with respect to only the data of the memory cell which is a renewal object, an erase/write operation is performed, and reliability of a memory operation is enhanced.

33 Claims, 48 Drawing Sheets

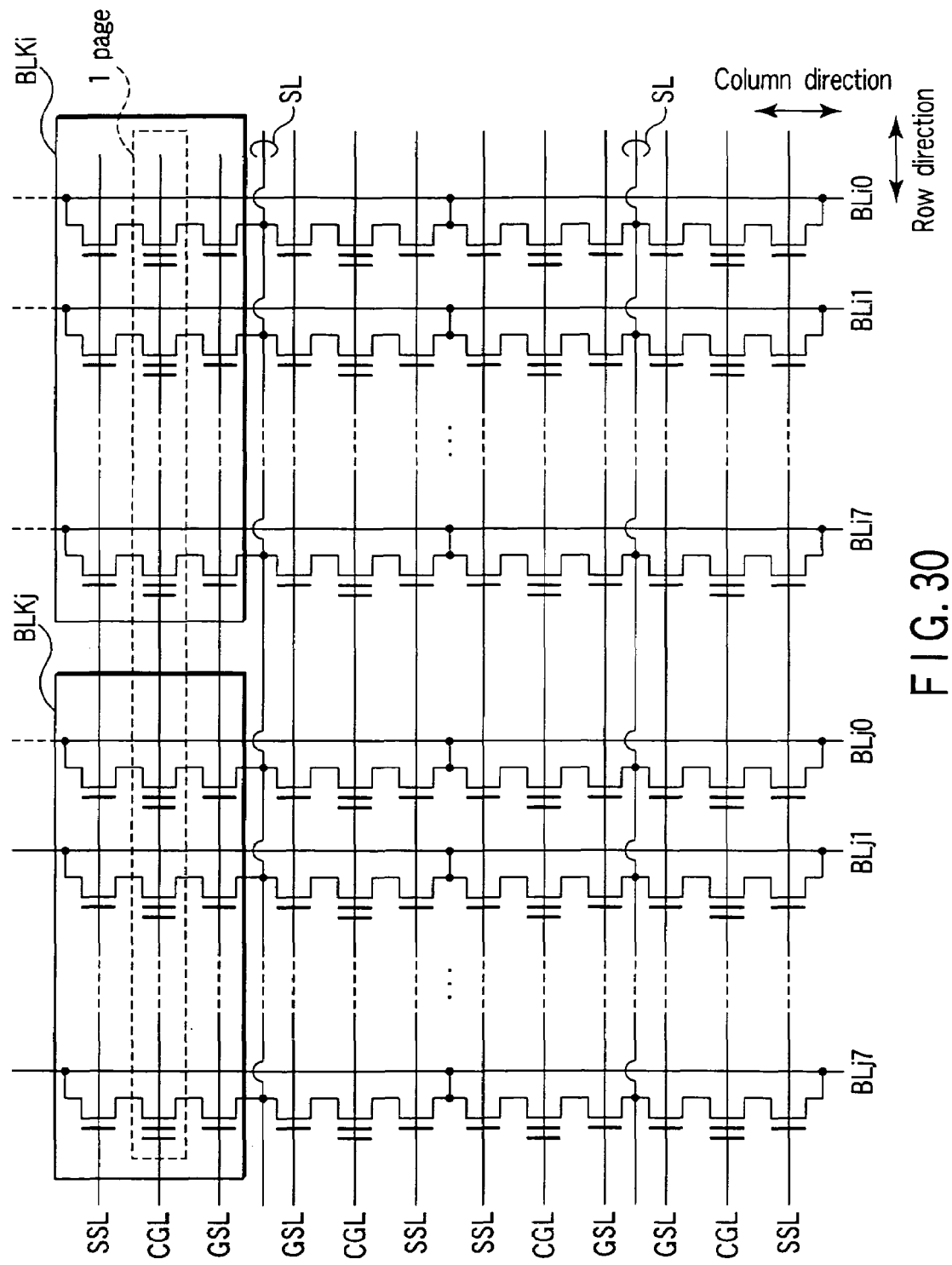
F I G. 30

*Only positive bias

*Using positive/negative bias

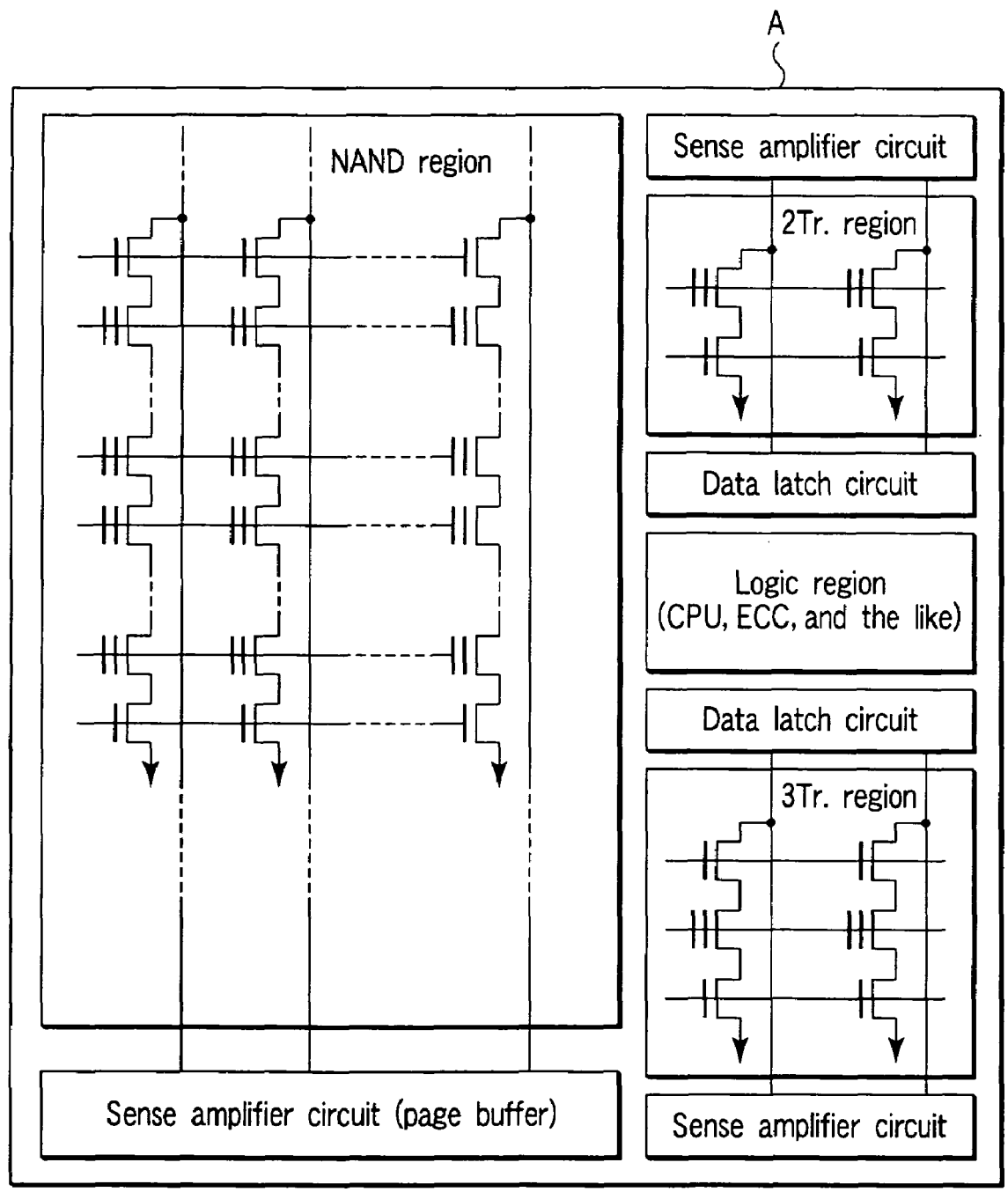
F I G. 40

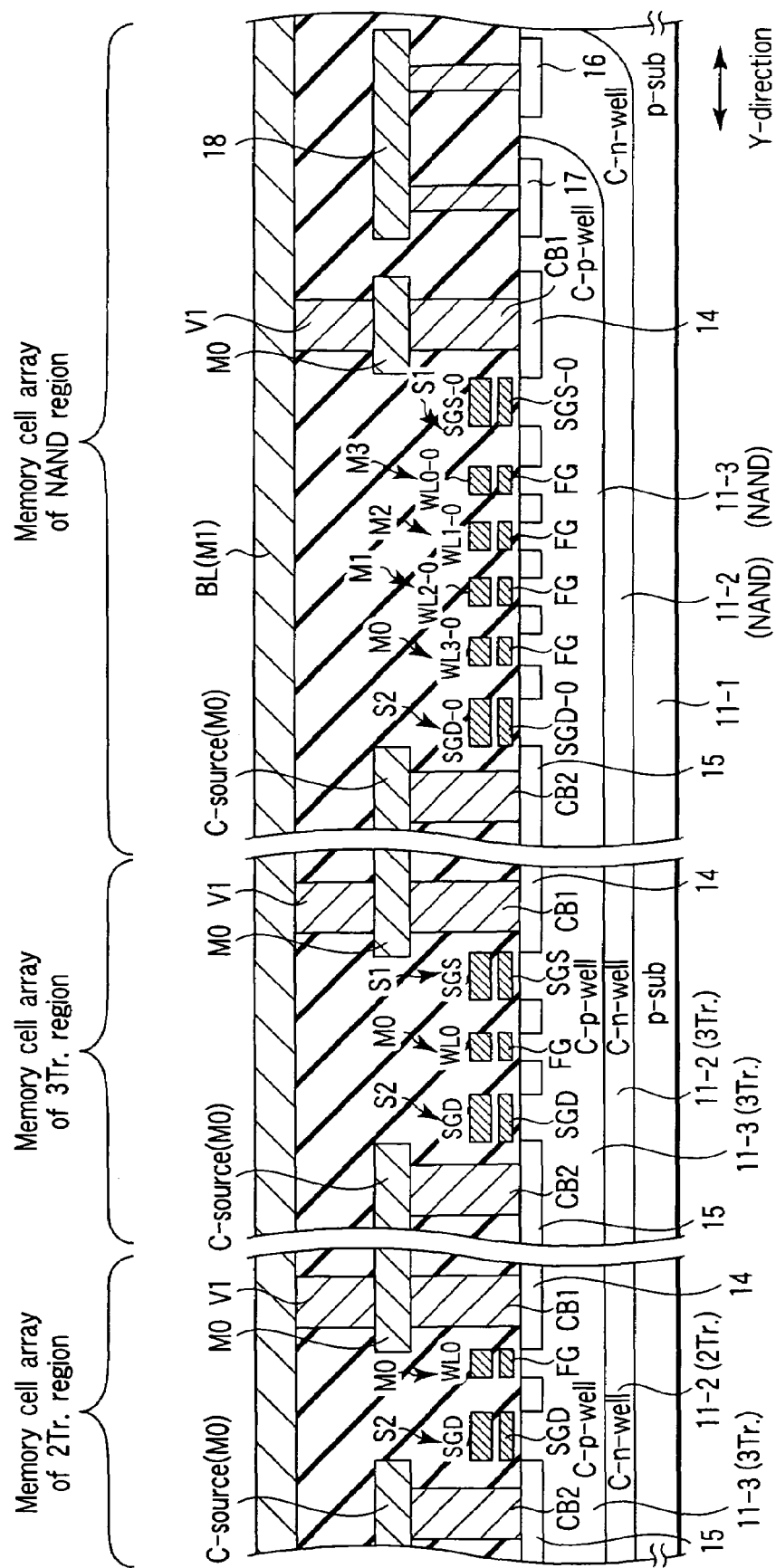
F I G. 42

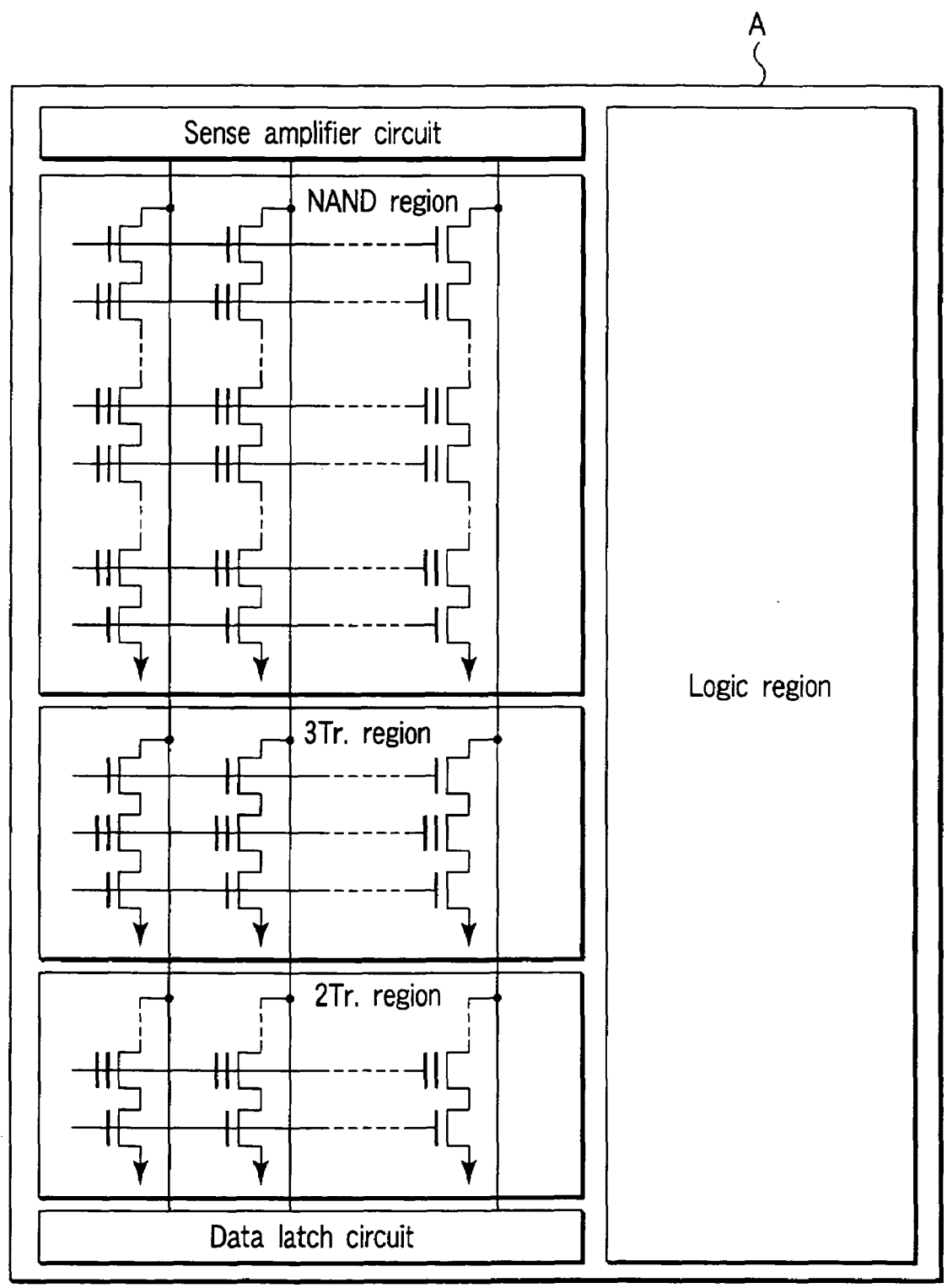
F I G. 51

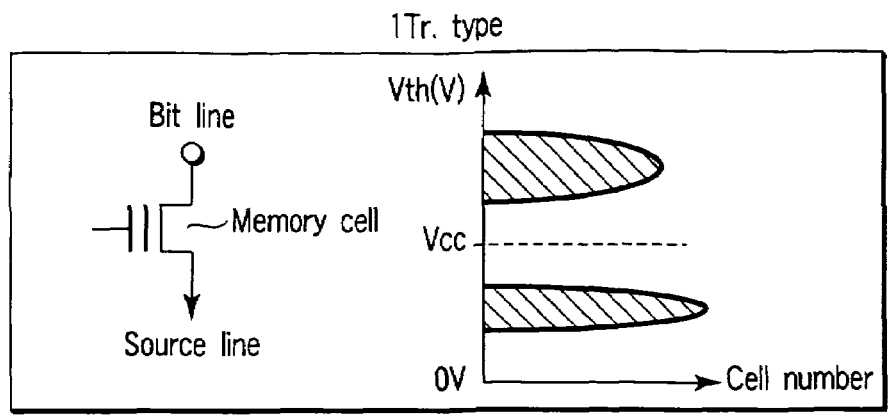
F I G. 56
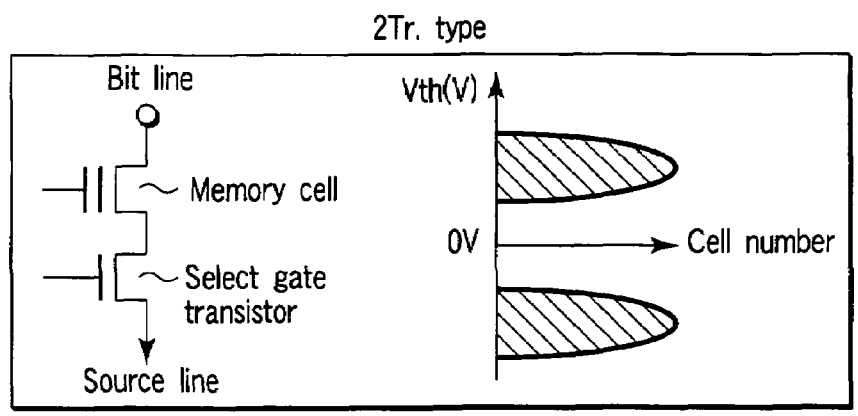
F I G. 57
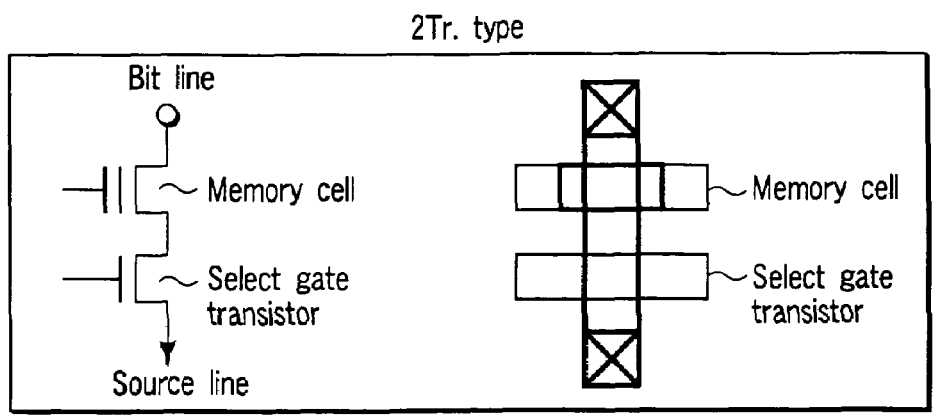
F I G. 58

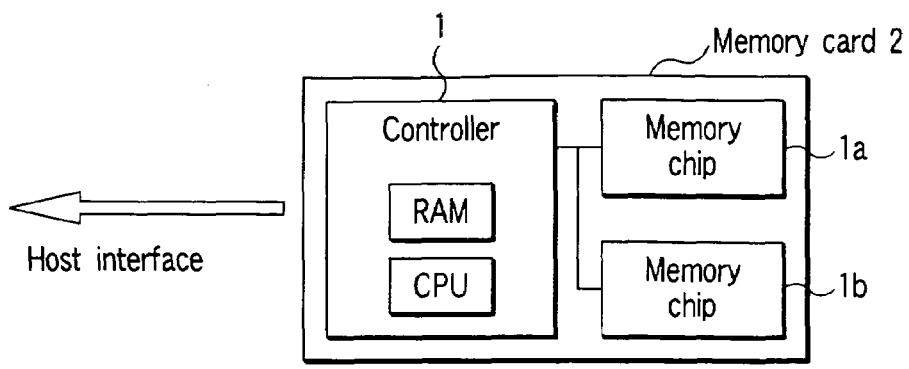
F I G. 64
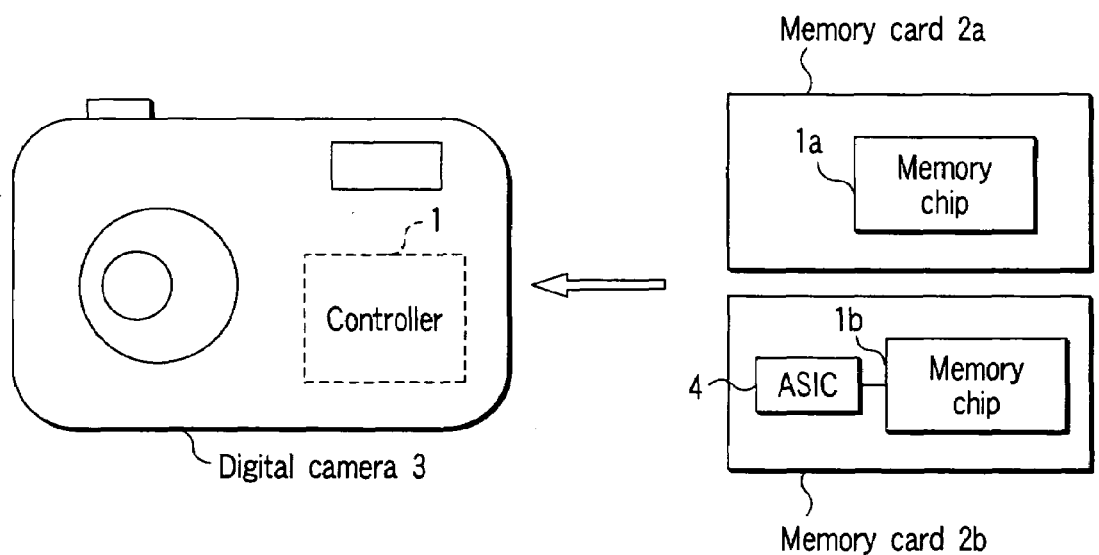
F I G. 65
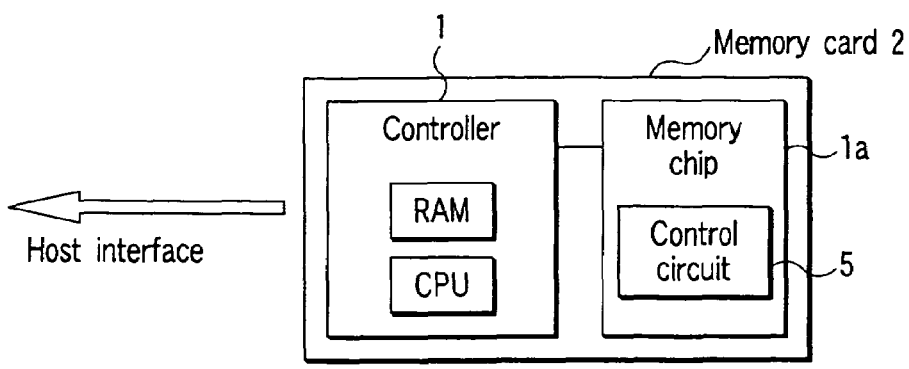
F I G. 66

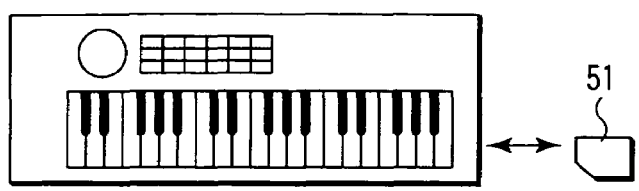
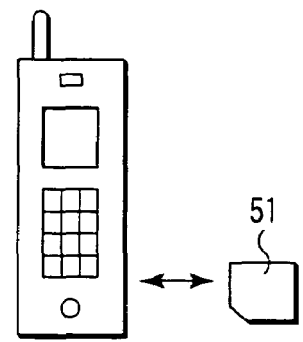
FIG. 73  FIG. 74
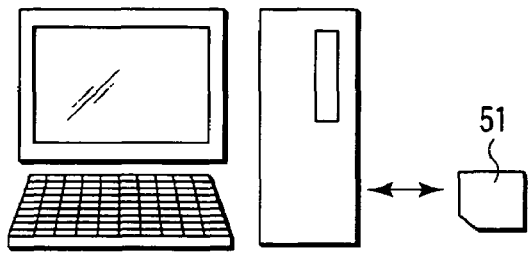
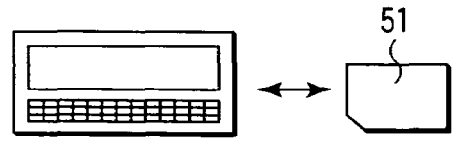
FIG. 75  FIG. 76
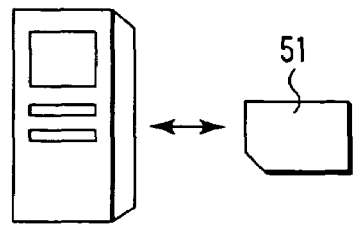
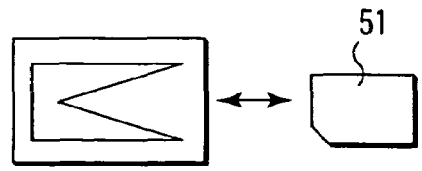
FIG. 77  FIG. 78

NONVOLATILE SEMICONDUCTOR MEMORY

CROSS-REFERENCE TO RELATED APPLICATIONS

This application is based upon and claims the benefit of priority from prior Japanese Patent Application No. 2003-117290, filed Apr. 22, 2003, the entire contents of which are incorporated herein by reference.

BACKGROUND OF THE INVENTION

1. Field of the Invention

The present invention relates to a nonvolatile semiconductor memory in which data of a memory cell can be renewed by a byte unit.

2. Description of the Related Art

An EEPROM is known as a nonvolatile semiconductor memory in which data of a memory cell can be renewed by a byte unit. For example, for a floating gate tunnel oxide (FLOTOX) cell disclosed in Non-patent Document 1, the data of the memory cell can be renewed by the byte unit.

FIG. 1 is a plan view of a FLOTOX cell, and FIG. 2 is a sectional view along line II—II of FIG. 1. The characteristics of the cell lie in that a thin oxide film 22a having a thickness of about 10 nm referred to as a tunnel oxide film exists on an N⁺ drain region 20a. When a high electric field is generated between the drain region 20a and a control gate electrode 23a, charges are exchanged between the drain region 20a and a floating gate electrode 21a via a tunnel oxide film.

FIG. 3 shows a band structure of a portion of the tunnel oxide film 22a of FIGS. 1 and 2. As apparent from this figure, when the high electric field is generated between the drain region 20a and control gate electrode 23a, a Fowler-Nordheim (FN) tunnel current flows through the tunnel oxide film 22a according to Equation (1):

$$I = S\alpha E^2 \exp(-\beta/E), \quad (1)$$

wherein S denotes an area of the tunnel oxide film, and E denotes the electric field.

$$\alpha = q^3/8\pi h \Phi B$$
$$= 6.94 \times 10^{-7} \; [\text{A}/\text{V}^2]$$
$$\beta = -4(2m)^{0.5} \Phi_B^{1.5}/3hq$$
$$= 2.54 \times 10^8 \; [\text{V/cm}]$$

According to this equation, it is seen that an FN tunnel current starts to flow in an electric field of about 10 MV/cm. This intensity of the electric field corresponds to a case in which a voltage of about 10V is applied to the tunnel oxide film having a thickness of about 10 nm.

Here, assuming that a ratio of capacities of the floating gate electrode 21a and control gate electrode 23a to those of the floating gate electrode 21a and surrounding electrode wiring, that is, a coupling ratio is 0.5, in order to obtain a potential difference of 10V between the floating gate electrode 21a and drain region 20a, for example, the drain region 20a needs to be set to 0V, and the control gate electrode 23a needs to be set to 20V. At this time, electrons in the drain region 20a are injected into the floating gate electrode 21a.

Moreover, when the coupling ratio is 0.5, in order to obtain a potential difference of 10V between the floating gate electrode 21a and drain region 20a, for example, the drain region 20a needs to be set to 20V, and the control gate electrode 23a needs to be set to 0V. At this time, the electrons in the floating gate electrode 21a are discharged into the drain region 20a.

The memory cell using the FLOTOX cell cannot be constituted of only one element of the FLOTOX cell. This is because a reverse bias applied to a non-selected memory cell at an erase time generates a write state. That is, to solve this problem, for example, one memory cell has to be constituted of a circuit shown in FIG. 4.

Bias conditions in each mode of EEPROM using the memory cell shown in FIG. 4 are shown in Table 1.

TABLE 1

| Mode | | Selected byte | Non-selected byte connected to the same word line as that of selected byte | Non-selected byte connected to the same bit line as that of selected byte |
|---|---|---|---|---|
| Erase ("0" write) | Word line | High | High | Low |
| | Byte control | High | Low | High |
| | Bit line | Low | Low | Low |
| "1" Write | Word line | High | High | Low |
| | Byte control | Low | Low | Low |
| | Bit line | High or Low*1 | Low | High or Low*2 |

*1= Data dependent
*2= Don't care

This memory cell is a novel circuit in which various disturbances can completely be removed by a selected transistor ST and transfer gate Tr, but the number of transistors per memory cell is 2+(1/8) transistors, and there is a problem that a memory cell size increases. The tunnel oxide film needs to be disposed in a region separate from that in which a cell transistor is formed, and this causes cost increase.

The nonvolatile semiconductor memory developed to avoid this problem is a flash memory (EEPROM). In a related-art EEPROM, it is possible to erase and write the data every bit, and the EEPROM is very easy to use. However, for example, for a hard disk, the data does not have to be renewed every bit, and the hard disk suffices, if the data can be exchanged by a sector unit, that is, by a unit of one group of a plurality of bits.

It is necessary not to renew the data every bit, but to provide an inexpensive nonvolatile semiconductor memory. From this idea, a flash memory has been developed as described in Non-patent Document 2.

A basic structure of the memory cell is the same as that of an ultraviolet erase type EPROM as shown in FIG. 5. That is, the floating gate electrode is disposed between the control gate electrode and silicon substrate (channel) of MOS transistor. The write is performed by injection of hot electrons in the same manner as in the ultraviolet erase type EPROM, and the erase is performed by discharge of the electric field from the floating gate electrode in the same manner as in a byte type EPROM.

An erase principle of the flash memory is the same as that of the byte type EEPROM, but the entire structure is totally different from that of the byte type EEPROM. That is, in the byte type EEPROM, the data is erased by a byte unit. However, for the flash memory, in principle, all the bits are collectively erased.

Moreover, as described above, the data is written in the flash memory by the hot electron injection in the same manner as in the ultraviolet erase type EPROM, and it is therefore possible to write the data every bit. That is, concerning a write/erase operation, for the flash memory, all the bits are collectively erased, and this is the same as in the ultraviolet erase type EPROM in which the data is written every bit by the hot electron injection.

Furthermore, an NAND type flash memory has been proposed as a flash memory which can highly be integrated as described in Non-patent Document 3.

For example, as shown in FIGS. 6 and 7, a memory cell array of the NAND type flash memory is constituted of an NAND cell unit. The NAND cell unit is constituted of a cell array including a plurality of (e.g., 16) memory cells connected in series, and two select gate transistors disposed in opposite ends of the cell array.

In the NAND type flash memory, only one bit line contact portion and only one source line contact portion may be disposed with respect to one NAND cell unit, and this can contribute to reduction of a memory cell size per bit and further to the reduction of a chip size. For example, in the NAND type flash memory, the chip size can largely be reduced as compared with an NOR type flash memory (FIG. 8) in which the memory cells only for one bit are disposed between the bit line and source line.

In this manner, the NAND type flash memory has maximum features of a large-capacity file memory, in which the chip size is small and a bit cost is small. Also for the function of the NAND type flash memory, as compared with the NOR type flash memory, there are features that renewal speed of the data is fast and that power consumption is small.

The features that the renewal speed of the data is fast and that the power consumption is small are realized by a data renewal system peculiar to the NAND type flash memory. This peculiar data renewal system comprises: using an FN tunnel current to discharge/charge electric charges between the silicon substrate and floating gate electrode and to write and erase the data.

Therefore, considering only the memory cell, in principle, the current necessary for the write is only the FN tunnel current with respect to only the floating gate electrode. That is, the power consumption at a write time is largely reduced as compared with the NOR type flash memory by the hot electron injection. Therefore, even when the data is simultaneously written with respect to a plurality of bits, the power consumption hardly increases.

For example, with a 64 megabit NAND type flash memory, it is possible to write the data by a unit of one page (512 bytes) at 200 µs. In this manner, for the NAND type flash memory, as compared with the NOR type flash memory, there are features that a renewal time by one block unit is very short and that the power consumption necessary for the renewal is also small.

Table 2 shows the features of the NAND type flash memory in comparison with those of the NOR type flash memory.

TABLE 2

|  | NAND | NOR |
|---|---|---|
| Advantage | (1) Write speed is fast<br>(2) Erase speed is fast<br>(3) Block size is small and file is easily managed. | (1) Random access is fast<br>(2) Write is possible at random every byte |
| Disadvantage | (1) Random access is slow<br>(2) Write is not possible every byte | (1) Write speed is slow<br>(2) Erase speed is slow |
| Use | Replacement of hard disk and floppy disk, portable terminal (handy terminal, sound recording, electronic still camera) Fax/modem data recording | Replacement of related-art EPROM field, control apparatus, BIOS of PC, cellular phone, memories for control such as HDD |

As shown in Table 2, advantages and disadvantages of both the memories are in a mutual complementary relation. For example, concerning use, the NAND type flash memory is used in a field in which the data is renewed/read by a specific block data unit. For example, in a digital camera including 300,000 pixels, since a photograph of one shot requires a storage capacity of about 0.5 megabits, the NAND type flash memory has broadly been used for data storage.

On the other hand, the NOR type flash memory has broadly been used as a memory for control program of a cellular phone, because a random access is possible at a high rate of 100 ns.

In this manner, in a field of the nonvolatile semiconductor memory, the memory has evolved into the EEPROM (related-art type), flash memory, and NAND type flash memory. Instead of a renewal function by the byte unit, the reduction of the memory cell size, that is, the reduction of cost per bit (bit cost) has been achieved.

However, in recent years, there has been a rising demand for the data renewal by the byte unit in a logic embedded nonvolatile memory. For example, in an IC card, when a part of the data is renewed in management of moneys such as income and expenditure, with the use of the flash memory, the amount of data to be renewed becomes excessively large.

Therefore, to eliminate these disadvantages, a byte type EEPROM is required in which the renewal is possible by the byte unit. Additionally, the byte type EEPROM has a problem that the number of elements per bit, that is, a cell area is large as described above. At present, mainstream of the nonvolatile semiconductor memory has been the flash memory (NOR type, NAND type, and the like). Therefore, with the same process as that of the memory, a development cost and production cost can be reduced.

Under these situations, at present, a nonvolatile semiconductor memory has been developed which can be formed by the same process as that of the flash memory and in which the same data renewal system as that of the flash memory can be used and in which the renewal by the byte unit is also possible (e.g., see Patent Documents 1 to 5).

Particularly, the nonvolatile semiconductor memory described in Patent Document 3 is referred to as so-called 3Tr. NAND, and will be noticed as a memory embedded with the logic circuit or the NAND type flash memory. The memory cell of 3Tr. NAND is constituted of three transistors in total including one cell transistor and two select gate transistors between which the cell transistor is held.

In 3Tr. NAND, for example, to renew the data with respect to an arbitrary memory cell in memory cells for one page connected to a selected control gate line, a method is used comprising: (1) reading the data of the memory cells for one page into a sense amplifier; (2) erasing the page; (3) overwriting only the data to be renewed in the one page data in a sense amplifier; and thereafter (4) rewriting the data with respect to the memory cell for one page.

This is the renewing by the byte unit as seen from the outside of a chip. However, when seen from the inside of the chip, also for the data which is not to be renewed, the cell data is once erased by page erase. That is, with occurrence of an operation defect or an erroneous operation in the sense amplifier in which the cell data is temporarily stored, there is a possibility that the data not to be renewed turns to wrong data.

Needless to say, since an error correction circuit (ECC) is disposed in the chip to enhance reliability, the situation can be handled by the ECC in any case, but if there is not such fear, that would be the best possible thing.

Patent Document 1: Jpn. Pat. Appln. KOKAI Publication No. 11-195718

Patent Document 2: Jpn. Pat. Appln. KOKAI Publication No. 11-297081

Patent Document 3: Jpn. Pat. Appln. KOKAI Publication No. 2000-149581

Patent Document 4: Jpn. Pat. Appln. KOKAI Publication No. 2002-43444

Patent Document 5: U.S. Pat. No. 4,636,984

Non-patent Document 1: W. Johnson et al., "A 16 Kb Electrically Erasable Nonvolatile Memory," ISSCC Digest of Technical Papers, pp. 152 and 153, February 1980

Non-patent Document 2: F. Masuoka et al., "A new Flash EEPROM cell using triple polysilicon technology," IEDM Technical Digest, pp. 464 to 467 December 1984.

Non-patent Document 3: F. Masuoka et al., "New ultra high density EPROM and Flash EEPROM with NAND structured cell." IEDM Technical Digest, pp. 552 to 555 December 1987.

BRIEF SUMMARY OF THE INVENTION

According to an aspect of the present invention, there is provided a nonvolatile semiconductor memory comprising: first cell units each comprising one memory cell and two select gate transistors between which the memory cell is held; a word line connected in common to each memory cell of the first cell units; bit lines individually connected to the first cell units; sense amplifiers disposed for the bit lines; and an erase circuit which divides the first cell units into blocks and which sets potentials of the bit lines by a block unit at an erase time.

According to another aspect of the present invention, there is provided a nonvolatile semiconductor memory comprising: first cell units each comprising one memory cell and two select gate transistors between which the memory cell is held; a word line connected in common to each memory cell of the first cell units; bit lines individually connected to the first cell units; sense amplifiers disposed for the bit lines; source lines which divide the first cell units into blocks and which are connected to the first cell units; and an erase circuit which sets potentials of the source lines by a block unit at an erase time.

According to another aspect of the present invention, there is provided a nonvolatile semiconductor memory comprising: first cell units each comprising memory cells connected in series and two select gate transistors between which the memory cells are held; second cell units each comprising one memory cell and one select gate transistor; bit lines which are individually connected to the first cell units and which are individually connected to the second cell units and which are connected in common to the first and second cell units; and sense amplifiers disposed for the bit lines, wherein at least an FN tunnel current is used with respect to the respective memory cells in the first and second cell units to perform write/erase.

According to another aspect of the present invention, there is provided a data renewal method using a nonvolatile semiconductor memory comprising cell units each comprising one memory cell and two select gate transistors between which the memory cell is held, a word line connected in common to the memory cells of the cell units, and bit lines individually connected to the cell units as an object, the method comprising: performing data erase with respect to only the respective memory cells in the cell unit which is the renewal object in the cell units; and thereafter performing data write with respect to only the respective memory cells in the cell unit which is the renewal object.

According to another aspect of the present invention, there is provided a data erase method with respect to a cell unit comprising a first select gate transistor in which a drain region is connected to the bit line, a second select gate transistor in which a source region is connected to a source line, and a memory cell which is connected between the first and second select gate transistors and which comprises a control gate electrode and floating gate electrode, the method comprising: supplying a first potential to a bit line; supplying a second potential higher than the first potential to the gate electrode of the first select gate transistor; supplying a third potential lower than the first potential to the control gate electrode; and extracting an electron to the drain region from the floating gate electrode to erase data of the memory cell.

According to another aspect, there is provided a data erase method with respect to a cell unit comprising a first select gate transistor in which a drain region is connected to a bit line, a second select gate transistor in which a source region is connected to the source line, and a memory cell which is connected between the first and second select gate transistors and which comprises a control gate electrode and floating gate electrode, the method comprising: supplying a first potential to a source line; supplying a second potential higher than the first potential to the gate electrode of the second select gate transistor; supplying a third potential lower than the first potential to the control gate electrode; and extracting an electron to the source region from the floating gate electrode to erase data of the memory cell.

A embedded memory chip according to another aspect of the present invention comprises at least two memory cell arrays of different types. At least the two memory cell arrays includes at least two of a first memory cell array including a first cell unit constituted of one memory cell and one select gate transistor, a second memory cell array including a second cell unit constituted of one memory cell and two select gate transistors between which the memory cell is held, and a third memory cell array including a third cell unit constituted of memory cells.

BRIEF DESCRIPTION OF THE SEVERAL VIEWS OF THE DRAWING

FIG. 30 is a diagram showing the memory cell array of the 3Tr. NAND of FIG. 29;

FIG. 40 is a diagram showing an example of a embedded memory chip according to the embodiment of the present invention;

FIG. 42 is a diagram showing the structure example of the memory cell array in the embedded memory chip;

FIG. 51 is a diagram showing the example of the embedded memory chip according to the embodiment of the present invention;

FIG. 56 is a diagram showing a memory cell of 1Tr. type;

FIG. 57 is a diagram showing the memory cell of 2Tr. type;

FIG. 58 is a diagram showing the memory cell of 2Tr. type;

FIG. 64 is a diagram showing a system to which the embodiment of the present invention is applied;

FIG. 65 is a diagram showing the system to which the embodiment of the present invention is applied;

FIG. 66 is a diagram showing the system to which the embodiment of the present invention is applied;

FIG. 73 is a diagram showing the system to which the embodiment of the present invention is applied;

FIG. 74 is a diagram showing the system to which the embodiment of the present invention is applied;

FIG. 75 is a diagram showing the system to which the embodiment of the present invention is applied;

FIG. 76 is a diagram showing the system to which the embodiment of the present invention is applied;

FIG. 77 is a diagram showing the system to which the embodiment of the present invention is applied; and FIG. 78 is a diagram showing the system to which the embodiment of the present invention is applied.

DETAILED DESCRIPTION OF THE INVENTION

A nonvolatile semiconductor memory according to an embodiment of the present invention will be described hereinafter in detail with reference to the drawings.

1. REFERENCE EXAMPLE

First, a reference example which is an assumption of the nonvolatile semiconductor memory according to the embodiment of the present invention, that is, 3Tr. NAND will first be described.

(1) Memory Cell Array

Figure 1:
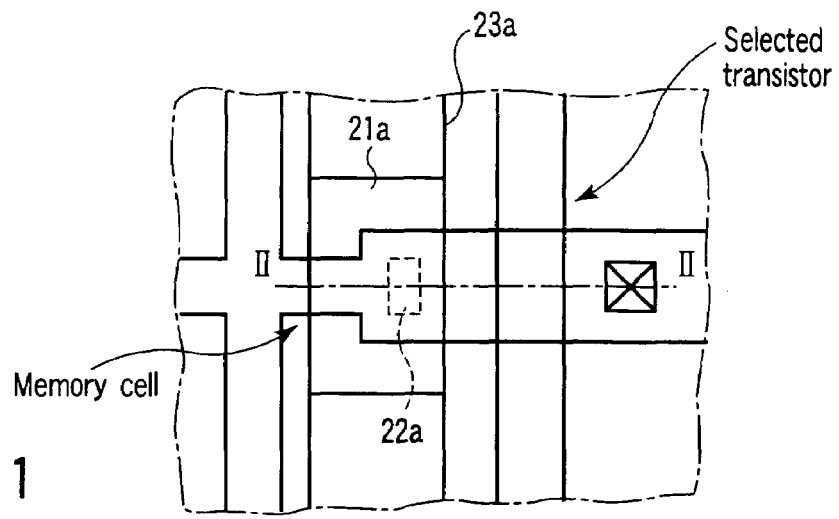
FIG. 1 is a diagram showing a memory cell of a related-art byte type EEPROM.
Figure 2:
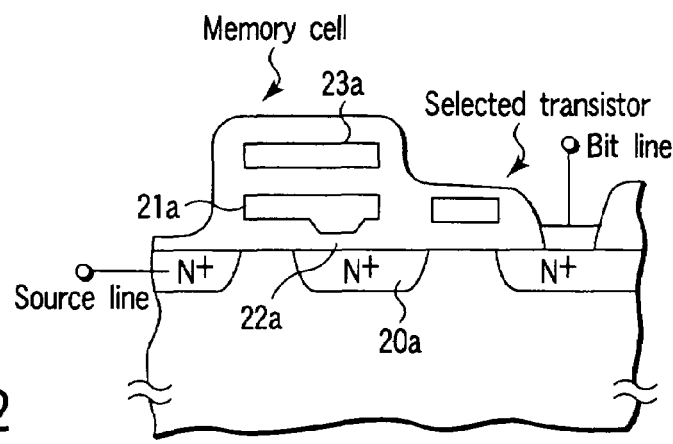
FIG. 2 is a sectional view along line LXXII—LXXII of FIG. 1.
Figure 3:
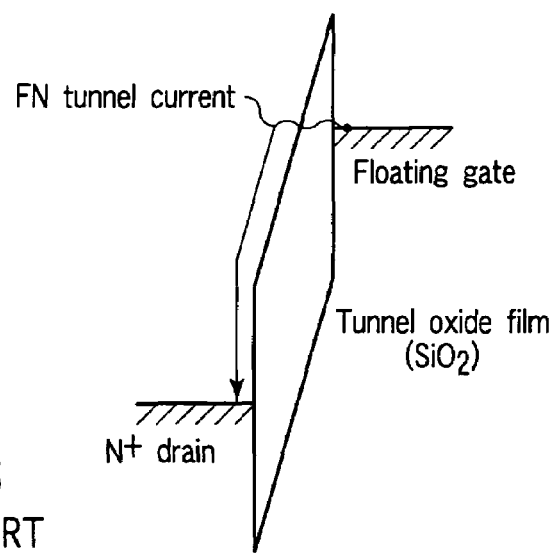
FIG. 3 is an energy band diagram showing a mechanism of an FN tunnel current.
Figure 4:
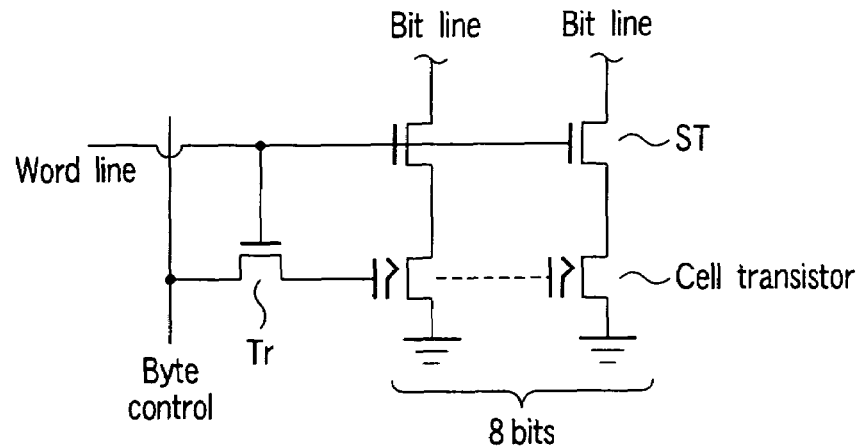
FIG. 4 is a diagram showing the memory cell of a related-art byte type EEPROM.
Figure 5:
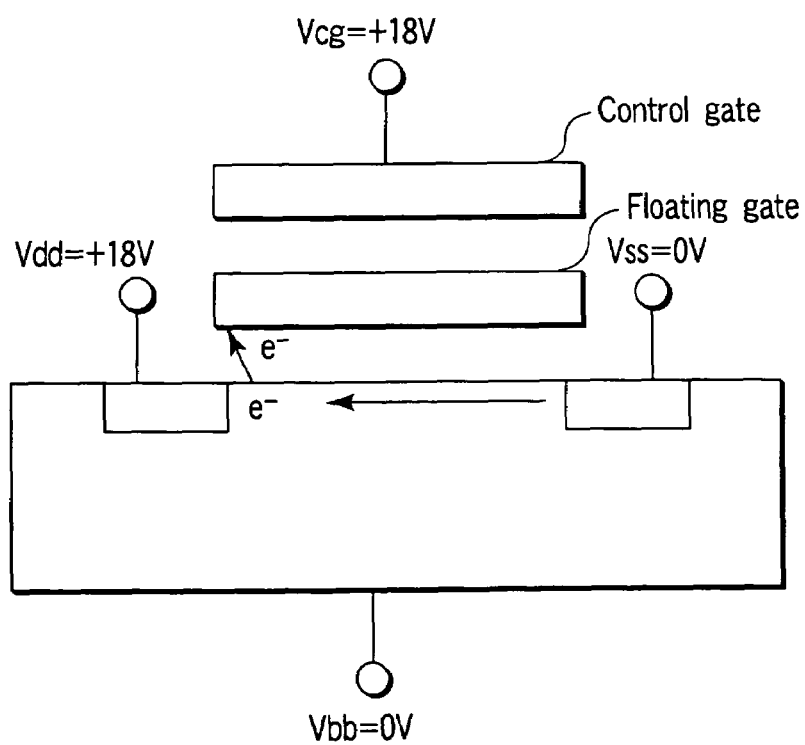
FIG. 5 is a diagram showing a basic structure of the memory cell of the related-art byte type EEPROM.
Figure 6:
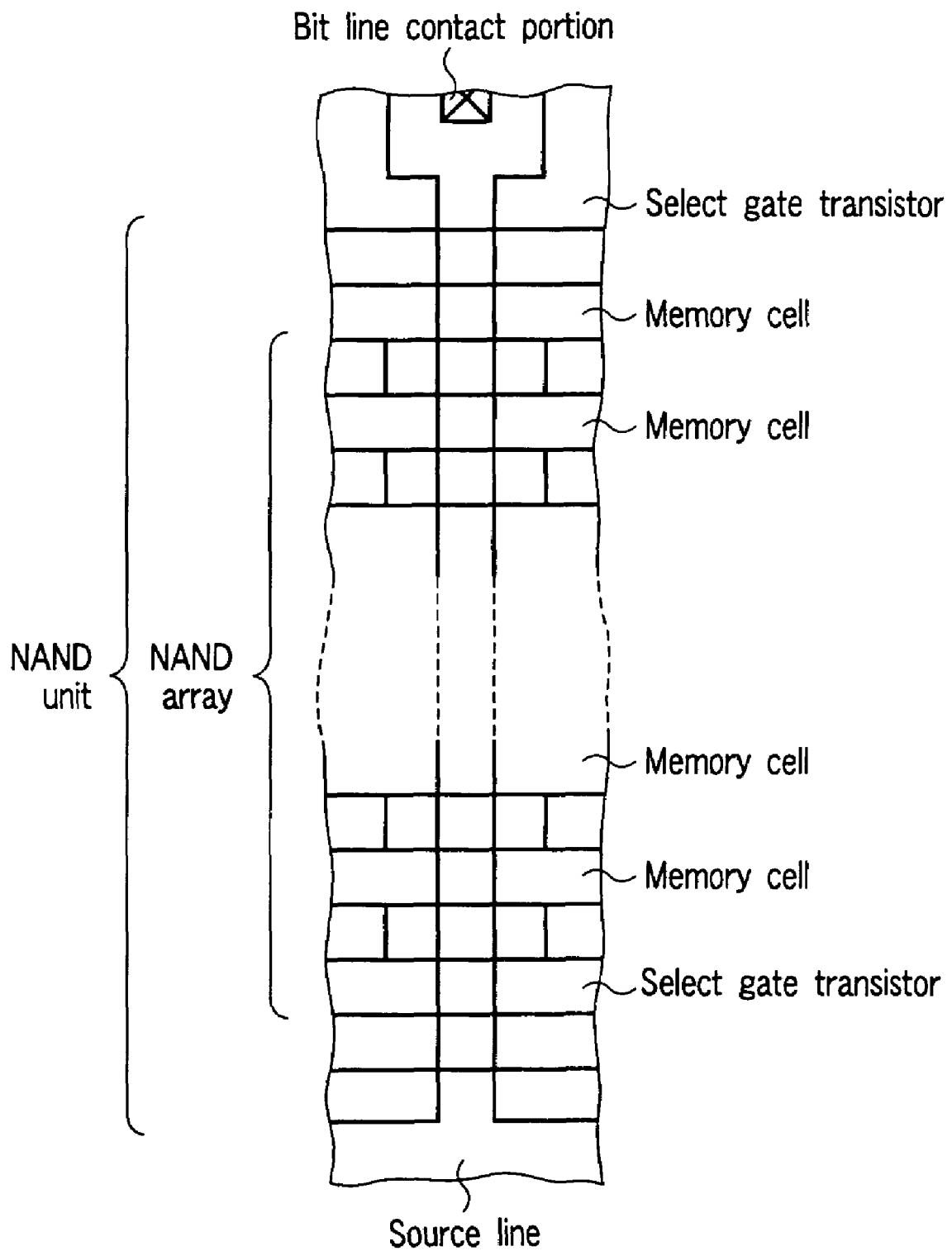
FIG. 6 is a diagram showing an NAND unit of an NAND type flash EEPROM.
Figure 7:
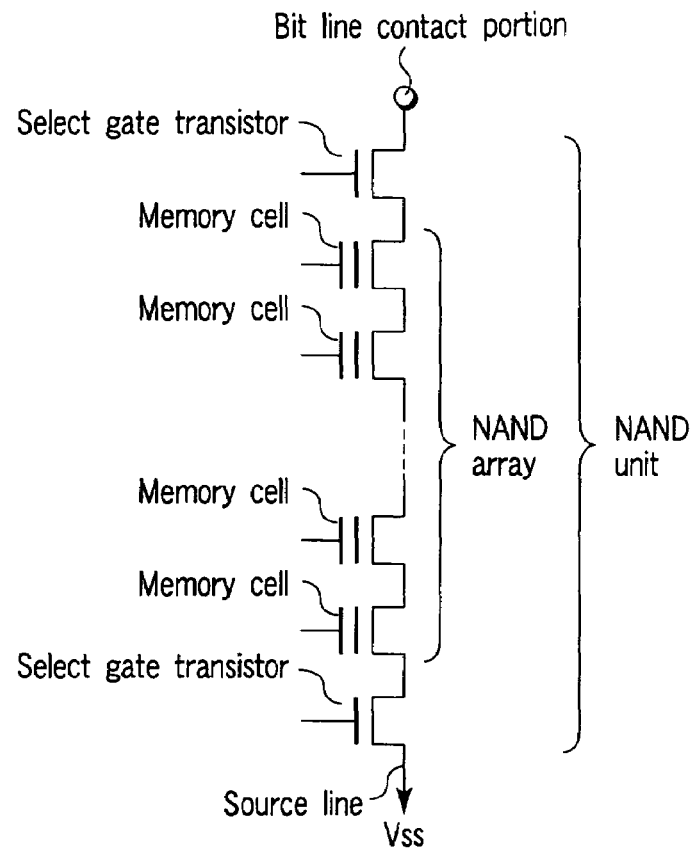
FIG. 7 is a diagram showing an equivalent circuit of FIG. 6.
Figure 8:
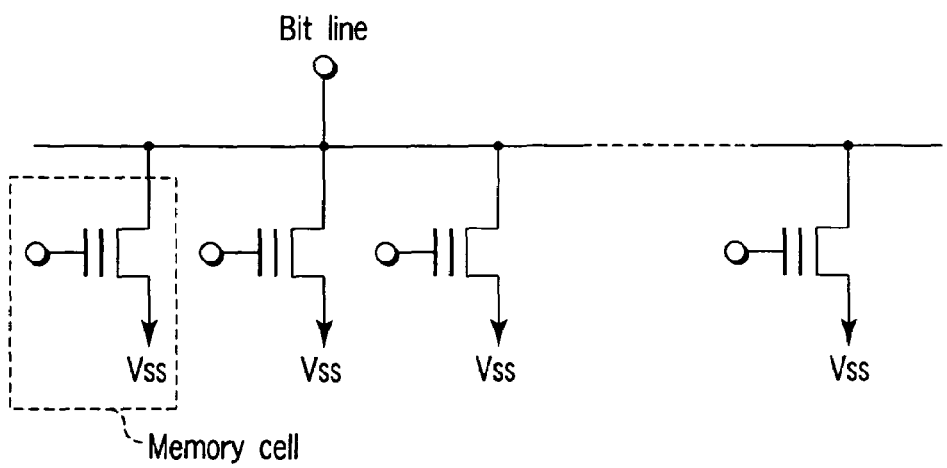
FIG. 8 is a diagram showing the memory cell of an NOR type flash EEPROM.
Figure 9A:
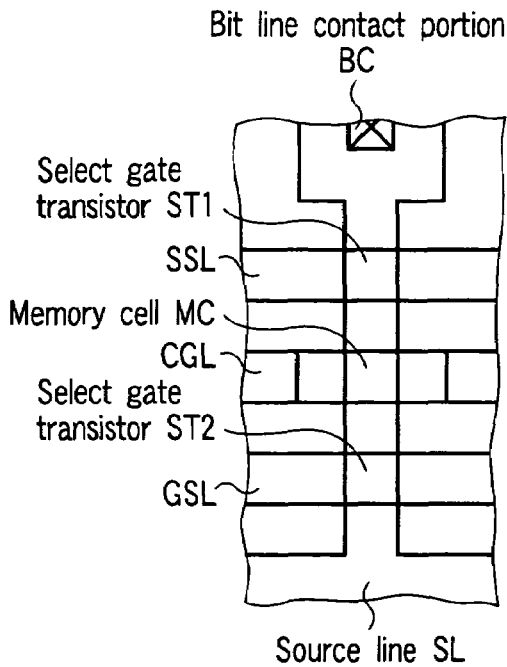
FIGS. 9A and 9B are diagrams showing the memory cell of 3Tr. NAND according to an embodiment of the present invention.
Figure 9B:
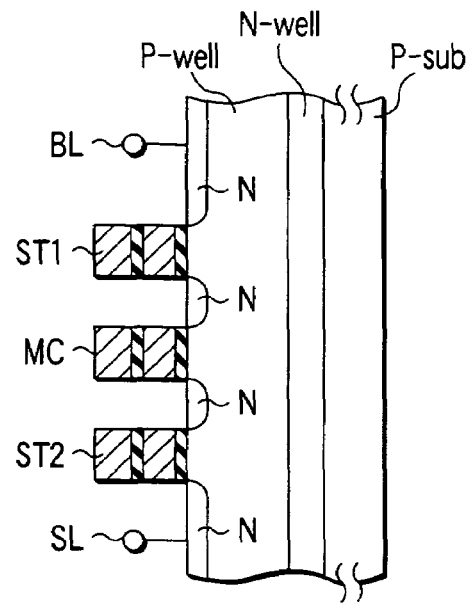
Figure 10:
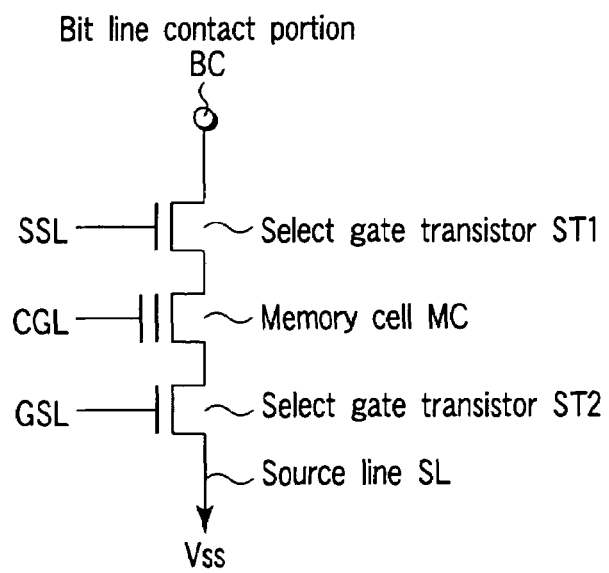
FIG. 10 is a diagram showing the equivalent circuit of FIGS. 9A and 9B.
Figure 11:
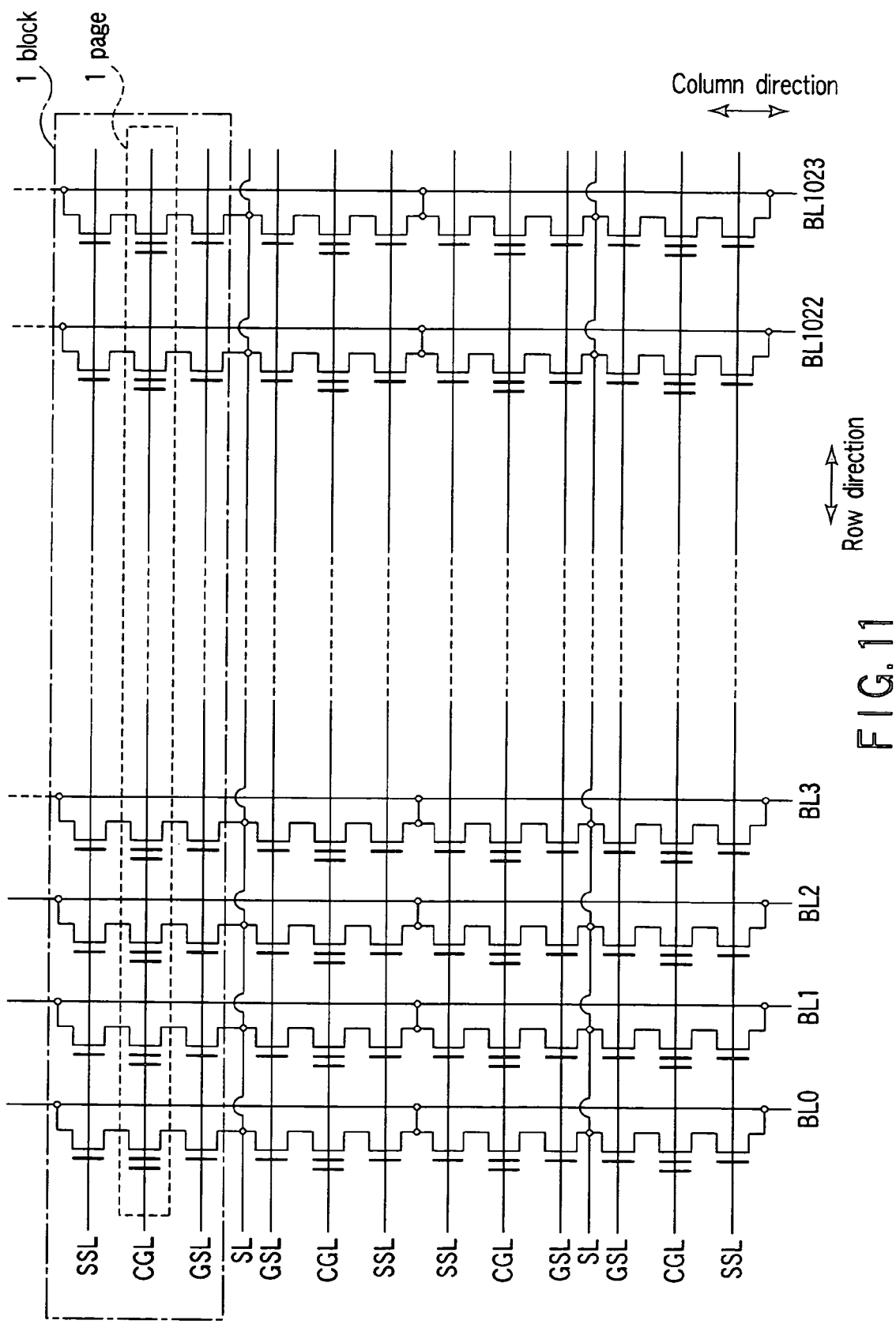
FIG. 11 is a diagram showing a memory cell array of 3Tr. NAND according to the embodiment of the present invention.

FIGS. 9A and 9B show a memory cell of 3Tr. NAND according to a reference example of the present invention. FIG. 10 shows an equivalent circuit of the memory cell of FIGS. 9A and 9B. FIG. 11 shows a whole circuit constitution of a memory cell array.

A memory cell MC includes a control gate and floating gate, and includes the same structure as that of the memory cell of a flash memory. Select gate transistors ST1, ST2 are connected to opposite ends of a memory cell MC. The select gate transistor ST1 is connected to a bit line via a bit line contact portion BC, and the select gate transistor ST2 is connected to a source line SL.

The memory cell and select gate transistors ST1, ST2 constitute one cell unit, and a memory cell array is realized by arranging a plurality of cell units in an array form.

A plurality of cell units arranged in a row direction constitute one block. In one block, one control gate line CGL extending in the row direction is disposed. The memory cells connected to one control gate line CGL are collectively referred to as one page.

An erase operation can be performed every page. Each of write and read operations with respect to the memory cells can simultaneously be performed for one page, when a sense amplifier including a latch function for each column is disposed. Additionally, input/output of the data is serially performed, for example, every bit.

Moreover, according to the constitution, data renewal by a byte unit is possible.

When viewed in a structure aspect, 3Tr. NAND can be considered as the united memory cells in one NAND cell unit in an NAND type flash memory. Additionally, when viewed in a function aspect, the 3Tr. NAND is largely different from the NAND type flash memory.

Advantages of the 3Tr. NAND will be described.

A memory cell portion of the 3Tr. NAND is different from that of the NAND type flash memory only in the number of memory cells which constitute one unit. Therefore, a process of the NAND type flash memory can be used as such in the 3Tr. NAND. Although the erase by the byte unit is possible, a storage capacity can be increased, and production cost can be reduced.

For example, with a design rule of 0.4 [µm], an area of one memory cell (short side length a×long side length b) is 3.84 [µm$^2$], because the short side length a is 1.2 [µm], and the long side length b is 3.2 [µm]. On the other hand, in a related-art byte type EEPROM, assuming that the design rule is 0.4 [µm], the area of one memory cell is 36 [µm$^2$].

That is, for a memory cell array portion, even with simple calculation, in the 3Tr. NAND, a storage capacity of about ten times can be realized as compared with the related-art byte type EEPROM.

Moreover, the 3Tr. NAND can be manufactured by the same process as that of the NAND type flash memory, and can therefore easily be applied also to a logic embedded nonvolatile memory. Furthermore, the memory cell of the 3Tr. NAND has the same structure as that of the NAND type flash memory. Therefore, when viewed concerning one memory cell, a renewal system of the flash memory, that is, a renewal system using an FN tunnel phenomenon can be used as such.

Additionally, when viewed concerning the whole memory cell array, the 3Tr. NAND is different from the NAND type flash memory in that the data can be renewed (byte erase) by the byte unit.

(2) Basic Operation

An erase operation, write operation, and read operation of the 3Tr. NAND will successively be described hereinafter.

At an erase operation time, a ground potential is applied to the control gate line (word line) CGL of a selected block, and the control gate line CGL of a non-selected block is set into a floating state.

Thereafter, for example, an erase pulse of 21 [V], 3 [ms] is applied to a bulk. Here, the bulk is a well formed in a silicon substrate, and the memory cell MC and select gate transistors SL1, SL2 are all formed in this well.

When the erase pulse is applied to the bulk, in the memory cell MC of the selected block, an erase voltage (21 [V]) is added between the bulk and control gate, and an electron in a floating gate moves to a channel (well) by a Fowler-Nordheim (FN) tunnel phenomenon. As a result, a threshold voltage of the memory cell is about −3 [V].

In the 3Tr. NAND, excess erase indicating that an absolute value of the threshold voltage of the memory cell is excessively large does not have to be a problem in the erase operation. Therefore, when the erase operation is performed on a condition that the threshold voltage is about −3 [V] with one erase pulse, an erase time can be shortened (when verify is performed to judge whether the threshold voltage is less than a predetermined value, a time required for the verify is also included).

At the erase operation time, the control gate line CGL of the non-selected block is set to the floating state. Therefore, when the potential of the bulk (well) rises in the memory cell MC of the non-selected block, the potential of the control gate line CGL also rises by capacity coupling of the control gate CGL and bulk, and therefore the data is not erased.

The control gate CGL is constituted of stacked layers of polysilicon, and polysilicon and metal silicide. The control gate CGL is connected to a source of a MOS transistor for driving the word line via a metal wiring. Therefore, the control gate is connected to junction capacity of the source of the transistor for driving the word line, overlap capacity of the source and gate, capacity between the control gate and metal wiring, and capacity between the control gate and bulk (well).

Among these capacities, the capacity between the control gate and bulk (well) is particularly large. That is, a coupling ratio of the control gate to the bulk is about 0.9. Since this is very large, in the memory cell MC of the non-selected block, the FN tunnel current can be prevented from flowing by the capacity coupling of the control gate CGL and bulk.

In erase verify, for example, it is verified whether or not the threshold values of all the memory cells in the selected block are not more than −1 [V]. Since excess erase is not a problem as described above in the 3Tr. NAND, it is not necessary to verify the excess erase. The data is erased on a condition that the threshold value can securely be lowered to about −3 [V], and the verify can also be omitted.

At a "0" write operation time, a method comprises: turning on the select gate transistor ST1 on a bit line side of the selected block; turning off the select gate transistor ST2 on a source line side; setting a bit line BLi to 0 [V] with respect to the memory cell in which write is performed ("0" write); and setting the bit line BLi to a power potential VCC (e.g., 3.3 [V]) with respect to the memory cell in which the write is prohibited ("1" write).

A potential of 0 [V] is applied to the channel of the write-performed memory cell from the bit line BLi via the select gate transistor ST1. Therefore, the channel potential of the write-performed memory cell is a ground potential.

Subsequently, when a write potential is applied to the selected word line (control gate), a large potential difference is generated between the floating gate and channel in the write-performed memory cell. Therefore, the electron moves to the floating gate from the channel by the FN tunnel phenomenon in the write-performed memory cell.

On the other hand, in the memory cell in which the write is prohibited, the channel is charged at the power potential VCC, and set to the floating state. Subsequently, when the write potential is applied to the selected word line (control gate), the channel potential is automatically boosted by series capacity coupling of the control gate, floating gate, channel, and block (well).

Therefore, a large potential difference is not generated between the floating gate and channel of the memory cell which is connected to the selected word line and in which the write is prohibited, and the electron does not move to the floating gate from the channel.

In this manner, the coupling ratio between the control gate and channel is enlarged and the channel is sufficiently charged with respect to the write-prohibited memory cell. Accordingly, it is possible to sufficiently raise the channel potential (write-prohibited potential) at a time when the write potential is applied to the selected word line.

A coupling ratio B between the control gate and channel is calculated by the following equation:

$$B = Cox/(Cox+Cj),$$

where Cox is a total sum of gate capacities between the control gate and channel, and Cj is a total sum of junction capacities of the source and drain of the memory cell.

The channel capacity of the memory cell is a total of the total sum Cox of the gate capacities and the total sum Cj of the junction capacities.

It is to be noted that the overlap capacity of the gate and source of the select gate transistor and the capacity between the bit line and the source/drain are very small as compared with the channel capacity, and are therefore ignored here.

Figure 12:
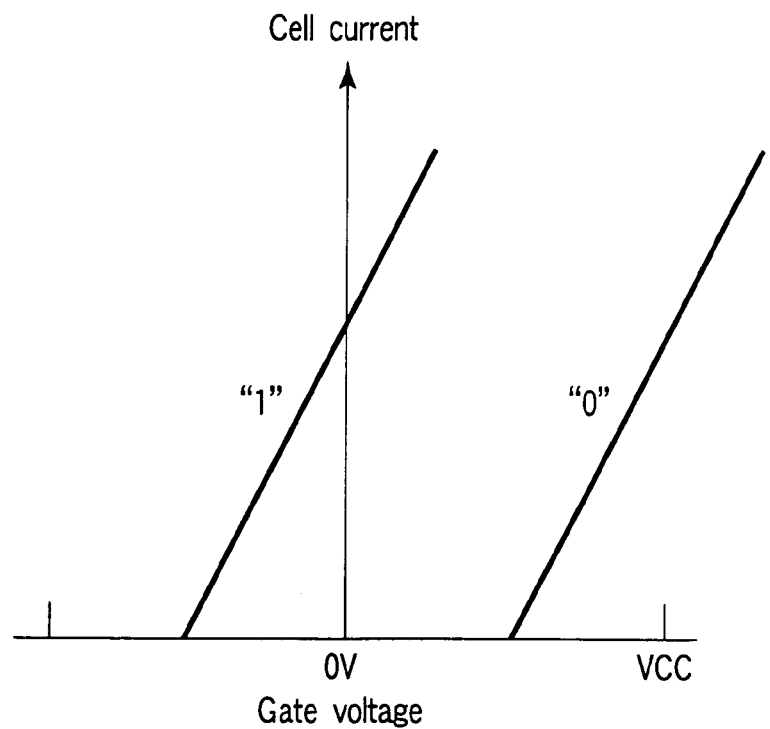
FIG. 12 is a diagram showing a relation between a gate voltage and cell current in accordance with cell data.
Figure 13A:
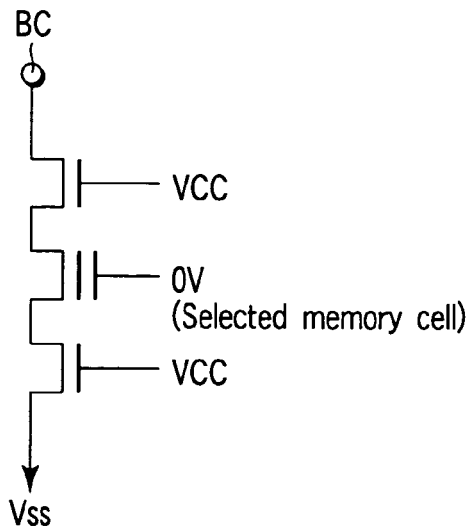
FIGS. 13A and 13B are diagrams showing a potential supplied to a memory cell at a read time.
Figure 13B:
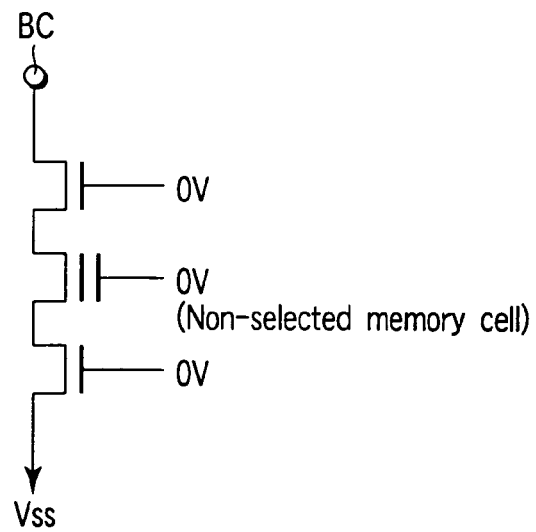

At a read operation time, a method comprises: charging the bit line at a precharge potential; thereafter, as shown in FIGS. 12, 13A, 13B, applying 0 [V] to the control gate (selected word line) of the selected memory cell MC; applying the power potential VCC to the gates of the select gate transistors on the opposite sides of the selected memory cell; and applying 0 [V] to the gates of the select gate transistors on the opposite sides of the non-selected memory cell. At this time, the select gate transistors on the opposite sides of the selected memory cell are brought in an on state, and the select gate transistors on the opposite sides of the non-selected memory cell are brought in an off state.

For the selected memory cells, in the memory cell in which data "1" is written, that is, in the memory cell in an erased state, the threshold voltage has a negative depression mode. Therefore, the cell is in the on state, and the potential of the bit line drops. Conversely, for the memory cell in which data "0" is written, since the threshold voltage has a positive enhancement mode, the on state is obtained, and the potential of the bit line is maintained at a precharge potential.

In this manner, the data "0" or "1" is judged by judging whether or not the cell current flows to the source line from the bit line. A change of the potential of the bit line is amplified (detected) by the sense amplifier.

(3) Effect of 3Tr. NAND

According to the 3Tr. NAND, since the memory cell MC is held between the select gate transistors, the following effect is produced.

Figure 14:
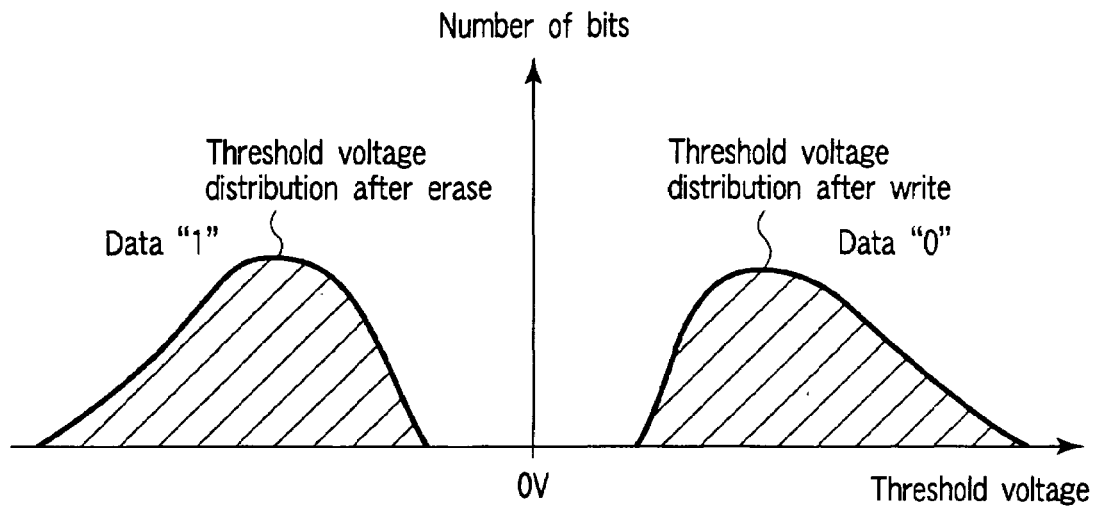
FIG. 14 is a diagram showing one example of a threshold value distribution in accordance with the cell data.

Firstly, when a read potential is set to 0 [V], as shown in FIG. 14, a threshold value distribution after erase or write may be negative (data "1") or positive (data "0"). That is, when a verify function of distinguishing "1" from "0" is provided, a verify function of detecting excess erase or excess write may not be disposed. Therefore, complicated verify as performed in the related-art flash memory is not necessary. In the present invention, even when the absolute value of the negative threshold voltage increases by the excess erase, or even when the absolute value of the positive threshold voltage increases by the excess write, a normal read operation is possible. Therefore, an electric field added to a gate oxide film (tunnel oxide film) is set to be high, and the erase time and write time can be shortened.

Secondly, as in the NAND type flash memory, the erase and the write are both performed by using the FN tunnel phenomenon to exchange the charge between the floating gate and channel. Therefore, the power consumption at a data renewal time can be reduced to be very small, and the number of memory cells to be simultaneously renewed with one renewal operation can be increased.

Thirdly, the byte type EEPROM of the present invention is different from the NAND type flash memory in that only one memory cell is disposed between the select gate transistors. That is, the selected and non-selected memory cells do not exist between the select gate transistors in a embedded manner. Therefore, at the read time, it is not necessary to allow the non-selected memory cell to function as a path transistor while the cell is constantly brought into the on state. Therefore, a measure for preventing the excess write is unnecessary.

Moreover, it is not necessary to constantly bring the non-selected memory cell into the on state at the read time, and therefore when the control gate of the selected memory cell is set to 0 [V] to perform the read, the control gate of the non-selected memory cell is also set to 0 [V], and read retention does not have to be considered.

That is, in the related-art NAND type flash memory, since the plurality of memory cells are connected in series between the select gate transistors, at the read time, the control gate of the selected memory cell is set to 0 [V], and the control gate of the non-selected memory cell is set to Vread (=4.5V). This has been a cause for reduction of the read retention.

In the 3Tr. NAND, since only one memory cell is connected between the select gate transistors, the control gates of all the memory cells are set to 0 [V] at the read time, and the select gate transistors in the opposite ends of the memory cell are only turned on/off. Accordingly, the selection/non-selection of the memory cell can be determined.

Moreover, since the select gate transistor is connected between the bit line and memory cell, the non-selected memory cell does not have to be constantly brought into an off state at the read time. Therefore, the measure for preventing the excess erase is also unnecessary.

Furthermore, at a "0" write time, it is not necessary to supply an intermediate potential (potential of about ½ of the write potential) to the non-selected word line (control gate). This is because the select gate transistor exists between the memory cell and the bit line, and only one memory cell is disposed between the select gate transistors.

Moreover, even when the intermediate potential is not supplied to the non-selected word line, erroneous write can be prevented, and therefore reliability of the write becomes high. The renewal by a page unit (or a bit unit) is possible. Even at the read time, there is not any path transistor, and the cell current can be increased. Therefore, high-speed read is possible, and data retention characteristics at the read time are enhanced.

Table 3 shows the potentials of select gate lines SSL, GSL, control gate line (word line) CGL, bit line BLi, cell source line SL, and cell P well in the respective erase, write, and read operations.

TABLE 3

| | | Erase | Write | Read |
|---|---|---|---|---|
| Selected block | Select gate line SSL on bit line side | Vera×β | VCC | VCC |
| | Control gate line CGL | 0 V | Vprog | 0 V |
| | Select gate line GSL on source line side | Vera×β | 0 V | VCC |
| Non-selected block | Select gate line SSL on bit line side | Vera×β | 0 V | 0 V |
| | Control gate line CGL | Vera×β | 0 V | 0 V |
| | Select gate line GSL on source line side | Vera×β | 0 V | 0 V |
| Bit line | "1" data | Vera-Vb | VCC | VBL→0 V |
| | "0" data | Vera-Vb | 0 V | VBL |
| Cell source line | | Vera-Vb | VCC | 0 V |
| Cell P well | | Vera | 0 V | 0 V |

In the erase operation, the control gate line CGL of the selected block is set to 0 [V], and the control gate line CGL and all select gate lines SSL, GSL of the non-selected block are set to the floating state.

In this state, when an erase potential Vera, for example, of 21 [V] is applied to a cell P well, the potentials of all the select gate lines SSL, GSL in the floating state and the potential of the control gate line CGL of the non-selected block indicate Vera×β (where β is the coupling ratio) by the capacity coupling with the cell P well.

Here, assuming that β is 0.8, the potentials of all the select gate lines SSL, GSL in the floating state and the potential of the control gate line CGL of the non-selected block rise to 16.8 [V].

At the erase operation time, a pn junction including an N⁺ diffusion layer and cell P well connected to the bit line BLi and cell source line SL is biased in a forward direction. Therefore, the bit line BLi and cell source line SL are charged at Vera−Vb. It is to be noted that Vb denotes a built-in potential of the pn junction.

In the write operation, the bit line BLi connected to the selected memory cell in which the "1" data is written, that is, the bit line BLi connected to the selected memory cell maintained in the erased state is set to the power potential VCC (e.g., 3.3 [V]), and the bit line BLi connected to the selected memory cell in which the "0" data is written is set to 0 [V].

The select gate line SSL on a bit line side of the selected block is set to the power potential VCC, the select gate line GSL on a cell source line side is set to 0 [V], and the control gate line CGL is set to a write potential Vprog (e.g., 18 [V]).

The select gate lines SSL, GSL, control gate line CGL, and cell P well of the non-selected block are set to 0 [V].

The cell source line is set to 0 [V]. Additionally, the channel potential of the memory cell in which the "1" data is written in the selected block is boosted by the capacity coupling with the control gate line CGL. When a leak current of the cell source line raises a problem by punch through, the potential of the cell source line may be set to the power potential VCC.

In the read operation, the select gate lines SSL, GSL of the selected block are set to the power potential VCC, and the control gate line CGL is set to 0 [V]. In a system for precharging the bit line before reading the data, the bit line BLi is set to a precharge potential VBL (e.g., 1.2 [V]).

For the selected memory cells, the memory cell in which the "1" data is stored is brought into the on state, a cell current flows, and the bit line BLi is therefore discharged at 0 [V]. On the other hand, for the selected memory cells, the memory cell in which the "0" data is stored is brought into the off state, the cell current does not flow, and the bit line BLi holds the precharge potential VBL.

Figure 15:
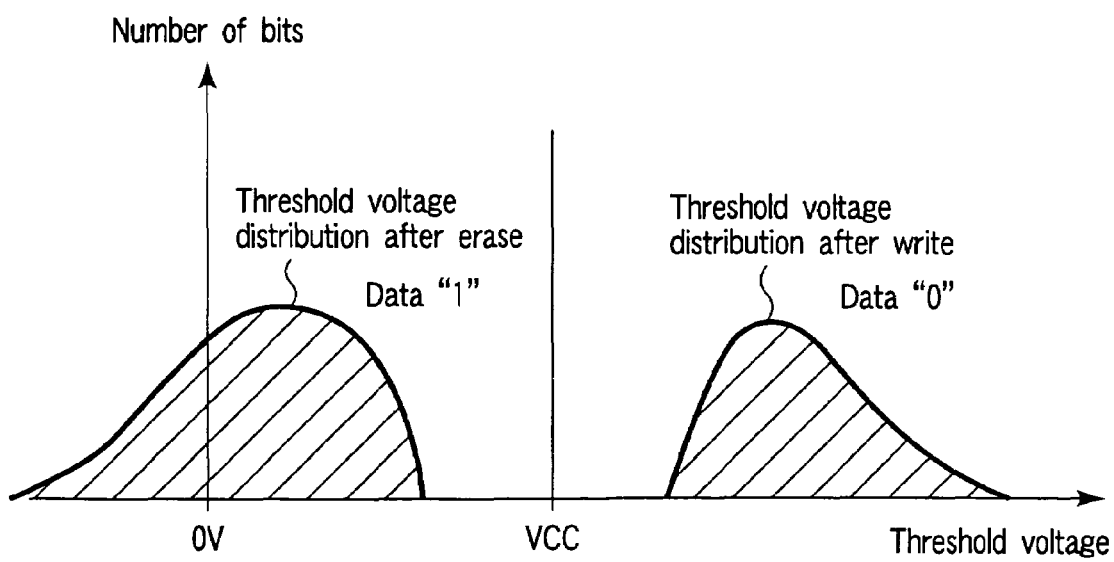
FIG. 15 is a diagram showing another example of the threshold value distribution in accordance with the cell data.

In the read operation, when the power potential VCC (e.g., 3.3V) is applied to the control gate line CGL of the selected block to perform the read operation, the threshold value distribution of the memory cell may be set as shown in FIG. 15.

Table 4 shows the potentials of the select gate lines SSL, GSL, control gate line (word line) CGL, bit line BLi, cell source line SL, and cell P well in the respective erase, write, and read operations with the threshold value distribution of FIG. 15.

TABLE 4

| | | Erase | Write | Read |
|---|---|---|---|---|
| Selected block | Select gate line SSL on bit line side | Verax$\beta$ | VCC | VCC |
| | Control gate line CGL | 0 V | Vprog | VCC |
| | Select gate line GSL on source line side | Verax$\beta$ | 0 V | VCC |
| Non-selected block | Select gate line SSL on bit line side | Verax$\beta$ | 0 V | 0 V |
| | Control gate line CGL | Verax$\beta$ | 0 V | 0 V |
| | Select gate line GSL on source line side | Verax$\beta$ | 0 V | 0 V |
| Bit line | "1" data | Vera-Vb | VCC | VBL→ 0 V |
| | "0" data | Vera-Vb | 0 V | VBL |
| Cell source line | | Vera-Vb | VCC | 0 V |
| Cell P well | | Vera | 0 V | 0 V |

In the 3Tr. NAND, as described above, since the select gate transistors are disposed in the opposite ends of the memory cell, a base of the threshold value distribution of the memory cell after the erase ("1" data) may extend to negative from positive side.

(4) Byte Renewal Operation 1

Figure 16:
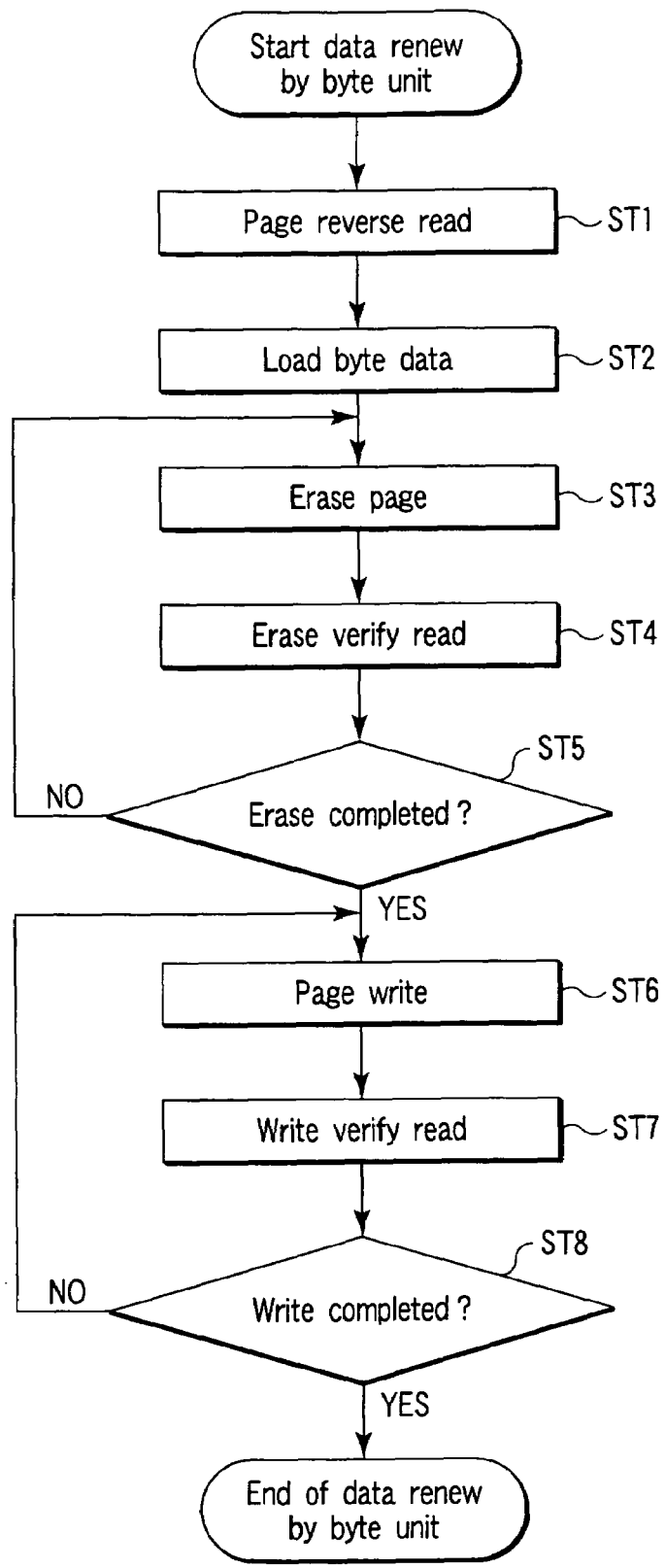
FIG. 16 is a flowchart showing a byte renewal operation according to the embodiment of the present invention.

FIG. 16 is a schematic flowchart of the renewal operation by the byte unit in the 3Tr. NAND.

In a data renewal mode by the byte unit, first the data for one page of the memory cell connected to the selected control gate line (word line) is read into the sense amplifier circuit (page reverse read). Subsequently, the data for one page is latched in the sense amplifier circuit (step ST1).

Next, the byte data corresponding to a column designated by an address is loaded. The loaded byte data is written over the byte data subjected to the data renewal in the data for one page latched in the sense amplifier circuit (step ST2).

Next, the data for one page of the memory cell connected to the selected control gate line is simultaneously erased (page erase) (step ST3). After the erase, with respect to the respective memory cells connected to the selected control gate line, erase verify is performed to verify whether the erase is completely performed or the erase is excessively performed (steps ST4, 5).

Subsequently, the page erase and erase verify are repeatedly performed until the threshold values of all the memory cells for one page fall within a predetermined range. When the threshold values of all the memory cells for one page fall within the predetermined range (erase completed), the operation shifts to the next operation (steps ST3 to 5).

It is to be noted that when only one sense amplifier circuit having the latch function exists with respect to one bit line (only for one page), there is possibility of destruction of the data of the sense amplifier circuit according to a result of erase verify. Therefore, without performing the erase verify, the erase is ended once.

Thereafter, the data for one page latched in the sense amplifier circuit is simultaneously written in the memory cell connected to the selected control gate line (step ST6). After the write, the write verify is performed to verify whether the write is completely performed or whether the write is excessively performed with respect to the respective memory cells connected to the selected control gate line (steps ST7, 8).

Subsequently, the page write and write verify are repeatedly performed until the threshold values of all the memory cells for one page fall within the predetermined range. When the threshold values of all the memory cells for one page are within the predetermined range (write completion), the data renewal operation by the byte unit is ended.

It is to be noted that when a high write potential is used to perform one write with one write pulse, the write verify can also be omitted.

Figure 17:
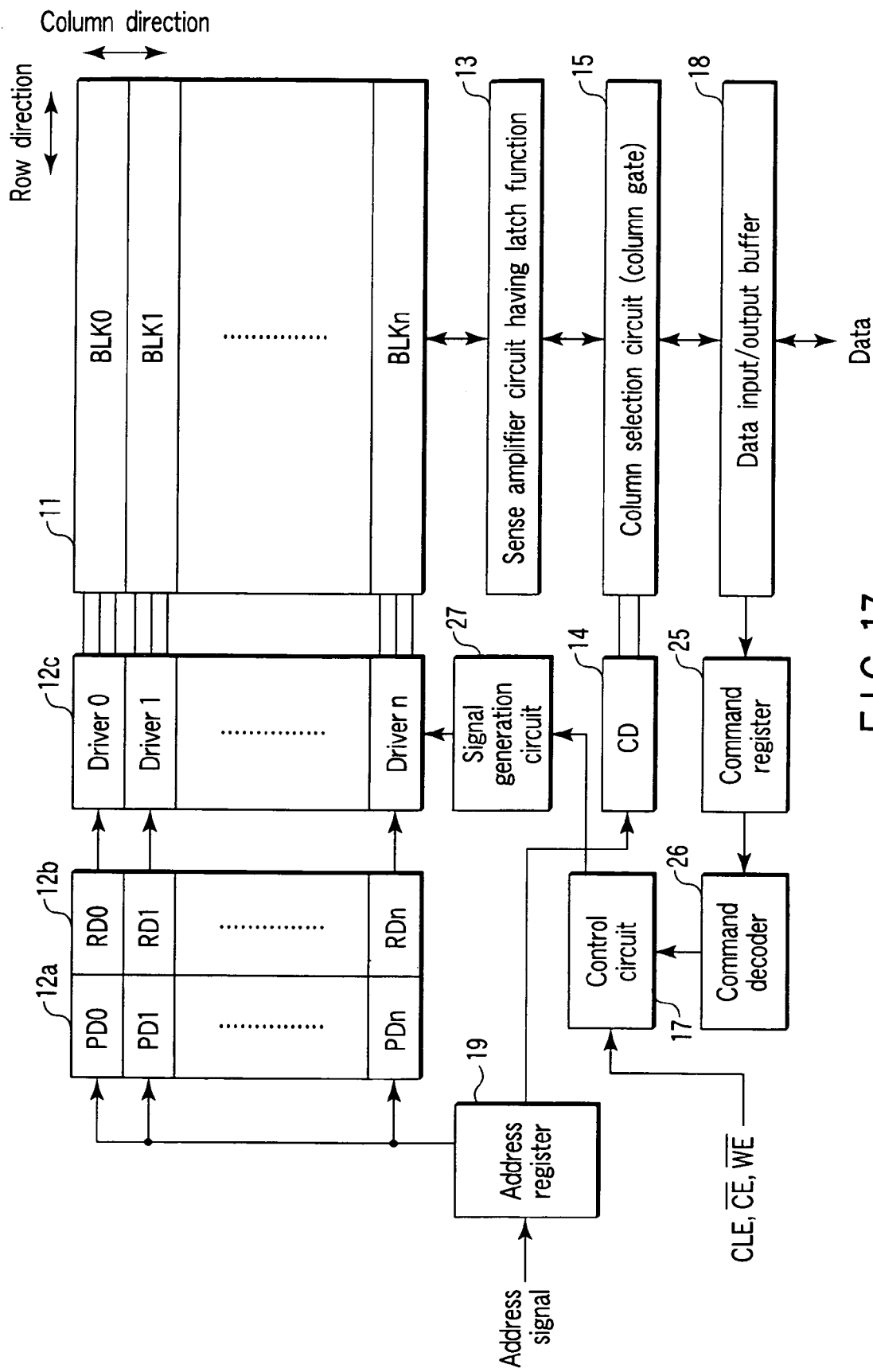
FIG. 17 is a diagram showing 3Tr. NAND according to the embodiment of the present invention.
Figure 18:
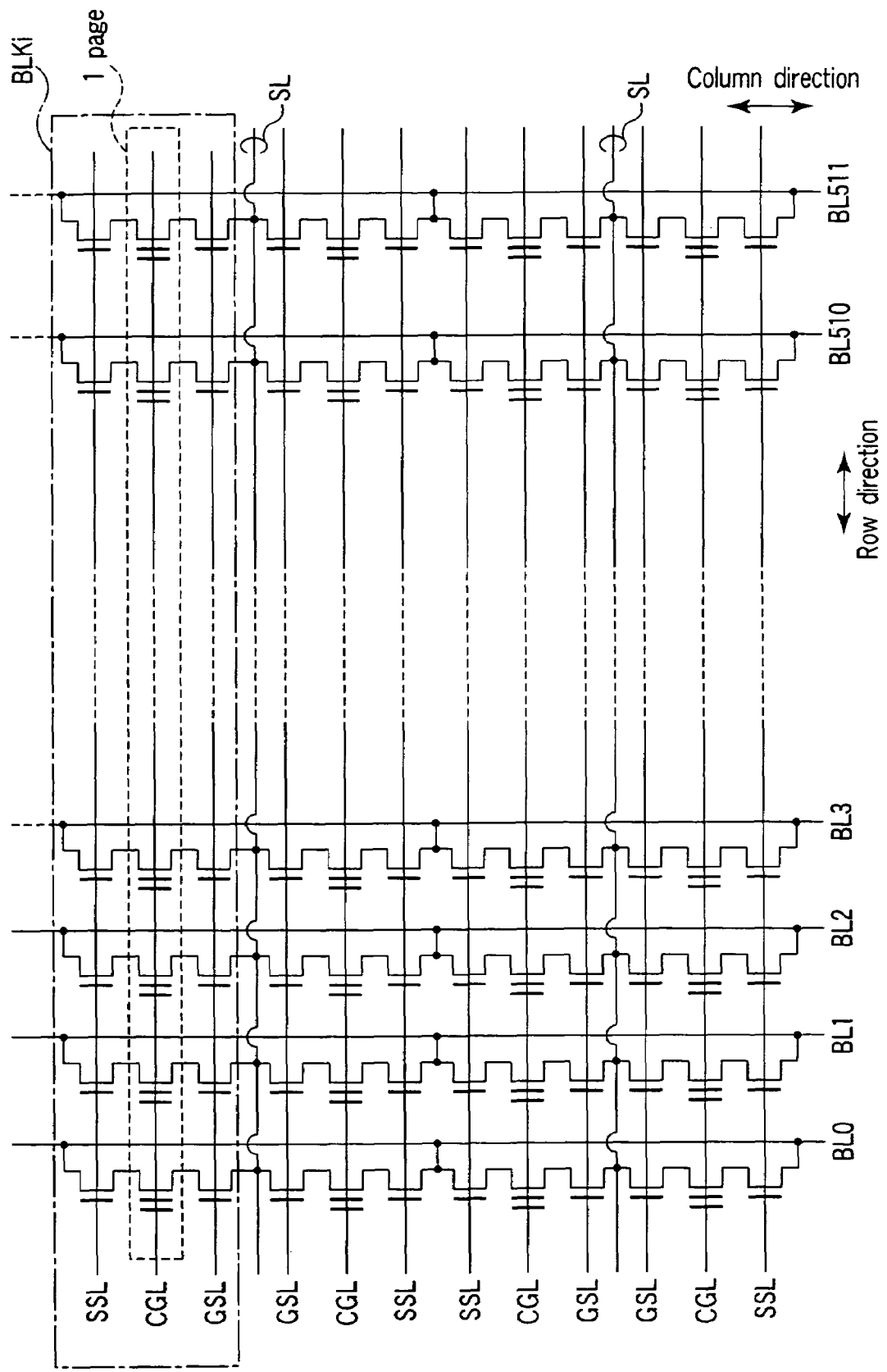
FIG. 18 is a diagram showing the memory cell array of 3Tr. NAND of FIG. 17.

FIG. 17 shows one example of circuit blocks of the 3Tr. NAND in which the byte renewal operation of FIG. 16 can be performed. FIG. 18 shows a part of a memory cell array 11 of FIG. 17.

In the 3Tr. NAND, the cell unit is constituted of three elements including one memory cell and two select gate transistors between which the memory cell is held. Therefore, in one block BLKi (i=0, 1, . . . n), the memory cells connected to one control gate line CGL, that is, the memory cells for one page are disposed.

A control gate/select gate driver 12c is disposed for one block BLKi (i=0, 1, . . . n), that is, one control gate line CGL (one page). Each driver 12c includes a booster circuit. A predecoder 12a and a row decoder 12b are also disposed for one block BLKi, that is, one control gate line CGL (one page).

A row address signal is inputted into the predecoder 12a via an address register 19. Moreover, one row (or one block) is selected by the predecoder 12a and row decoder 12b. With the selected block BLKi, for example, the driver 12c supplies a predetermined potential to the control gate line CGL and select gate lines SSL, GSL in the selected block BLKi in accordance with an operation mode.

A sense amplifier circuit 13 having a latch function latches read data or write data. The read data (output data) is outputted to the outside of a memory chip via a column selection circuit 15 and input/output buffer 18. The write data (input data) is latched by the sense amplifier circuit 13 having the latch function via the input/output buffer 18 and column selection circuit 15.

A command signal is inputted into a command decoder 26 via the data input/output buffer 18 and a command register 25. In a control circuit 17, signals are inputted such as an output signal of a command decoder 26, a command latch enable signal CLE, a chip enable signal /CE, and a write enable signal /WE.

Under control of the control circuit 17, a signal generation circuit (booster circuit) 27 generates the potentials supplied to the control gate line CGL and select gate lines SSL, GSL, and supplies this potential to the control gate/select gate driver 12c.

Figure 19:
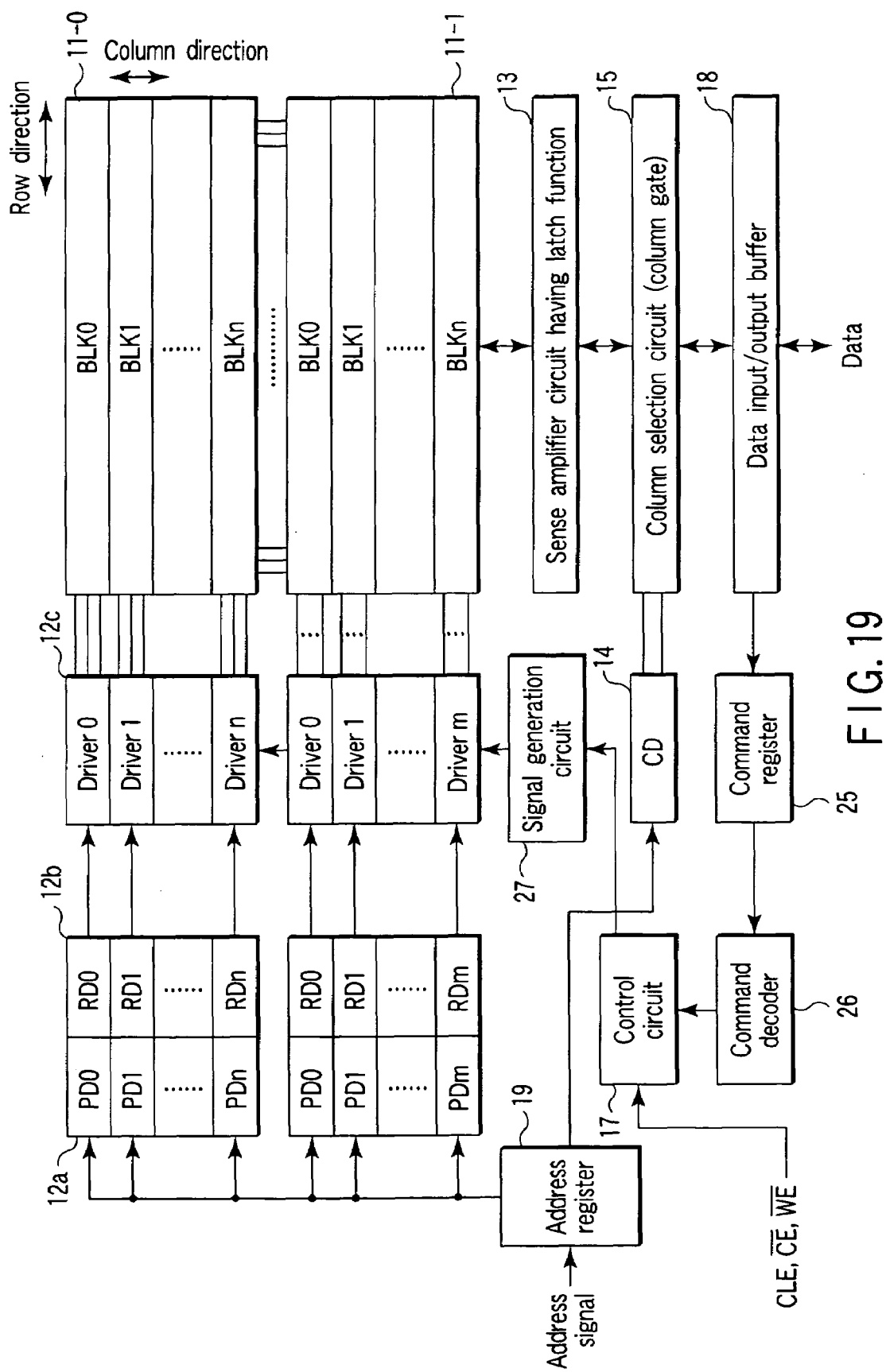
FIG. 19 is a diagram showing the 3Tr. NAND according to the embodiment of the present invention.
Figure 20:
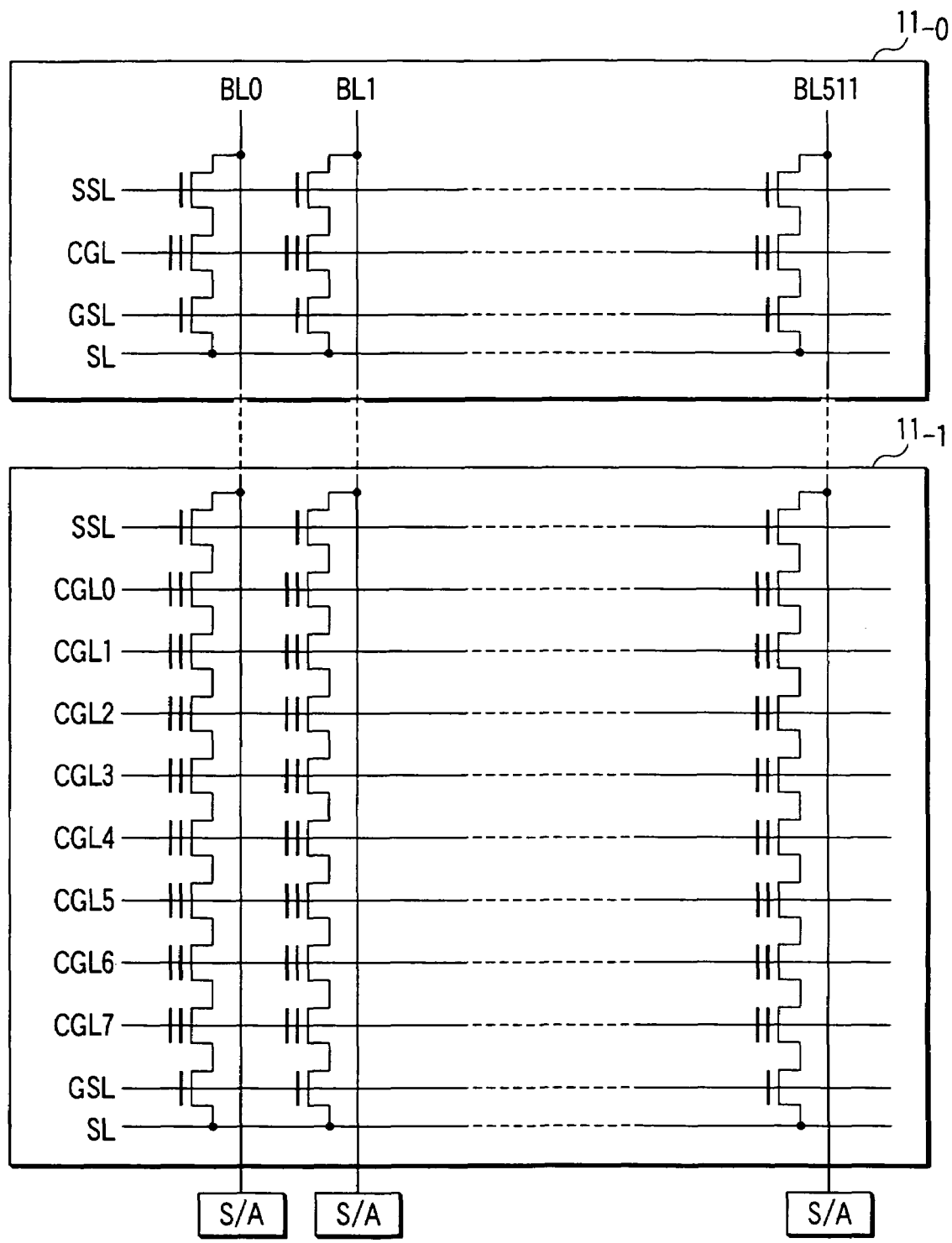
FIG. 20 is a diagram showing the memory cell array of the 3Tr. NAND of FIG. 19.

FIG. 19 shows another example of the circuit blocks of the 3Tr. NAND in which the byte renewal operation of FIG. 16 can be performed. FIG. 20 shows a part of the memory cell array 11 of FIG. 19.

The memory cell array is constituted of a 3Tr. cell portion 11-0 and NAND cell portion 11-1.

The 3Tr. cell portion 11-0 includes the cell unit constituted of three elements including one memory cell and two select gate transistors between which the memory cell is held, and is divided into n blocks BLK0, BLK1, . . . BLKn. The NAND cell portion 11-1 includes an NAND cell unit including a plurality of (4, 8, 16) memory cells connected in series and two select gate transistors between which the memory cells are held, and is divided into m blocks BLK0, BLK1, . . . BLKm.

In each block BLKi (i=0, 1, . . . n) of the 3Tr. cell portion 11-0, the memory cells connected to one control gate line CGL, that is, the memory cells for one page are disposed. On the other hand, in each block BLKi (i=0, 1, . . . m) of the NAND cell portion 11-1, the memory cells connected to a plurality of control gate lines CGL, that is, the memory cells for a plurality of pages are disposed.

In the 3Tr. cell portion 11-0, the control gate/select gate driver 12c is disposed for one block BLKi, that is, one control gate line CGL (one page). Each driver 12c includes the booster circuit. The predecoder 12a and row decoder 12b are also disposed for one block BLKi, that is, one control gate line CGL (one page).

In the NAND cell portion 11-1, the control gate/select gate driver 12c is disposed for one block BLKi including a plurality of control gate lines CGL0, . . . CGL7 (a plurality of pages). Each driver 12c includes the booster circuit. The predecoder 12a and row decoder 12b are also disposed for one block BLKi including the plurality of control gate lines CGL0, . . . CGL7 (the plurality of pages).

The row address signal is inputted into the predecoder 12a via the address register 19. Moreover, one row (or one block) of the 3Tr. cell portion 11-0 or NAND cell portion 11-1 is selected by the predecoder 12a and row decoder 12b.

The sense amplifier circuit 13 having the latch function latches the read data or write data. The read data (output data) is outputted to the outside of the memory chip via the column selection circuit 15 and input/output buffer 18. The write data (input data) is latched by the sense amplifier circuit 13 having the latch function via the input/output buffer 18 and column selection circuit 15.

The command signal is inputted into the command decoder 26 via the data input/output buffer 18 and command register 25. In the control circuit 17, the signals are inputted such as the output signal of the command decoder 26, the command latch enable signal CLE, the chip enable signal /CE, and the write enable signal /WE.

Under the control of the control circuit 17, the signal generation circuit (booster circuit) 27 generates the potentials supplied to the control gate line CGL and select gate lines SSL, GSL, and supplies this potential to the control gate/select gate driver 12c.

Figure 21:
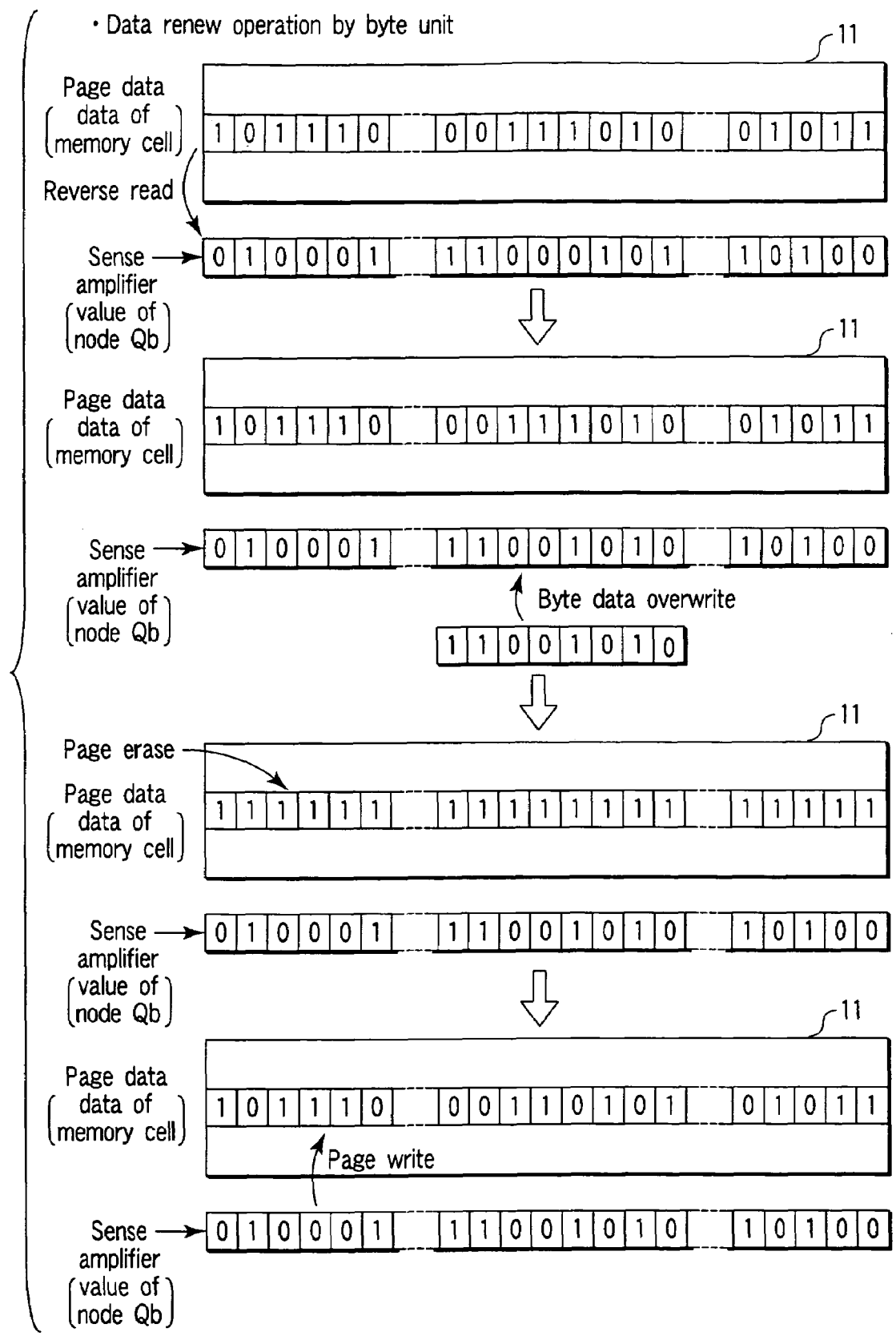
FIG. 21 is a diagram showing the byte renewal operation according to the embodiment of the present invention.

FIG. 21 shows the data renewal operation by the byte unit performed by the 3Tr. NAND of FIGS. 17 to 20.

The byte renewal operation of the present example comprises the following four main steps of:

① performing reverse read of the data with respect to the memory cells for one page in the selected block to hold the data in the sense amplifier circuit having the latch function;

② overwriting byte data with respect to the data held by the sense amplifier circuit having the latch function;

③ erasing the data of the memory cells for one page in the selected block; and

④ writing the data held by the sense amplifier circuit having the latch function into the memory cells for one page in the selected block.

By the above-described steps, there can be provided a nonvolatile semiconductor memory which can be manufactured by the same process as that of the flash memory and in which the data can be renewed by the byte unit even with the application of the same renewal method (in the flash memory, in general, the data of the memory cell is collectively erased by the block unit without the above step ①, and therefore the data cannot be renewed by the byte unit. Additionally, after the erase, it is possible to write the data by the byte unit).

Here, the number of times of the data renewal of the memory cell of the 3Tr. NAND will be considered to which the data renewal method by the byte unit shown in FIG. 21 is applied.

When the data renewal for one byte is performed by the renewal method of FIG. 21, one reverse read operation, erase operation, and write operation are performed with respect to the data for one page in the selected block. That is, one reverse read operation, erase operation, and write operation are performed even with respect to the memory cell in which the data is not renewed in the selected block.

Therefore, for example, to renew all the data in one page, the number of times of page read, erase, and write in a case in which the data for one page is renewed every byte by the renewal method of FIG. 21 is substantially larger than that in a case in which the data for one page is renewed by several times the bytes included in one page.

For example, when one page is constituted of 64 bytes, and when the data for one page is renewed at once, one page read, erase, write operation suffices. However, when the data for one page is renewed every byte, 64 page read, erase, write operations are required.

In this manner, in the data renewal method by the byte unit shown in FIG. 21, to renew the data for one byte, one reverse read operation, erase operation, and write operation are performed with respect to the data for one page in the selected block. Therefore, the number of times of page read, erase, and write in a case in which the data for one page is renewed by the technique of the present embodiment is substantially larger than that in a case in which the data for one page is renewed at once by several times the bytes included in one page at maximum.

(5) Byte Renewal Operation 2

In Byte Renewal operation 1, when viewed from the outside of the chip, the data is renewed by the byte unit. However, when viewed from the inside of the chip, the cell data is erased by page erase once with respect to even the data not to be renewed. Therefore, in this case, when the operation defector or erroneous operation is generated in the sense amplifier for temporarily storing the cell data, there is a possibility that the data not to be renewed changes to wrong data.

In Byte Renewal operation 2, in the 3Tr. NAND, an example of a method will be proposed comprising: renewing the data by the byte unit with respect to the data which is not the renewal object without performing the erase or rewrite.

Figure 22:
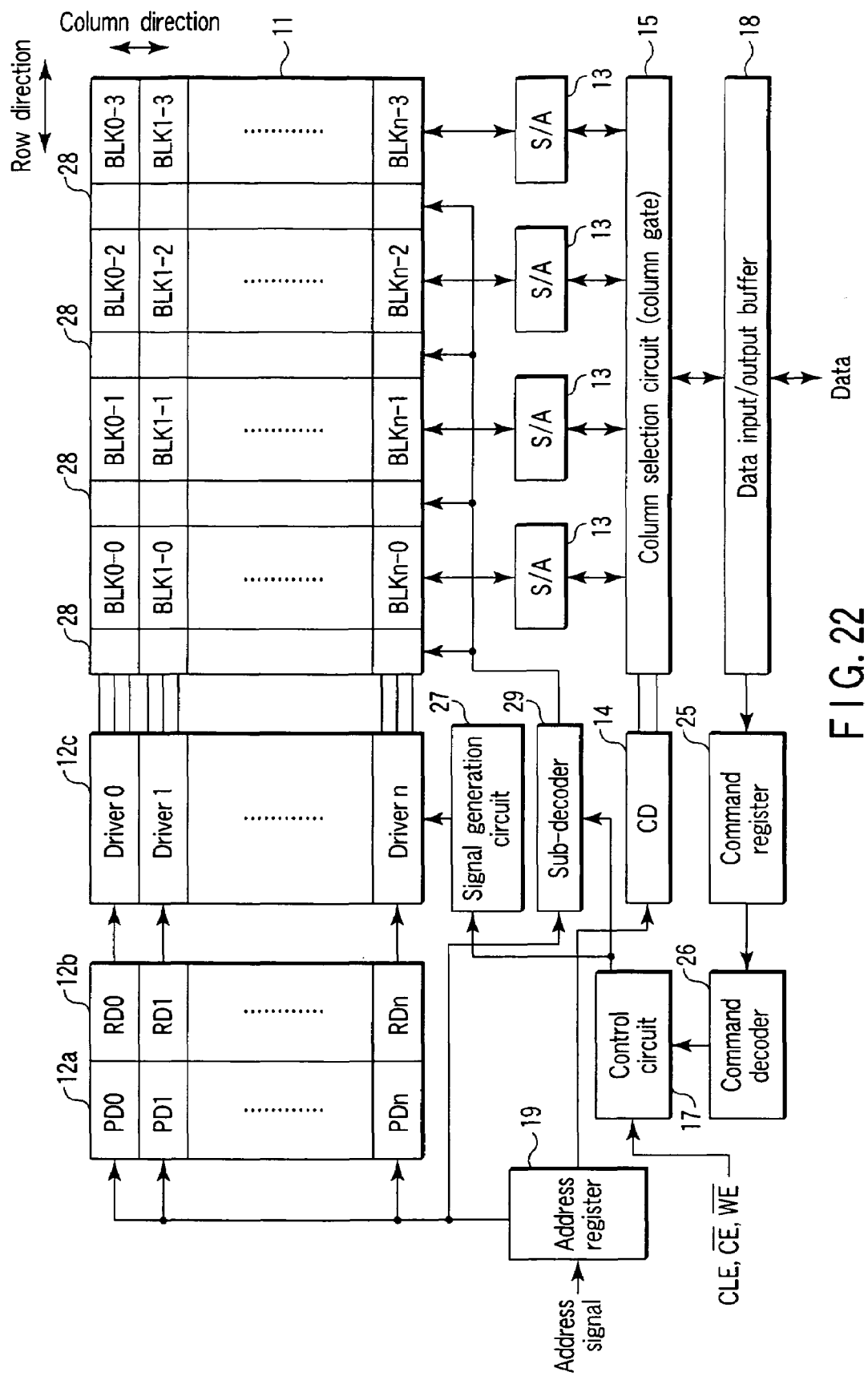
FIG. 22 is a diagram showing the 3Tr. NAND according to the embodiment of the present invention.

FIG. 22 shows an example of the circuit blocks of the 3Tr. NAND in which a complete byte renewal operation for erase/write only the data as the renewal object is possible.

In the present example, the memory cell array 11 is constituted of a plurality of blocks BLKi–j (i=0, 1, . . . n; j=0, 1, 2, 3) arranged in a matrix form in the row and column directions.

In the example of FIGS. 17 to 20, the blocks BLKi are disposed only in the column direction, and the memory cells for one page connected to one control gate line CGL surely exist in the same block BLKi. In the present invention, the memory cell for one page is divided into a plurality of cells by a unit of integer times one byte (8 bits), and the plurality of blocks are arranged also in the row direction.

Concretely, when one page is constituted of the memory cell of k bytes (k is a positive number), and when one block is constituted of the memory cell of r bytes (r is a positive number, $r \leq k$), the number of blocks in the row direction is k/r. In the present example, the number of blocks in the row direction is assumed to be four. In this case, for example, one block is constituted of the memory cell of 16 bytes, and one page is constituted of the memory cell of 64 bytes.

The main control gate/select gate driver 12c is disposed for four blocks BLKi–j in the row direction, that is, for one control gate line CGL (one page). Each driver 12c includes the booster circuit. The predecoder 12a and row decoder 12b are also disposed for four blocks BLKi–j, that is, one control gate line CGL (one page).

A sub-control gate driver 28 is disposed for each block BLKi–j.

The row address signal is inputted into the predecoder 12a and a sub-decoder 29 via the address register 19. Subsequently, the predecoder 12a and row decoder 12b select four blocks BLKi–j in one row. Moreover, the sub-decoder 29 selects one of the selected four blocks BLKi–j.

It is to be noted that the sub-decoder 29 may have a function of selecting a plurality of blocks in one selected row or all the blocks (four blocks in the present example) in one selected row.

Moreover, in the present example, the data can be read, erased, and written by a block unit. That is, in the data renewal operation by the byte unit, the data for one page does not have to be read in the sense amplifier circuit which has the latch function. Therefore, in the present example, in the data renewal operation by the byte unit, the number of times of page read, erase, write can be reduced and substantial page renewal characteristics can be enhanced as compared with the example of FIGS. 17 to 20.

For example, a case will be considered in which the page renewal characteristics (renewal times) of the EEPROM including one page constituted of the memory cell of k bytes (k is the positive number) is $1 \times 10^6$ times.

In the example of FIGS. 17 to 20, since k page read, erase, write operations are required for renewing the data for one page, the page renewal characteristics substantially decreases to $(1/k) \times 10^6$ times.

In the present example, the method comprises: dividing one page into k/r blocks (r is the positive number, $r \leq k$); and constituting each block of the memory cell of r bytes, so that the data can be read, erased, and written by the block unit. Therefore, the number of the page read, erase, write operations for renewing the data for one page may substantially be $(1/r) \times 10^6$.

When represented by a concrete numeric value, for example, one page is constituted of 64 bytes. In this case, the page renewal characteristics of the example of FIGS. 17 to 20 is $1.7 \times 10^4$ times. On the other hand, when one page is constituted of eight blocks and one block is constituted of eight bytes, the page renewal characteristics of the present example are $1.3 \times 10^5$ times, and the substantial renewal characteristics are enhanced by one digit as compared with the example of FIGS. 17 to 20.

It is to be noted that, in the present example, when one block is constituted of one byte, the substantial renewal characteristics can be $1 \times 10^6$ times at maximum.

When the selected block is BLKi–j, a main control gate/select gate driver i supplies a predetermined potential to the control gate line CGL and select gate lines SSL, GSL in the selected block BLKi–j in accordance with the operation mode.

The sense amplifier circuit 13 having the latch function latches the read data or write data. The read data (output data) is outputted to the outside of the memory chip via the column selection circuit 15 and input/output buffer 18. The write data (input data) is latched by the sense amplifier circuit 13 having the latch function via the input/output buffer 18 and column selection circuit 15.

The command signal is inputted into the command decoder 26 via the data input/output buffer 18 and command register 25. In the control circuit 17, the signals are inputted such as the output signal of the command decoder 26, the command latch enable signal CLE, the chip enable signal /CE, and the write enable signal /WE.

Under the control of the control circuit 17, the signal generation circuit (booster circuit) 27 generates the potentials supplied to the control gate line CGL and select gate lines SSL, GSL, and supplies this potential to the control gate/select gate driver 12c.

Figure 23:
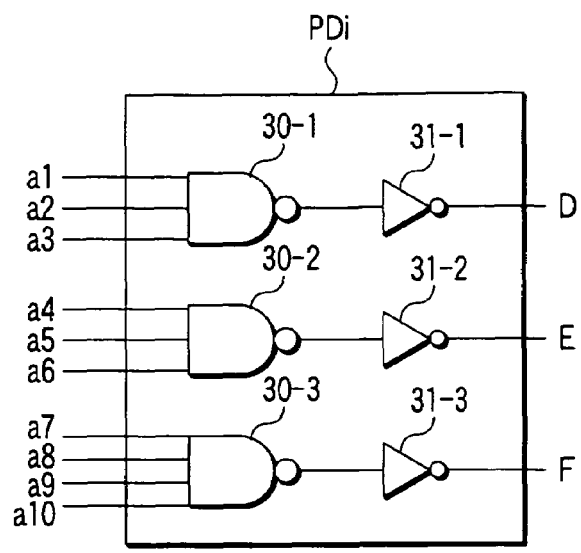
FIG. 23 is a diagram showing an example of a predecoder of the 3Tr. NAND of FIG. 22.

FIG. 23 shows one example of a predecoder PDi.

In the present example, the number of rows, that is, the number of control gate lines CGL (the number of blocks) is assumed to be $1024(2^{10})$. In this case, one control gate line CGL can be selected by row address signals a1, a2, ... a10 of ten bits.

The row address signals a1, a2, a3 are inputted into an NAND circuit 30-1, the row address signals a4, a5, a6 are inputted into an NAND circuit 30-2, and the row address signals a7, a8, a9, a10 are inputted into an NAND circuit 30-3. The output signal of the NAND circuit 30-1 turns to a signal D via an inverter 31-1, the output signal of the NAND circuit 30-2 turns to a signal E via an inverter 31-2, and the output signal of the NAND circuit 30-3 turns to a signal F via an inverter 31-3.

Different row address signals a1, a2, ... a10 are inputted into each predecoder PDi. Moreover, only the output signals D, E, F of the predecoder PDi which belongs the selected one row are all "1".

Figure 24:
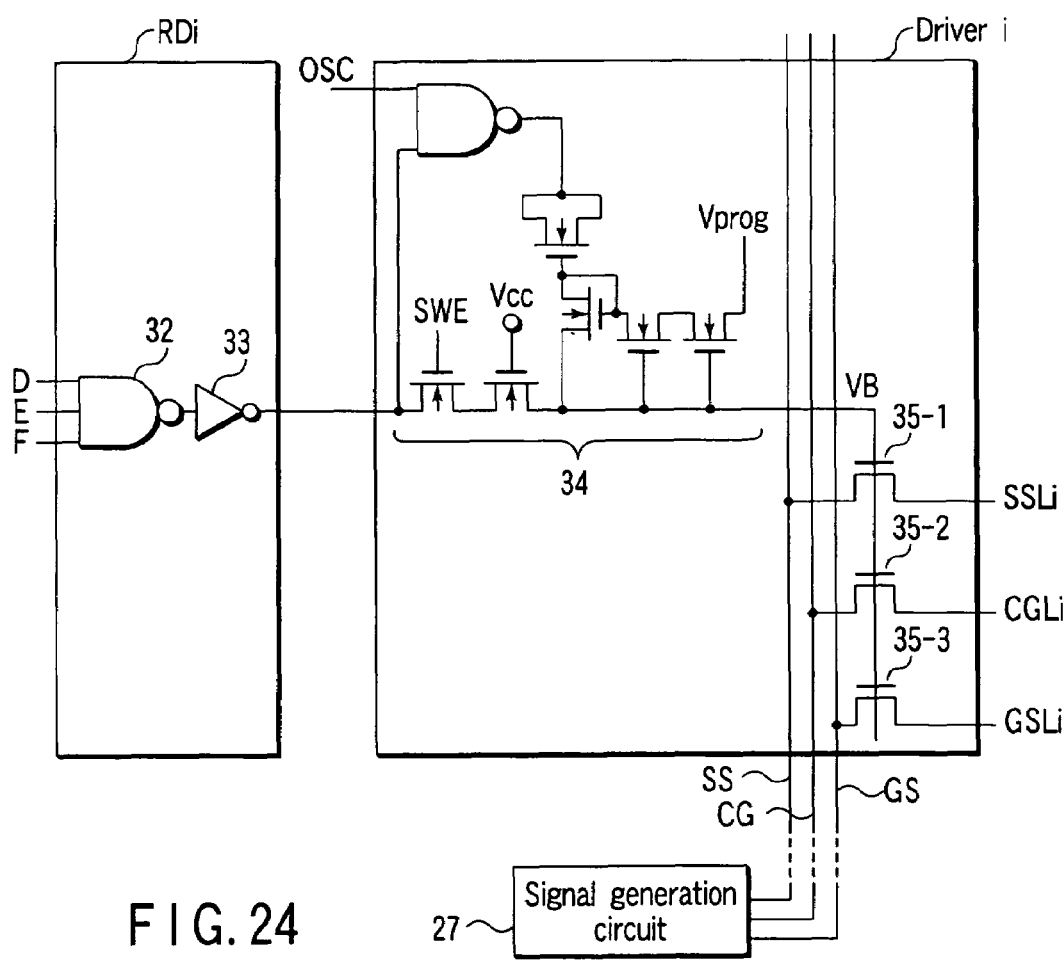
FIG. 24 is a diagram showing an example of a row decoder and driver of the 3Tr. NAND of FIG. 22.

FIG. 24 shows one example of the constitution of a row decoder RDi and the main control gate/select gate driver i.

The row decoder RDi is constituted of a NAND circuit 32 and inverter 33. The output signals D, E, F of the predecoder PDi are inputted into the NAND circuit.

The main control gate/select gate driver i is constituted of a booster circuit 34, and N channel MOS transistors 35-1, 35-2, 35-3 which are drive circuits.

In the main control gate/select gate driver i which belongs to the selected row, the power potential VCC or a booster potential is applied to the gates of the N channel MOS transistors 35-1, 35-2, 35-3.

For example, at a data write time, in the driver i which belongs to the selected row, an output potential VB of the booster circuit 34 turns to a booster potential Vprog, and the N channel MOS transistors 35-1, 35-2, 35-3 are brought into the on state. On the other hand, in a signal generation circuit 27, SS (=VCC), CG (=Vprog), GS (=0V) are generated. These potentials SS, CG, GS are transmitted to a main control gate line CGLi and select gate lines SSLi, GSLi in the selected row via the N channel MOS transistors 35-1, 35-2, 35-3.

Moreover, at a data erase time, in the driver i which belongs to the selected row, the output potential VB of the booster circuit 34 turns to the power potential VCC, and the N channel MOS transistors 35-1, 35-2, 35-3 are brought into the on state. On the other hand, in the signal generation circuit 27, SS (=VCC), CG (=0V), GS (=VCC) are generated. These potentials SS, CG, GS are transmitted to the main control gate line CGLi and select gate lines SSLi, GSLi in the selected row via the N channel MOS transistors 35-1, 35-2, 35-3.

It is to be noted that the select gate lines SSLi, GSLi are thereafter brought into a floating state. Therefore, when the erase potential Vera is supplied to the P well, the potentials of the select gate lines SSLi, GSLi rise to Vera+α by the capacity coupling of the P well and select gate lines SSLi, GSLi.

Moreover, at a data read time, in the driver i which belongs to the selected row, the output potential VB of the booster circuit 34 turns to the power potential VCC or VCC+α (α is a value not less than the threshold voltage of the N channel transistor), and the N channel MOS transistors 35-1, 35-2, 35-3 are brought into the on state. On the other hand, in the signal generation circuit 27, SS (=VCC), CG (=0V or VCC), GS (=VCC) are generated. These potentials SS, CG, GS are transmitted to the main control gate line CGLi and select gate lines SSLi, GSLi in the selected row via the N channel MOS transistors 35-1, 35-2, 35-3.

In the main control gate/select gate driver i which belongs to the non-selected row, since the ground potential is applied to the N channel MOS transistors 35-1, 35-2, 35-3, the N channel MOS transistors 35-1, 35-2, 35-3 are brought into an off state. Therefore, the main control gate line CGLi and select gate lines SSLi, GSLi in the non-selected row are all brought into the floating state.

It is to be noted that at the data read time, VSS (0V) may be applied to the select gate lines SSLi, GSLi in the non-selected row. In this case, for example, MOS transistors for ground are connected to all the select gate lines SSLi, GSLi, and are controlled to be on/off by presence/absence of row (or block) selection.

Figure 25:
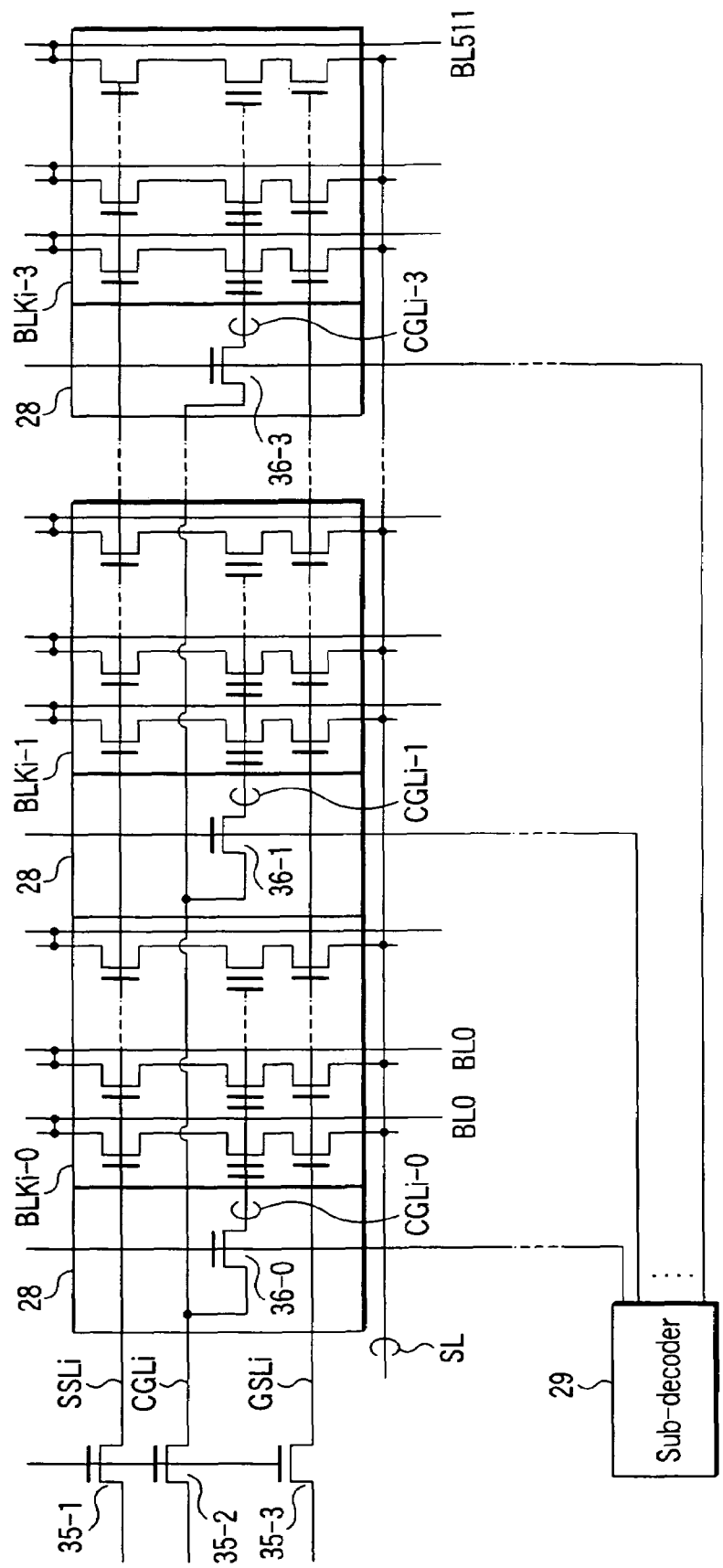
FIG. 25 is a diagram showing one row of the memory cell array of the 3Tr. NAND of FIG. 22.

FIG. 25 shows one example of the constitution of a plurality of blocks and sub-control gate driver disposed in one row.

In the present example, a case in which four blocks BLKi-0, BLKi-1, BLKi-2, BLKi-3 are disposed in one row will be described.

In the respective blocks BLKi–j (j=0, 1, 2, 3), sub-control gate lines CGLi-0, CGLi-1, CGLi-2, CGLi-3 are disposed. The sub-control gate lines CGLi–j (j=0, 1, 2, 3) are connected to the memory cells of positive number of times (e.g., 16 bytes) one byte disposed in each block BLKi–j.

The sub-control gate lines CGLi–j are connected to the main control gate lines CGLi via N channel MOS transistors 36-j which are drive circuits constituting the sub-control gate drivers 28.

The N channel MOS transistors 36-j are controlled to be on/off by the sub-decoder 29. The sub-decoder 29 has a function of selecting one N channel MOS transistor 36-j (one block).

It is to be noted that the sub-decoder 29 may have a function of selecting a plurality of or all N channel MOS transistors 36-j (a plurality of or all blocks).

At the data write time, in the selected block. BLKi–j in the selected row, Vprog is applied to the gate of the N channel MOS transistors 36-j, and therefore this N channel MOS transistors 36-j is brought into the on state. Therefore, the high potential Vprog for the write is transmitted to the sub-control gate line CGLi–j in the selected block BLKi–j from the main control gate line CGLi.

Moreover, at the data erase time, in the selected block BLKi–j in the selected row, VCC is applied to the gate of the N channel MOS transistors 36-j, and therefore this N channel MOS transistors 36-j is brought into the on state. Therefore, the ground potential is transmitted to the sub-control gate line CGLi–j in the selected block BLKi–j from the main control gate line CGLi.

Furthermore, at the data read time, in the selected block BLKi–j in the selected row, VCC is applied to the gate of the N channel MOS transistors 36-j, and therefore this N channel MOS transistors 36-j is brought into the on state. Therefore, the ground potential or the power potential VCC is transmitted to the sub-control gate line CGLi–j in the selected block BLKi–j from the main control gate line CGLi.

On the other hand, in the non-selected block BLKi–j in the selected row, the ground potential is applied to the gate of the N channel MOS transistors 36-j, and therefore this N channel MOS transistors 36-j is brought into the off state. That is, the sub-control gate line CGLi–j in the non-selected block BLKi–j is brought into the floating state.

Here, in the selected row, a plurality of sub-control gate lines CGLi–j are disposed right under the main control gate line CGLi. Therefore, at the write, erase, and read times, when the predetermined potential is applied to the main control gate line CGLi, there is possibility that the potential of the sub-control gate line CGLi–j in the non-selected block BLKi–j changes by the capacity coupling.

However, the change of the potential of the sub-control gate line CGLi–j in the non-selected block BLKi–j is not inconvenient for the write, erase, read operations.

It is to be noted that the select gate lines SSLi, GSLi in the selected row are common to all the blocks BLKi–j in the selected row.

Therefore, at the data write time, the ground potential or power potential VCC is applied to the select gate lines SSLi, GSLi of all the blocks BLKi–j in the selected row via the N channel MOS transistors 35-1, 35-3. At the data erase time, VCC is applied to the select gate lines SSLi, GSLi of all the blocks BLKi–j in the selected row via the N channel MOS transistors 35-1, 35-3. At the data read time, the power potential VCC is applied to the select gate lines SSLi, GSLi of all the blocks BLKi–j in the selected row via the N channel MOS transistors 35-1, 35-3.

Figure 26:
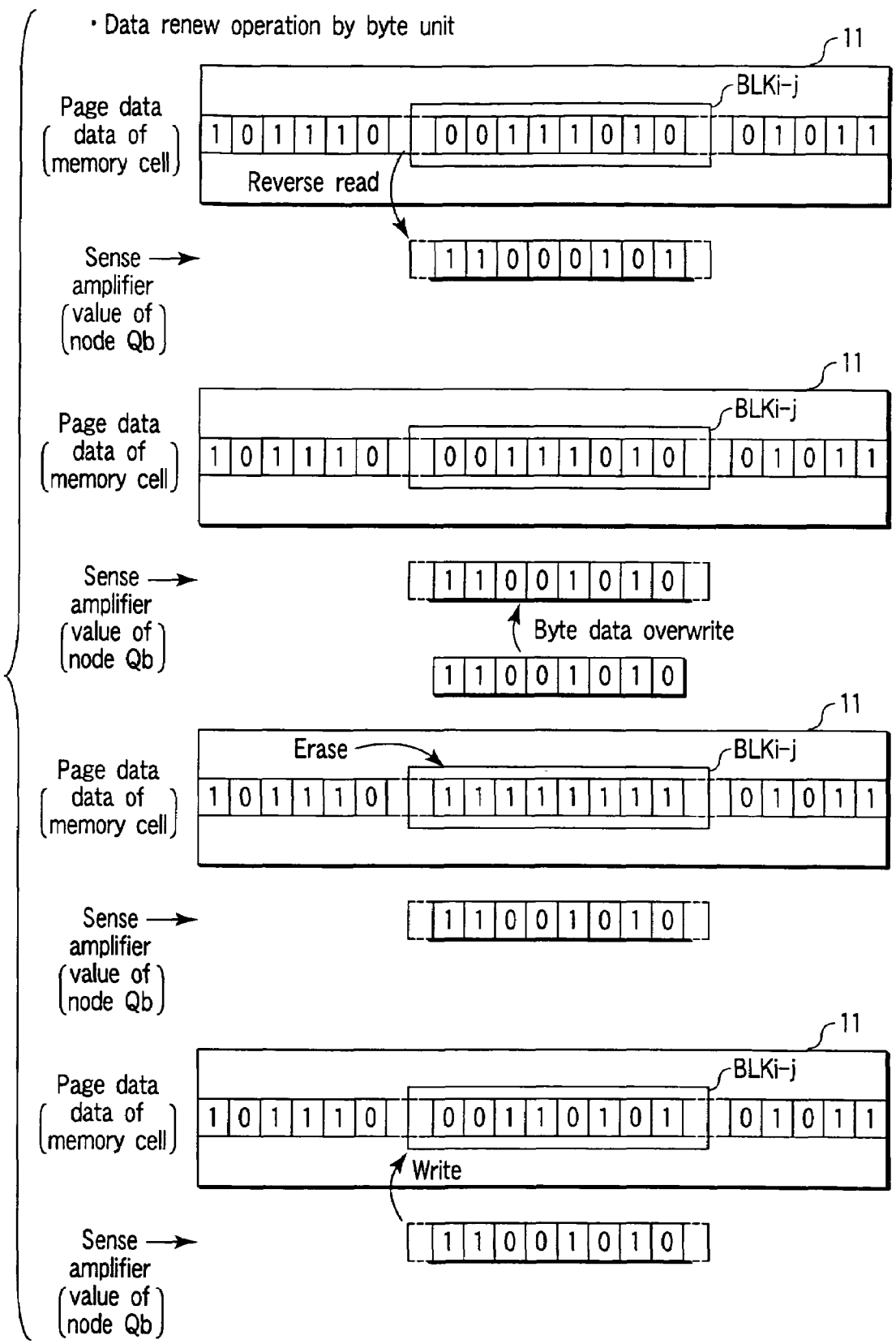
FIG. 26 is a diagram showing the byte renewal operation according to the embodiment of the present invention.

FIG. 26 shows a first example of the data renewal operation by the byte unit, which is applied to the 3Tr. NAND of FIGS. 22 to 25.

The data renewal operation by the byte unit according to the present example comprises the following four main steps of:

① performing the reverse read of the data with respect to the memory cells in the selected block to hold the data in the sense amplifier circuit having the latch function;

② overwriting the byte data with respect to the data held by the sense amplifier circuit having the latch function;

③ erasing the data of the memory cells in the selected block; and

④ writing the data held by the sense amplifier circuit having the latch function into the memory cells in the selected block.

The characteristics of the data renewal operation by the byte unit according to the present example lie in that to perform the data renewal by the byte unit, without performing the reverse read of the data for one page in the selected row, the reverse read is performed only with respect to only the data (the data of the positive number of times one byte) of the selected block BLKi–j in the selected row. That is, since the reverse read does not have to be performed with respect to the data of the memory cell of the non-selected block in the selected row, the unnecessary read, erase, write operations with respect to the memory cell not to be data-renewed can be eliminated.

Therefore, when the same data is renewed, in the renewal operation of the present example, as compared with the renewal operation of FIG. 21, the number of times of the page read, erase, write can be reduced, and the substantial page renewal characteristics (the number of renews) can be enhanced.

In this manner, according to the present example, the memory can be manufactured by the same process as that of the flash memory, and the same renewal method is applied. However, without deteriorating the renewal characteristics, the renewal of the data by the byte unit is possible.

Figure 27:
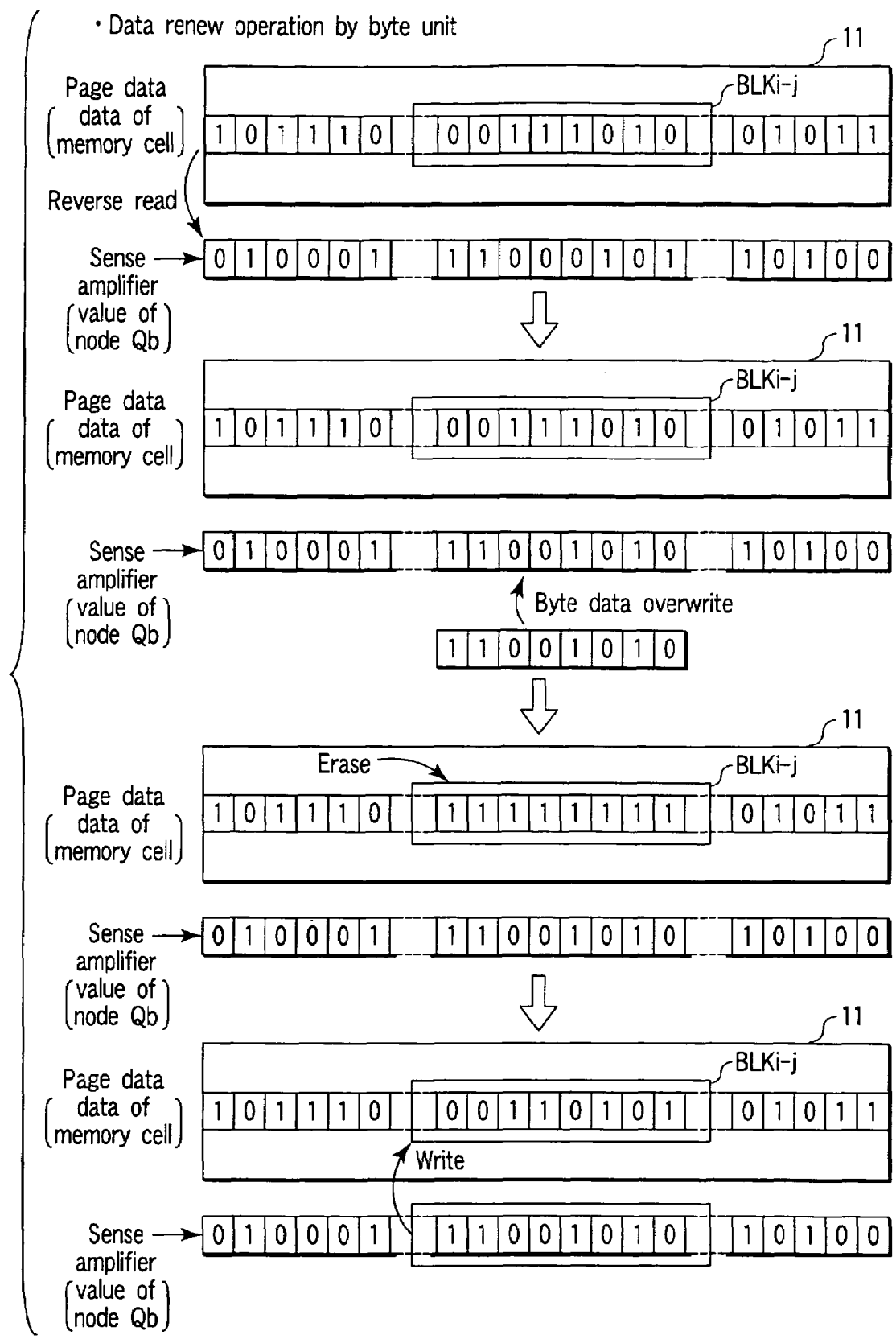
FIG. 27 is a diagram showing the byte renewal operation according to the embodiment of the present invention.

FIG. 27 shows a second example of the data renewal operation by the byte unit, which is applied to the 3Tr. NAND of FIGS. 22 to 25.

The data renewal operation by the byte unit according to the present example comprises the following four main steps of:

① performing the reverse read of the data with respect to the memory cells for one page in the selected row to hold the data in the sense amplifier circuit having the latch function;

② overwriting the byte data with respect to the data held by the sense amplifier circuit having the latch function;

③ erasing the data of the memory cells in the selected block; and

④ writing the data held by the sense amplifier circuit having the latch function into the memory cells in the selected block.

The characteristics of the data renewal operation by the byte unit according to the present example lie in that the reverse read is performed with respect to the memory cells for one page as compared with the renewal operation of FIG. 21. That is, in the present example, the data of the memory cells for one page is reverse-read, but the erase and write are performed with respect to only the selected block in the selected row. Therefore, the unnecessary erase, write operations with respect to the data of the memory cell of the non-selected block in the selected row can be eliminated.

In this case, in the reverse read operation, all the blocks BLKi–j in the selected row are multiple-selected by the sub-decoder so that all the blocks BLKi–j in the selected row are selected.

In the renewal operation of the present example, as compared with the renewal operation of FIG. 21, the number of times of the page erase, write can be reduced, and the substantial page renewal characteristics (the number of renews) can be enhanced.

In this manner, according to the present example, the memory can be manufactured by the same process as that of the flash memory, and the same renewal method is applied. However, without deteriorating the renewal characteristics, the renewal of the data by the byte unit is possible.

Figure 28:
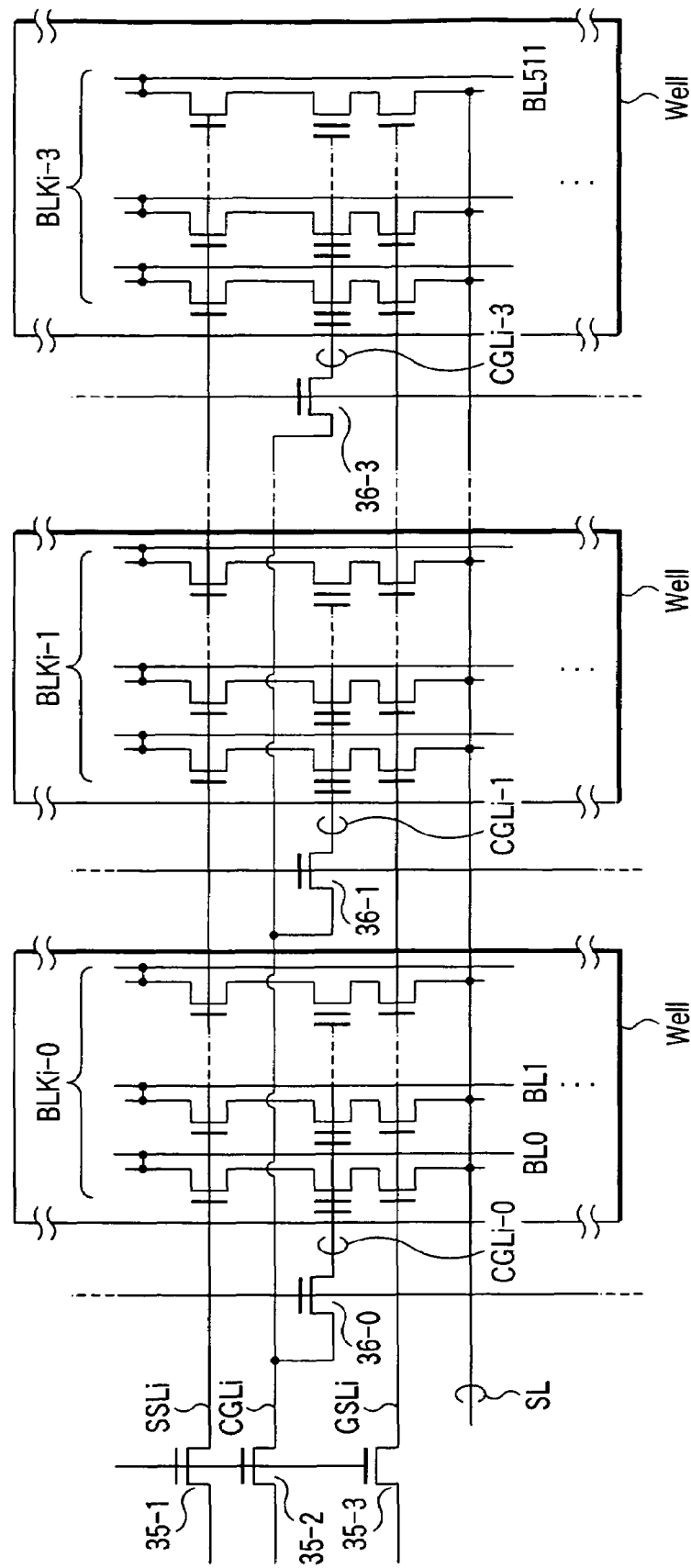
FIG. 28 is a diagram showing an arrangement example of wells in a memory cell array region.

FIG. 28 shows one example of layout of wells in a memory cell array region.

In the flash memory, all the cell units (memory cells and select gate transistors) are usually formed in one well (e.g., twin well, that is, p-type well in n-type well formed in a p-type substrate). However, in the present example, a sub-control gate driver is disposed between the cell units. The sub-control gate driver has a function of transmitting the high potential to the sub-control gate. When the driver is formed in the same well as that of the memory cell, the threshold value rises by a back gate bias effect, or the operation becomes unstable by the potential of the well.

To solve the problem, in the present example, the common well is disposed in the blocks BLKi–j in the column direction, and the blocks BLKi–j in the row direction are disposed in different wells. In this case, the sub-control gate driver is formed outside the well, that is, in the p-type substrate, and the above-described problem can be avoided.

It is to be noted that the potential supplied to the well at the write time and erase time can be devised to dispose all the cell units and sub-control gate drivers in one well.

2. Nonvolatile Semiconductor Memory According to Embodiment of the Present Invention The nonvolatile semiconductor memory according to an embodiment of the present invention will be described hereinafter.

In the reference example, the 3Tr. NAND in which the following byte renewal operations are possible has been described:

① byte renewal operation of also performing erase/write with respect to the data of the memory cell which is not the renewal object; and ② complete byte renewal operation of performing the erase/write with respect to only the data of the memory cell which is the renewal object.

The above renewal operation ② can be realized by devising the circuit constitution of the 3Tr. NAND on the word line side as described above.

On the other hand, in the example of the present invention, the circuit constitution of the 3Tr. NAND on the bit line side or source line side is devised to realize the byte renewal operation in a complete form in which only the data of the memory cell constituting the renewal object is erased/written.

(1) Whole Constitution

Figure 29:
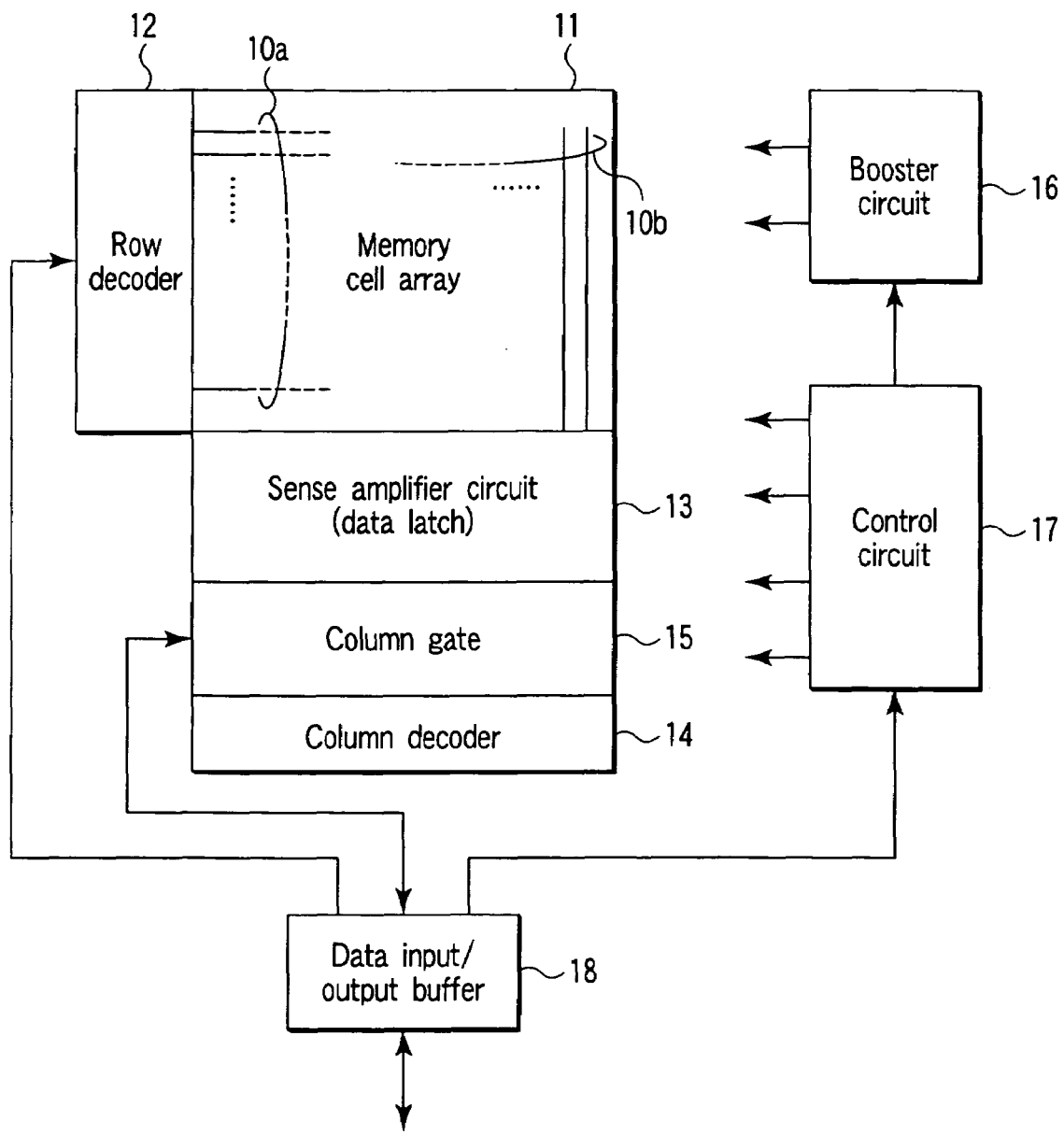
FIG. 29 is a block diagram showing a major part of the 3Tr. NAND according to the embodiment of the present invention.

FIG. 29 shows a main part of the circuit block of the 3Tr. NAND according to the embodiment of the present invention.

As described above, the 3Tr. NAND includes: a memory cell array 11 in which the cell units each constituted of three elements including one memory cell and two select gate transistors holding the cell between them are disposed in a matrix form; a plurality of control gate lines 10a disposed in the row direction on the memory cell array 11; and a plurality of bit lines 10b disposed in the column direction on the memory cell array 11.

A row decoder 12 selects the row, that is, the control gate line 10a. The data of the memory cell connected to the selected control gate line 10a is inputted into the sense amplifier circuit 13 including the sense amplifier which is disposed in each column and which has a data latch function. A column decoder 14 selects the column, that is, the bit line BLi.

The data of the sense amplifier of the selected column is outputted to the outside of the memory chip via the data input/output buffer 18. The data inputted into the memory chip is latched in the sense amplifier having the latch function of the selected column via the data input/output buffer 18.

A booster circuit 16 generates the high voltage necessary for the write operation or the erase operation. The control circuit 17 performs a function of controlling the operation of each circuit in the memory chip and constituting an interface between the inside and outside of the memory chip. The control circuit 17 includes sequence control means (e.g., a programmable logic array) for controlling the respective erase, write, and read operations with respect to the memory cell.

(2) Memory Cell Array

FIG. 30 shows an example of the memory cell array of the 3Tr. NAND of FIG. 29.

The memory cell array is constituted of a plurality of cell units arranged in the matrix form. One cell unit is constituted of one memory cell and two select gate transistors between which the memory cell is held. The control gate line CGL and select gate lines SSL, GSL extend in the row direction on the memory cell array, and bit lines BLi0, . . . BLi7, BLj0, . . . BLj7 extend in the column direction on the memory cell array.

A set of data stored in the memory cell connected to one control gate line CGL is referred to as page data. In the present example, the memory cell for one page is divided into a plurality of blocks. For example, the data for one byte (eight bits) in the one-page data is regarded as one block.

In the present example, for example, eight memory cells (for one byte) connected to eight bit lines BLi0, BLi1, . . . , BLi7 constitute one block BLKi, and eight memory cells (for one byte) connected to eight bit lines BLj0, BLj1, . . . , BLj7 constitute one block BLKj.

In the present example, the write and erase of the data are performed by controlling a potential difference between the potential of the control gate line CGL and that of the bit line (drain region of the memory cell).

Figure 31:
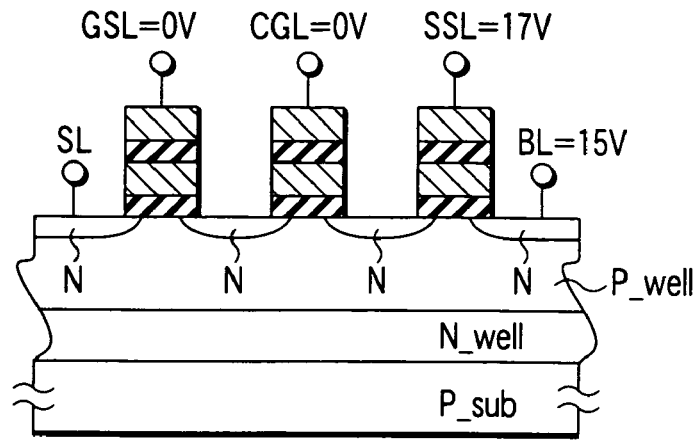
FIG. 31 is a diagram showing an example of an erase system using the FN tunnel current.

For example, as shown in FIG. 31 (only positive bias is used), at the erase time, with respect to the selected memory cell, the potential of the control gate line CGL is set to about 0V, and the potential of the bit line BL is set to about 15V. The potential of the select gate line SSL of the select gate transistor on the drain side (bit line side) of the memory cell is set to about 17V. At this time, an FN tunnel current flows between the control gate and drain region of the memory cell, and the data is erased.

Figure 32:
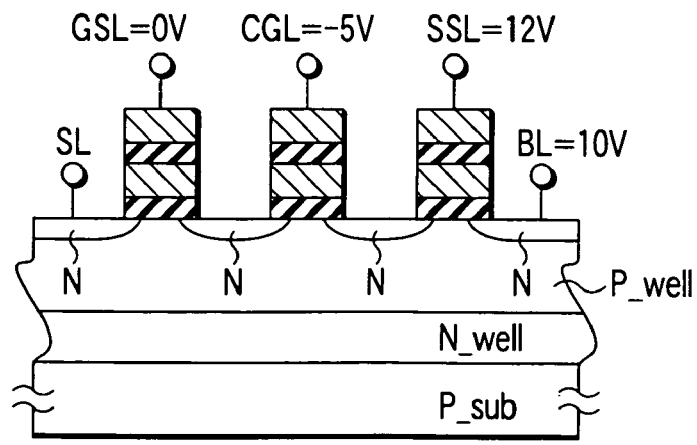
FIG. 32 is a diagram showing the example of the erase system using the FN tunnel current.

Moreover, for example, as shown in FIG. 32 (positive/negative bias is used), at the erase time, with respect to the selected memory cell, the potential of the control gate line CGL is set to about −5V, and the potential of the bit line BL is set to about 10V. The potential of the select gate line SSL of the select gate transistor on the drain side (bit line side) of the memory cell is set to about 12V. At this time, the FN tunnel current flows between the control gate and drain region of the memory cell, and the data is erased.

When this erase system is used, as described later, byte renewal in real meaning is possible in which the write and erase are performed with respect to only the memory cell as the object of the data renewal.

(3) Sense Amplifier Circuit

Figure 33:
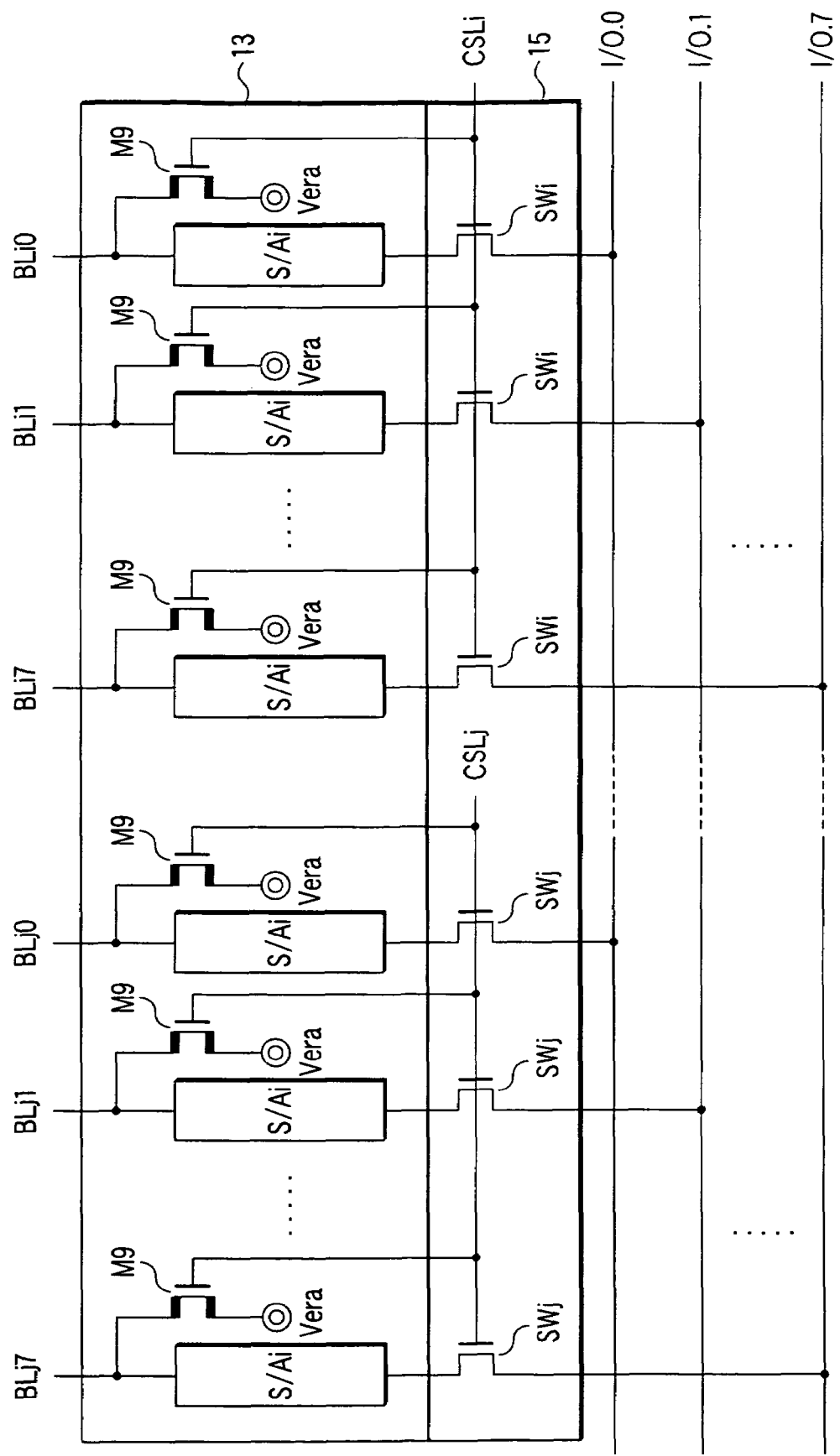
FIG. 33 is a diagram showing a sense amplifier circuit of the 3Tr. NAND of FIG. 29.

FIG. 33 shows an example of the sense amplifier circuit of the 3Tr. NAND of FIG. 29.

The sense amplifier circuit (sense latch) 13 is constituted of: the same number of sense amplifiers S/Ai, S/Aj as that of the bit lines BLi0, . . . BLi7, BLj0, . . . BLj7; and high voltage transistors M9 for supplying the erase potential Vera to the bit lines BLi0, . . . BLi7, BLj0, . . . BLj7. The high voltage transistor transfers a potential higher than the power potential such as the erase potential.

In the same manner as in the memory cell, the sense amplifiers S/Ai, S/Aj are divided into a plurality of blocks. The sense amplifier S/Ai is disposed for the block BLKi of FIG. 30, and the sense amplifier S/Aj is disposed for the block BLKj of FIG. 30.

The sense amplifiers S/Ai are connected to input/output lines I/O•0, . . . I/O•7 via column selection switches SWi. The column selection switches SWi are controlled by a column selection signal CSLi. The sense amplifiers S/Aj are connected to the input/output lines I/O•O, . . . I/O•7 via column selection switches SWj. The column selection switches SWj are controlled by a column selection signal CSLj.

The high voltage transistors M9 connected to the bit lines BLi0, . . . BLi7 are controlled by the column selection signal CSLi. For example, at the erase time, when the colunm selection signal CSLi indicates "H", the high voltage transistors M9 connected to the bit lines BLi0, . . . BLi7 are brought into the on state, and the erase potential Vera is supplied to the bit lines BLi0, . . . BLi7.

The high voltage transistors M9 connected to the bit lines BLj0, . . . BLj7 are controlled by the column selection signal CSLj. For example, at the erase time, when the column selection signal CSLj indicates "H", the high voltage transistors M9 connected to the bit lines BLj0, . . . BLj7 are brought into the on state, and the erase potential Vera is supplied to the bit lines BLj0, . . . BLj7.

(4) Concrete Example of Sense Amplifier

Figure 34:
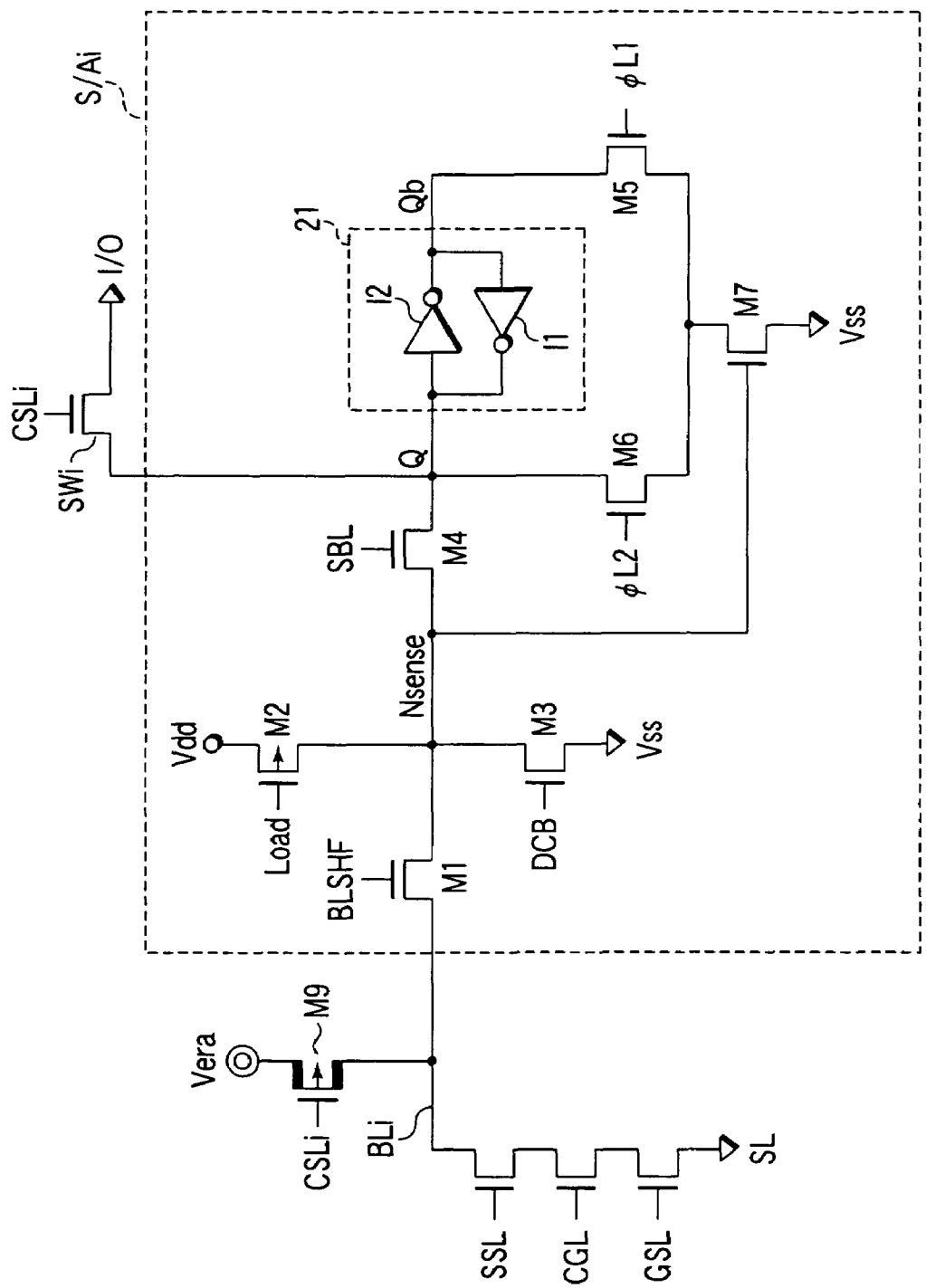
FIG. 34 is a diagram showing a sense amplifier S/Ai in the sense amplifier circuit of FIG. 33.

FIG. 34 shows an example of the sense amplifier S/Ai in the sense amplifier circuit 13 of FIG. 33.

The sense amplifier S/Ai is mainly constituted of a latch circuit 21 including two CMOS inverters 11, 12. An output of one of the inverters is an input of the other inverter. A latch node Q of the latch circuit 21 is connected to a data input/output line I/O via the column selection switch SWi. The latch node Q is connected to the bit line BLi via an N channel MOS transistor M4 for interrupting the sense amplifier, and an N channel MOS transistor M1 for clamping the bit line potential.

A connection node between the N channel MOS transistors M1, M4 is a sense node Nsense. The sense node Nsense is connected to a P channel MOS transistor for precharge M2 and an N channel MOS transistor for discharge M3. The P channel MOS transistor for precharge M2 charges the sense node Nsense in a predetermined period based on a precharge control signal Load. The N channel MOS transistor for discharge M3 discharges the charge from the sense node Nsense based on a discharge control signal DCB.

A latch node Qb of the latch circuit 21 is connected to an N channel MOS transistor for reset M5 for forcedly setting the latch node Qb to the ground potential based on a control signal φL1. The latch node Q of the latch circuit 21 is connected to an N channel MOS transistor for reset M6 for forcedly setting the latch node Q to the ground potential based on a control signal φL2.

A common source of the N channel MOS transistors for reset M5, M6 is connected to a ground point via an N channel MOS transistor for sense M7 which is controlled by the potential of the sense node Nsense. The N channel MOS transistor for sense M7 is also used for resetting the latch circuit 21 together with the N channel MOS transistors M5, M6.

It is to be noted that the transistors M1, M9 are constituted of high voltage transistors so as to be prevented from being destroyed by a high voltage at an erase operation time. The high voltage transistor may be either the N channel MOS transistor or P channel MOS transistor.

(5) Basic Operation

An example of a potential relation at each operation time of erase, write, and read will be described hereinafter. It is to be noted that the memory cell includes a structure shown in FIGS. 9A and 9B, and the memory cell array includes the structure shown in FIG. 30.

Moreover, in each description, terms "selected X X", "non-selected X X" are used. Here, "selected X X" means the line connected to the memory cell which is the object of the data renewal, and "non-selected X X" means the line not connected to the memory cell which is the object of the data renewal.

① Use of only Positive Bias

Table 5 shows one example of the potential relation at the erase time.

TABLE 5

| Selected BL | Vera (15 V) |
|---|---|
| Selected SSL | Vera + Vth (17 V) |
| Selected CGL | Vss (0 V) |
| Selected GSL | Vss (0 V) |
| Non-selected BL | Vss (0 V) |
| Non-selected SSL | Vss (0 V) |
| Non-selected CGL | Vss (0 V) |
| Non-selected GSL | Vss (0 V) |
| Source line SL | Vss (0 V) |
| P well P-well | Vss (0 V) |
| N well N-well | Vss (0 V) |
| P substrate P-sub | Vss (0 V) |

At the erase time, as shown in Table 5, all the control gate lines (selected CGL, non-selected CGL) and all source-side select gate lines (selected GSL, non-selected GSL) are set to 0V. The erase potential Vera (e.g., about 15V) is supplied to the selected bit line (selected BL), and Vera+Vth, for example, about 17V is supplied to the selected drain-side select gate line (selected SSL). Vth is a threshold voltage of the drain-side select gate transistor.

To renew the data by the byte unit, a unit of eight memory cells is regarded as one block, and the data is erased, for example, by the byte unit. Therefore, the number of selected bit lines (selected BL) are 8×m (m is a natural number). It is to be noted that naturally all the bit lines can be selected to erase the page.

The selected drain-side select gate line (selected SSL) is set to Vera+Vth, so that the erase potential Vera is transmitted to the drain region of the selected memory cell without any so-called threshold value drop.

When the potential relation is set as shown in Table 5, a local FN tunnel current flows toward a floating gate electrode from the drain region of the selected memory cell, and electrons in the floating gate electrode are extracted. As a result, the data of the selected memory cell is erased. It is to be noted that here the erase means a negative threshold voltage of the memory cell.

Table 6 shows one example of the potential relation at the write time.

TABLE 6

| Selected BL to perform "0" write | Vss (0 V) |
|---|---|
| Write-prohibited selected BL | Vcc (3 V) |
| Selected CGL | Vpgm (15 V) |
| Selected SSL | Vcc (3 V) |
| Selected GSL | Vss (0 V) |
| Non-selected SSL | Vss (0 V) |
| Non-selected BL | Vss (0 V) |
| Non-selected CGL | Vss (0 V) |
| Non-selected SSL | Vss (0 V) |
| Non-selected GSL | Vss (0 V) |
| Source line SL | Vcc (3 V) |
| P well P-well | Vss (0 V) |
| N well N-well | Vss (0 V) |
| P substrate P-sub | Vss (0 V) |

Program data is inputted, for example, into the sense amplifier circuit 13 from data input/output lines I/O•0, . . . I/O•7 of FIG. 33 by the byte unit. The program data is inputted into the sense amplifiers S/Ai, S/Aj in the block selected by the column selection signals CSLi, CSLj.

At the write time, as shown in Table 6, the non-selected control gate line (non-selected CGL) is set to 0V. The selected drain-side select gate line (selected SSL) is set to a power potential Vcc (e.g., about 3V), and the non-selected drain-side select gate line (non-selected SSL) is set to 0V. All source-side select gate lines (selected GSL, and non-selected GSL) are set to 0V.

The following potential is supplied to the selected bit line (selected BL). Here, the memory cell connected to the selected bit line (selected BL), that is, the memory cell which is the object of the renewal by the byte unit is set to an erased state, that is, "1" state beforehand by the above-described erase operation.

0V is supplied to the selected bit line (selected BL) to perform "0" write, and the power potential Vcc (e.g., about 3V) is supplied to the selected bit line (selected BL) to prohibit the write, that is, to perform "1" write. It is to be noted that "0" write comprises: injecting the electrons into the floating gate electrode of the cell transistor of the 3Tr. NAND to raise the threshold voltage. The write prohibit, that is, "1" write means that threshold voltage of the cell transistor of the 3Tr. NAND is maintained (erased state).

Moreover, 0V is supplied to the non-selected bit line (non-selected BL). The non-selected bit line (non-selected BL) is, for example, the bit line connected to the memory cell which is not the object of the renewal by the byte unit.

In a state in which the above-described potential relation is kept, when a program potential Vpgm (e.g., about 15V) is supplied to the selected control gate line (selected CGL), in the selected memory cell constituting the "0" write object, a high electric field is generated between the floating gate electrode and channel region, and the FN tunnel current flows. As a result, the electrons of the channel region are injected into the floating gate electrode, and the threshold voltage of the cell transistor becomes positive.

On the other hand, in the selected memory cell which is the object of the write prohibit, that is, the "1" write, when the program potential Vpgm is supplied to the selected control gate line (selected CGL), the potential of the channel of the cell transistor rises to Vpgm×β by the capacity coupling of the channel and control gate electrode.

Here, β is a coupling ratio of the channel region when viewed from the control gate electrode. Vpgm×β, that is, write prohibit potential (channel potential) is about 10V. Therefore, the threshold voltage of the cell transistor remains to be negative, and the "1" state is maintained.

Moreover, in the non-selected memory cell connected to the non-selected bit line (non-selected BL), in the same manner as in the write-prohibited memory cell, the channel potential of the cell transistor is a write-prohibited potential, that is, about 10V. Therefore, the high electric field is not generated between the floating gate electrode and channel region, and the program data ("1" or "0") is maintained as such.

It is to be noted that in the write-prohibited selected and non-selected memory cells, the channel potential of the cell transistor rises. The drain-side select gate transistor and source-side select gate transistor are both cut off. The source line SL is set to the power potential Vcc (e.g., about 3V) in order to enhance cut-off characteristics of the source-side select gate transistor and to enhance punch-through resistance characteristics by a boosted channel potential.

TABLE 7

| Selected BL to read "0" | Vpre (2 V) ⇒Vpre (2 V) |
|---|---|
| Selected BL to read "1" | Vpre (2 V) ⇒Vss (0 V) |
| Selected CGL | Vss (0 V) |
| Selected SSL | Vcc (3 V) |
| Selected GSL | Vss (3 V) |
| Non-selected BL | Vss (0 V) |

TABLE 7-continued

| | |
|---|---|
| Non-selected CGL | Vss (0 V) |
| Non-selected SSL | Vss (0 V) |
| Non-selected GSL | Vss (0 V) |
| Source line SL | Vcc (0 V) |
| P well P-well | Vss (0 V) |
| N well N-well | Vss (0 V) |
| P substrate P-sub | Vss (0 V) |

At the read time, as shown in Table 7, the bit line (selected BL) connected to the memory cell which is the object of read is set to a precharge potential Vpre (e.g., about 2V) by the P channel MOS transistor for precharge M2 of FIG. 34 beforehand.

Moreover, the selected source-side/drain-side select gate lines (selected SSL, selected GSL) connected to the memory cell which is the object of the read are set to the power potential Vcc (e.g., about 3V).

The threshold voltage of the cell transistor is positive in the "0" state, and negative in the "1" state. Therefore, when a ground potential Vss (0V) is supplied to the selected control gate line (selected CGL), the potential of the selected bit line (selected BL) changes in accordance with the cell data.

That is, when the cell transistor is in the "0" state, the cell transistor is in the off state. Therefore, the potential of the selected bit line (selected BL) maintains the precharge potential Vpre. On the other hand, when the cell transistor is in the "1" state, the cell transistor is in the on state. Therefore, the potential of the selected bit line (selected BL) changes to the ground potential Vss from the precharge potential Vpre.

According to the present example, the control gate line can constantly be set to the ground potential Vss even in a selected state or non-selected state. Therefore, satisfactory result can be obtained concerning read disturb.

Moreover, in the present example, as described above, for example, by the byte unit, the data can be read into the sense amplifier, and the data for one page can also be read into the sense amplifier.

Furthermore, to renew the data by the byte unit, as described above, the data can be erased by the byte unit. Therefore, old data of the memory cell which is the object of the renewal does not have to be read into the sense amplifier. That is, immediately after the byte is erased, the byte can be written.

For the erase, write, and read operations in Tables 5, 6, and 7, when all the column selection signals CSLi, CSLj are set to the selected state ("H"), page erase, page write, and page read are possible. Moreover, when one or a plurality of column selection signals CSLi, CSLj are set to the selected state ("H"), byte erase, byte write, and byte read are possible.

For the erase operation, the erase potential Vera is supplied to the memory cell from the bit line. However, as shown in Table 8, for example, when the erase potential Vera (e.g., about 15V) is supplied to a P well (P-well) and N well (N-well) shown in FIG. 9B, the page erase can be performed.

TABLE 8

| | |
|---|---|
| Selected BL | Vera − Vfb (14 V) |
| Selected SSL | Vera (15 V) |
| Selected CGL | Vss (0 V) |
| Selected GSL | Vera (15 V) |

TABLE 8-continued

| | |
|---|---|
| Non-selected BL | Vera − Vfb (14 V) |
| Non-selected SSL | Vera (15 V) |
| Non-selected CGL | Vera (15 V) |
| Non-selected GSL | Vera (15 V) |
| Source line SL | Vera − Vfb (14 V) |
| P well P-well | Vss (15 V) |
| N well N-well | Vera (15 V) |
| P substrate P-sub | Vss (0 V) |

In Table 8, it is premised that all the memory cells are disposed in the same P well (P-well) and N well (N-well).

Figure 35:
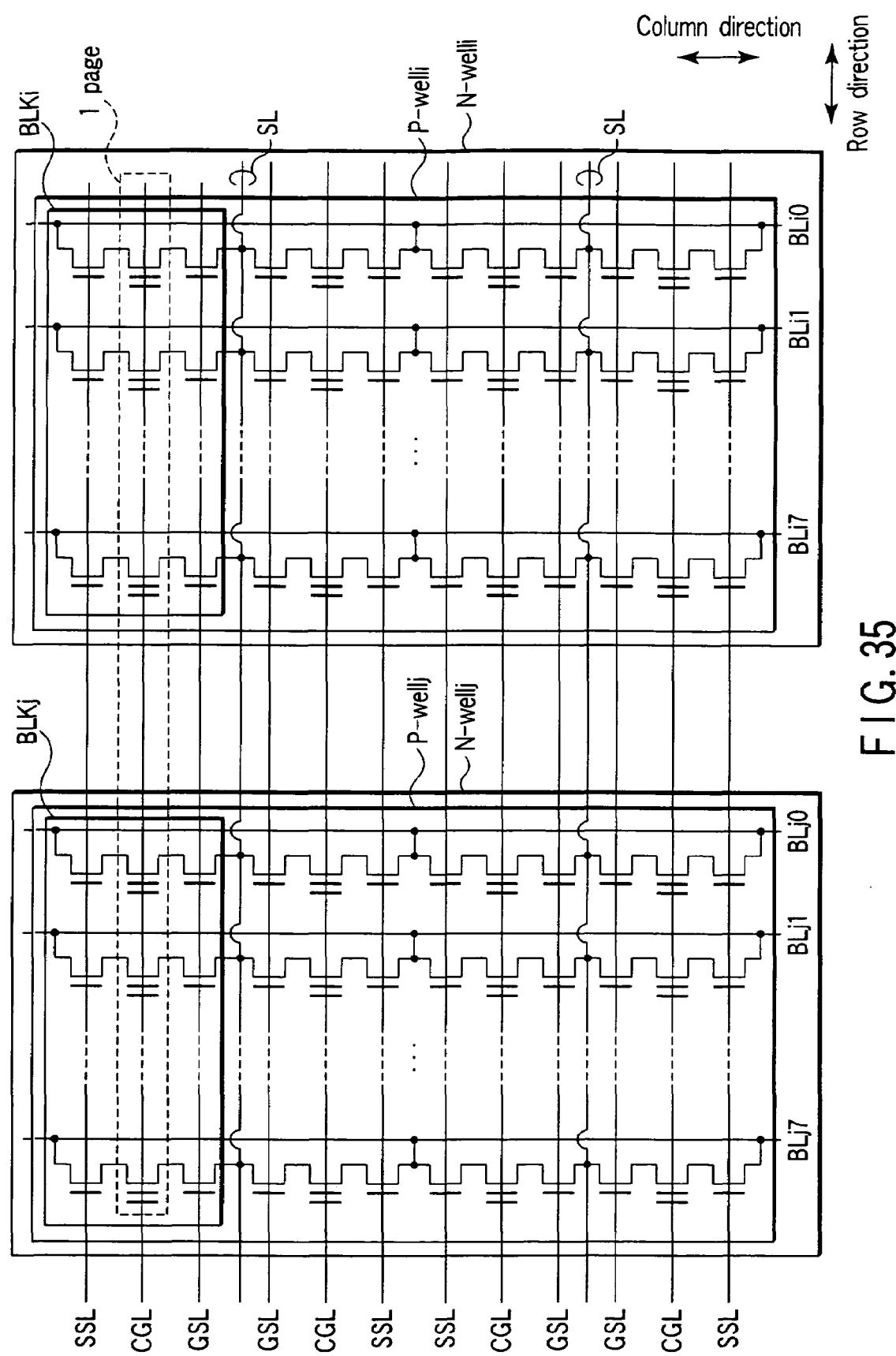
FIG. 35 is a diagram showing the arrangement example of the wells in the memory cell array region.

Moreover, as shown in FIG. 35, when the P well (P-well) and N well (N-well) are disposed for each block with respect to the one-page data, for example, the erase potential Vera is supplied only to the P well (P-well) and N well (N-well) in which the selected block is disposed, and the byte erase can be performed.

It is to be noted that Vfb means a voltage drop by PN-junction.

② Use of Positive/Negative Bias

The potential relation at the erase time and write time with the use of the positive/negative bias will be described hereinafter. The read is the same as that with the use of only the positive bias (Table 7), and is omitted herein.

Table 9 shows one example of the potential relation at the erase time.

TABLE 9

| | |
|---|---|
| Selected BL | Vera1 (10 V) |
| Selected SSL | Vera1 + Vth (12 V) |
| Selected CGL | Vera2 (−5 V) |
| Selected GSL | Vss (0 V) |
| Non-selected BL | Vss (0 V) |
| Non-selected SSL | Vss (0 V) |
| Non-selected CGL | Vss (0 V) |
| Non-selected GSL | Vss (0 V) |
| Source line SL | Vss (0 V) |
| P well P-well | Vss (0 V) |
| N well N-well | Vss (0 V) |
| P substrate P-sub | Vss (0 V) |

At the erase time, as shown in Table 9, the non-selected control gate line (non-selected CGL) and all the source-side select gate lines (selected GSL, non-selected GSL) are set to 0V. The selected bit line (selected BL) is set to Vera1 (e.g., about 10V), and the selected control gate line (selected CGL) is set to Vera2 (e.g., about −5V).

Moreover, the selected drain-side select gate line (selected SSL) is set to Vera1+Vth, for example, about 12V. Vth is the threshold voltage of the drain-side select gate transistor.

To renew the data by the byte unit, the data is erased, for example, by the byte unit. Therefore, the bit line is selected by a block unit. It is to be noted that one block is constituted of eight bit lines. Moreover, when all the bit lines are selected, the page is erased.

The selected drain-side select gate line (selected SSL) is set to Vera1+Vth, so that an erase potential Vera1 is transmitted to the drain region of the selected memory cell without any so-called threshold value drop.

When the potential relation is set as shown in Table 9, the local FN tunnel current flows toward the floating gate electrode from the drain region of the selected memory cell, and the electrons in the floating gate electrode are extracted. As a result, the data of the selected memory cell is erased.

Table 10 shows one example of the potential relation at the write time.

TABLE 10

| | |
|---|---|
| Selected BL to perform "0" write | Vpgm2 (−5 V) |
| Write-prohibited selected BL | Vss (0 V) |
| Selected CGL | Vpgm1 (10 V) |
| Selected SSL | Vss (0 V) |
| Selected GSL | Vpgm2 (−5 V) |
| Non-selected BL | Vpgm2 + Vfb (−4 V) |
| Non-selected CGL | Vss (0 V) |
| Non-selected SSL | Vss (0 V) |
| Non-selected GSL | Vss (0 V) |
| Source line SL | Vpgm2 + Vfb (−4 V) |
| P well P-well | Vpgm2 (−5 V) |
| N well N-well | Vss (0 V) |
| P substrate P-sub | Vss (0 V) |

The program data is inputted, for example, into the sense amplifier circuit 13 from the data input/output lines I/O•0, . . . I/O•7 of FIG. 33 by the byte unit. The program data for one byte is inputted into the sense amplifiers S/Ai, S/Aj in the block selected by the column selection signals CSLi, CSLj.

At the write time, as shown in Table 10, the non-selected control gate line (non-selected CGL) is set to 0V. All the drain-side select gate lines (selected SSL, non-selected SSL) are set to the ground potential (0V). The non-selected source-side select gate line (non-selected GSL) is set to 0V. The selected source-side select gate line (selected GSL) is set to Vpgm2 (e.g., about −5V).

Moreover, the following potential is supplied to the selected bit line (selected BL) in accordance with the program data. Here, the memory cell connected to the selected bit line (selected BL), that is, the memory cell which is the object of the renewal by the byte unit is set to the erased state, that is, "1" state beforehand by the above-described erase operation.

Vpgm2 (e.g., about −5V) is supplied to the selected bit line (selected BL) to perform the "0" write, and the ground potential Vss (0V) is supplied to the selected bit line (selected BL) to prohibit the write, that is, to perform the "1" write. Moreover, Vpgm2+Vfg (e.g., about −4V) is supplied to the non-selected bit line (non-selected BL). Vfb is the voltage drop by the PN-junction.

In the potential relation, when a program potential Vpgm1 (e.g., about 10V) is supplied to the selected control gate line (selected CGL), in the selected memory cell constituting the "0" write object, the high electric field is generated between the floating gate electrode and channel region, and the FN tunnel current flows. As a result, the electrons of the channel region are injected into the floating gate electrode, and the threshold voltage of the cell transistor becomes positive.

On the other hand, in the selected memory cell which is the object of the write prohibit, that is, the "1" write, when the program potential Vpgm1 is supplied to the selected control gate line (selected CGL), the channel potential of the cell transistor rises to Vpgm1×β by the capacity coupling of the channel and control gate electrode. Therefore, the threshold voltage of the cell transistor remains to be negative, and the "1" state is maintained.

Moreover, in the non-selected memory cell connected to the non-selected bit line (non-selected BL), in the same manner as in the write-prohibited memory cell, the channel potential of the cell transistor is the write-prohibited potential, that is, Vpgm1×β. Therefore, the high electric field is not generated between the floating gate electrode and channel region, and the program data ("1" or "0") is maintained as such.

It is to be noted that in the write-prohibited selected and non-selected memory cells, the channel potential of the cell transistor rises. The drain-side select gate transistor and source-side select gate transistor are both cut off. The source line SL is set to Vpgm2+Vfb (e.g., about −4V) in order to enhance the cut-off characteristics of the source-side select gate transistor and to enhance the punch-through resistance characteristics by the boosted channel potential.

Additionally, for the erase operation, the erase potential Vera1 is supplied to the memory cell from the bit line. However, as shown in Table 11, for example, when the erase potential Vera1 (e.g., about 10V) is supplied to the P well (P-well) and N well (N-well) shown in FIG. 9B, the page erase can be performed.

TABLE 11

| | |
|---|---|
| Selected BL | Vera1 − Vfb (9 V) |
| Selected SSL | Vera1 (10 V) |
| Selected CGL | Vera2 (−5 V) |
| Selected GSL | Vera1 (10 V) |
| Non-selected BL | Vera1 − Vfb (9 V) |
| Non-selected SSL | Vera1 (10 V) |
| Non-selected CGL | Vera1 (10 V) |
| Non-selected GSL | Vera1 (10 V) |
| Source line SL | Vera1 − Vfb (9 V) |
| P well P-well | Vera1 (10 V) |
| N well N-well | Vera1 (10 V) |
| P substrate P-sub | Vss (0 V) |

In Table 11, it is premised that all the memory cells are disposed in the same P well (P-well) and N well (N-well).

Moreover, as shown in FIG. 35, when the P well (P-well) and N well (N-well) are disposed for each block with respect to the one-page data, for example, the erase potential Vera is supplied only to the P well (P-well) and N well (N-well) in which the selected block is disposed, and the byte erase can be performed.

③ Erase performed in Accelerated Manner

An example at the erase time will be described comprising: passing the local FN tunnel current toward the boosted drain region from the control gate electrode; and extracting the electrons in the floating gate electrode by hot hall injection to reduce the erase time.

Tables 12 and 13 show one example of the potential relation at the erase time at which the erase operation is accelerated.

TABLE 12

| | |
|---|---|
| Selected BL | Vera (15 V) |
| Selected SSL | Vera + Vth (17 V) |
| Selected CGL | Vss (0 V) |
| Selected GSL | Vth (1 V) |
| Non-selected BL | Vss (0 V) |
| Non-selected SSL | Vss (0 V) |
| Non-selected CGL | Vss (0 V) |
| Non-selected GSL | Vss (0 V) |
| Source line SL | −Vs (−0.5 V) |
| P well P-well | Vss (0 V) |
| N well N-well | Vss (0 V) |
| P substrate P-sub | Vss (0 V) |

TABLE 13

| | |
|---|---|
| Selected BL | Vera (15 V) |
| Selected SSL | Vera + Vth (17 V) |
| Selected CGL | Vss (0 V) |
| Selected GSL | Vss (0 V) |
| Non-selected BL | Vss (0 V) |

TABLE 13-continued

| | |
|---|---|
| Non-selected SSL | Vss (0 V) |
| Non-selected CGL | Vss (0 V) |
| Non-selected GSL | Vss (0 V) |
| Source line SL | Vss (0 V) |
| P well P-well | Vs (0.5 V) |
| N well N-well | Vss (0 V) |
| P substrate P-sub | Vss (0 V) |

Tables 12 and 13 show the potential relation with the use of only the positive bias, that is, modification examples of Table 5.

In Table 12, Vth (about 1V) is supplied to the selected source-side select gate line (selected GSL), and −Vs (e.g., about −0.5V) is supplied to the source line SL. Accordingly, in addition to the FN tunnel current, the hot hall injection is generated, and the drop of the threshold voltage of the cell transistor (discharge of the electrons) is accelerated.

In Table 13, Vs (e.g., about 0.5V) is supplied to a P well region P-well. Accordingly, in addition to the FN tunnel current, the hot hall injection is generated, and the drop of the threshold voltage of the cell transistor (discharge of the electrons) is accelerated.

In this manner, the source of the cell transistor is set to about −0.5V, or the P well region P-well is set to about 0.5V, and therefore the generation of holes becomes remarkable. That is, in the vicinity of the drain of the cell transistor, the hot holes by impact ionization are injected into the floating gate electrode, and therefore the erase operation is promoted.

Tables 14 and 15 show other examples of the potential relation at the erase time at which the erase operation is accelerated.

TABLE 14

| | |
|---|---|
| Selected BL | Vera1 (10 V) |
| Selected SSL | Vera1 + Vth (12 V) |
| Selected CGL | Vera2 (−5 V) |
| Selected GSL | Vth (1 V) |
| Non-selected BL | Vss (0 V) |
| Non-selected SSL | Vss (0 V) |
| Non-selected CGL | Vss (0 V) |
| Non-selected GSL | Vss (0 V) |
| Source line SL | −Vs (−0.5 V) |
| P well P-well | Vss (0 V) |
| N well N-well | Vss (0 V) |
| P substrate P-sub | Vss (0 V) |

TABLE 15

| | |
|---|---|
| Selected BL | Vera1 (10 V) |
| Selected SSL | Vera1 + Vth (12 V) |
| Selected CGL | Vera2 (−5 V) |
| Selected GSL | Vss (0 V) |
| Non-selected BL | Vss (0 V) |
| Non-selected SSL | Vss (0 V) |
| Non-selected CGL | Vss (0 V) |
| Non-selected GSL | Vss (0 V) |
| Source line SL | Vss (0 V) |
| P well P-well | +Vs (0.5 V) |
| N well N-well | Vss (0 V) |
| P substrate P-sub | Vss (0 V) |

Tables 14 and 14 show the potential relation with the use of only the positive/negative bias, that is, modification examples of Table 9.

In Table 14, Vth (about 1V) is supplied to the selected source-side select gate line (selected GSL), and −Vs (e.g., about −0.5V) is supplied to the source line SL. Accordingly, in addition to the FN tunnel current, the hot hall injection is generated, and the drop of the threshold voltage of the cell transistor (discharge of the electrons) is accelerated.

In Table 15, Vs (e.g., about 0.5V) is supplied to the P well region P-well. Accordingly, in addition to the FN tunnel current, the hot hall injection is generated, and the drop of the threshold voltage of the cell transistor (discharge of the electrons) is accelerated.

In this manner, the source of the cell transistor is set to about −0.5V, or the P well region P-well is set to about 0.5V, and therefore the generation of holes becomes remarkable. That is, in the vicinity of the drain of the cell transistor, the hot holes by impact ionization are injected into the floating gate electrode, and therefore the erase operation is promoted.

(6) Byte Renewal Operation

The byte renewal operation according to the embodiment of the present invention will be described hereinafter.

When the 3Tr. NAND of FIGS. 29 to 34 is used, for example, the byte renewal operation described in the reference example, that is, the byte renewal operation shown in FIGS. 26 and 27 can be applied as such.

Furthermore, in the embodiment of the present invention, the following byte renewal operation can also be performed.

Figure 36:
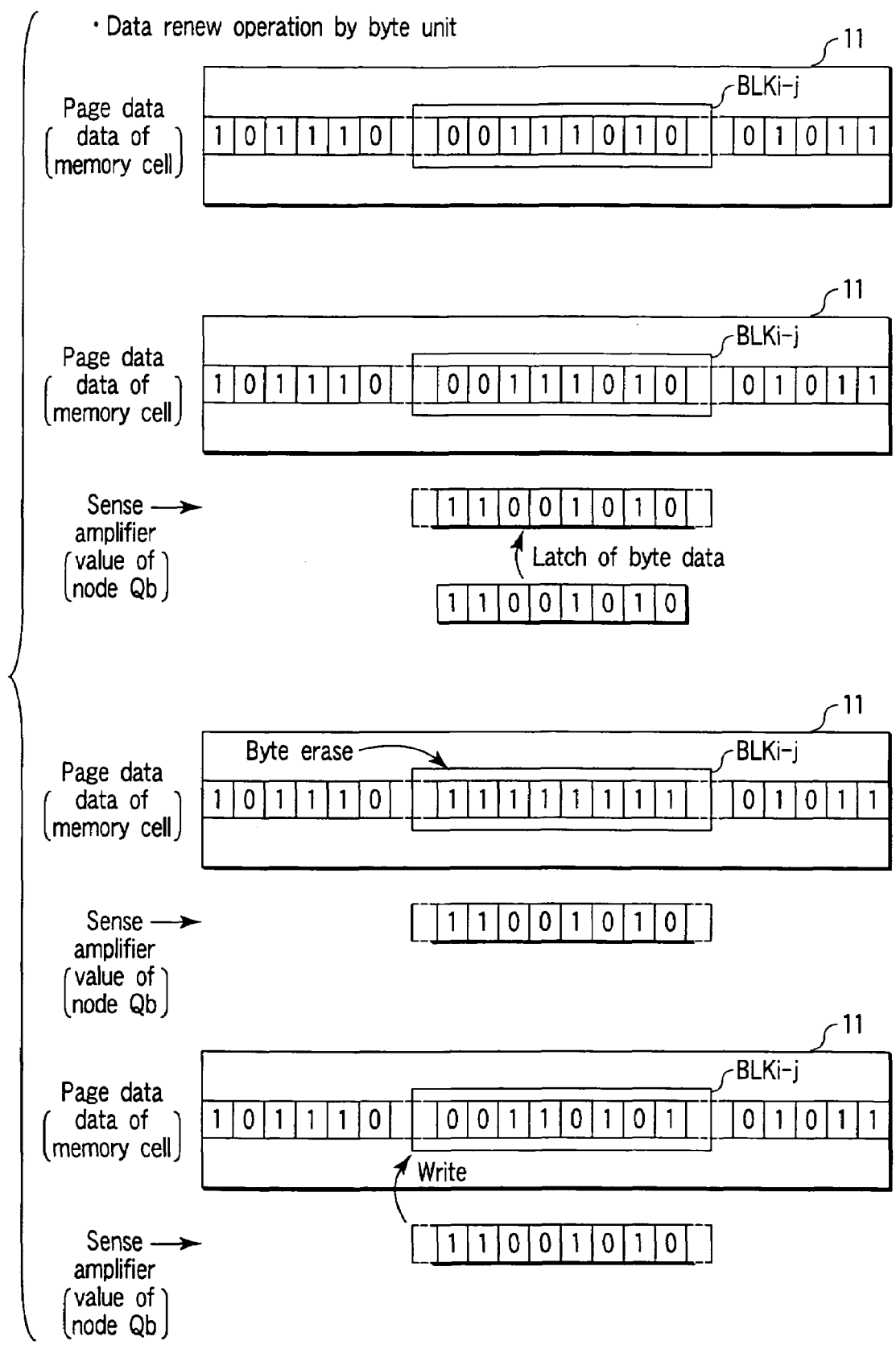
FIG. 36 is a diagram showing the byte renewal operation according to the embodiment of the present invention.

FIG. 36 shows an example of the data renewal operation by the byte unit which is applied to the 3Tr. NAND of FIGS. 29 to 34.

The data renewal operation by the byte unit according to the present example comprises the following four main steps of:

① latching the byte data (program data) in the sense amplifier corresponding to the selected block;

② erasing the data of the memory cell in the selected block (byte erase); and

③ programming the data held in the sense amplifier with respect to only the memory cell in the selected block (byte program).

The characteristics of the data renewal operation by the byte unit according to the present example lie in that to renew the data by the byte unit, the data erase by the byte unit and the data write by the byte unit are performed. Accordingly, the data for one page in the selected row does not have to be temporarily latched in the sense amplifier, and the read operation of the data for one page can be omitted. Therefore, the unnecessary read, erase, and write operations can be eliminated with respect to the memory cell which is not the object of the renewal.

Therefore, considering that the same data is renewed, in the renewal operation of the present example, as compared with the renewal operation of FIG. 21, the number of times of the page read, erase, write can be reduced, and the substantial page renewal characteristics (the number of renews) can be enhanced.

In this manner, according to the present example, the memory can be manufactured by the same process as that of the flash memory. Moreover, although the same renewal method is applied, the renewal of the data by the byte unit is possible without deteriorating the renewal characteristics.

(7) MODIFICATION EXAMPLE

A modification example of the 3Tr. NAND according to the example of the present invention will be described hereinafter.

Figure 37:
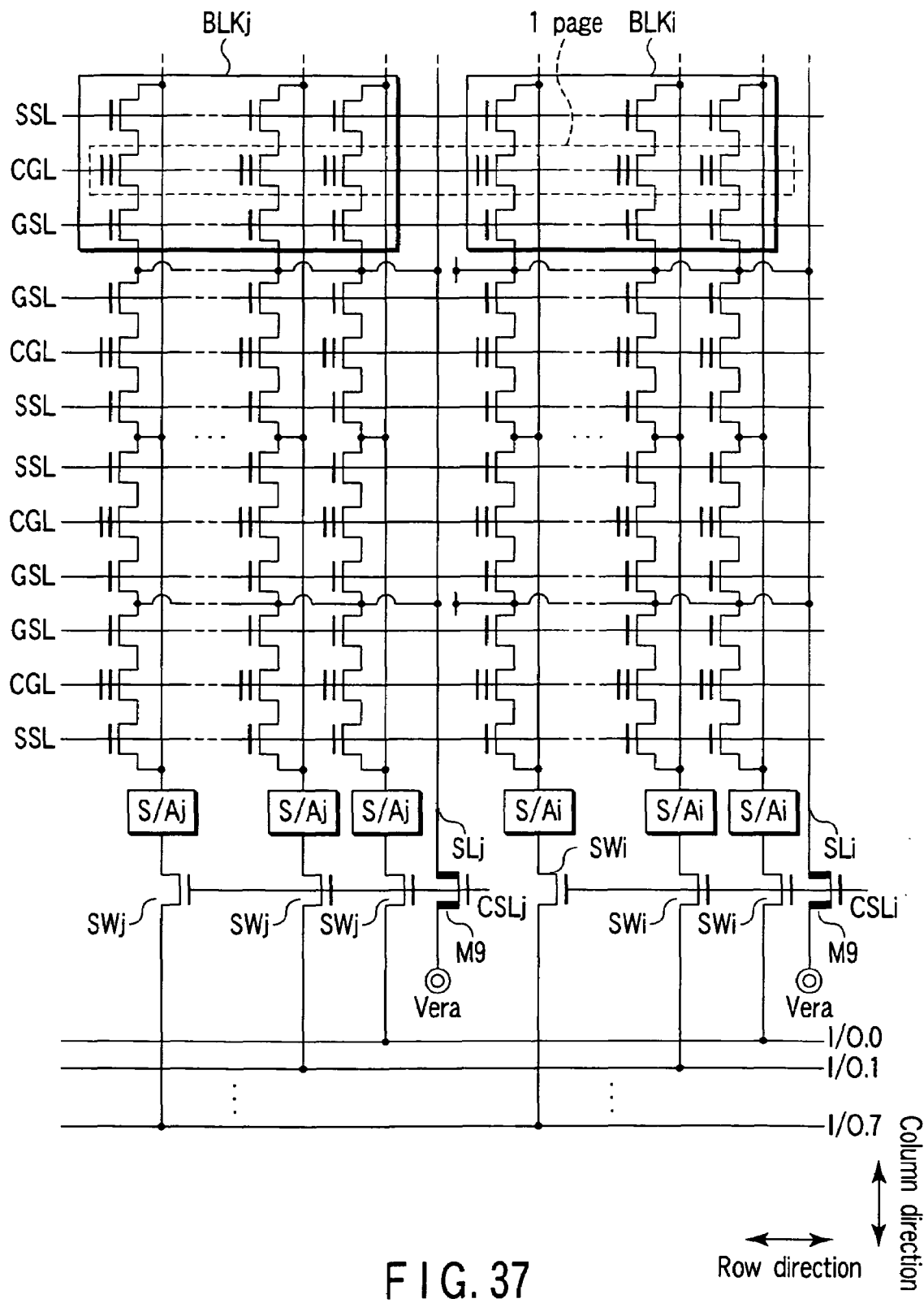
FIG. 37 is a diagram showing the main part of the 3Tr. NAND according to the embodiment of the present invention.

FIG. 37 shows another example of the memory cell array 11 of the 3Tr. NAND of FIG. 29. The memory cell array can be considered as the modification example of the circuits of FIGS. 30 and 33.

In the example of FIGS. 30 and 33, the bit lines BLi0, ... BLi7, BLj0, ... BLj7 are connected to the transistor M9 for supplying the erase potential Vera, and the erase potential Vera is supplied to the drain region of the cell transistor by the byte unit via the bit lines BLi0, ... BLi7, BLj0, ... BLj7.

On the other hand, in the example of FIG. 37, source lines SLi, SLj are connected in common to each memory cell for one byte in one page is connected. The source lines SLi, SLj are connected to the transistor M9 for supplying the erase potential Vera. Accordingly, the erase potential Vera is supplied to the source region of the cell transistor by the byte unit via the source lines SLi, SLj.

In the present example, in the memory cells for one page, eight memory cells (for one byte) connected to eight bit lines BLi0, BLi1, ... BLi7 constitute one block BLKi, and in the memory cells for one page, eight memory cells (for one byte) connected to eight bit lines BLj0, BLj1, ... BLj7 constitute one block BLKj.

The memory cells in the block BLKi are connected in common to the source line SLi, and the memory cells in the block BLKj are connected in common to the source line SLj. The source line SLi is connected to an erase terminal to which Vera is supplied via the column selection switch SWi, and the source line SLj is connected to the erase terminal to which Vera is supplied via the column selection switch SWj.

Moreover, the write and erase of the data are performed, for example, by controlling the potential difference between the potential of the control gate line CGL and that of the source line (source region of the memory cell).

Figure 38:
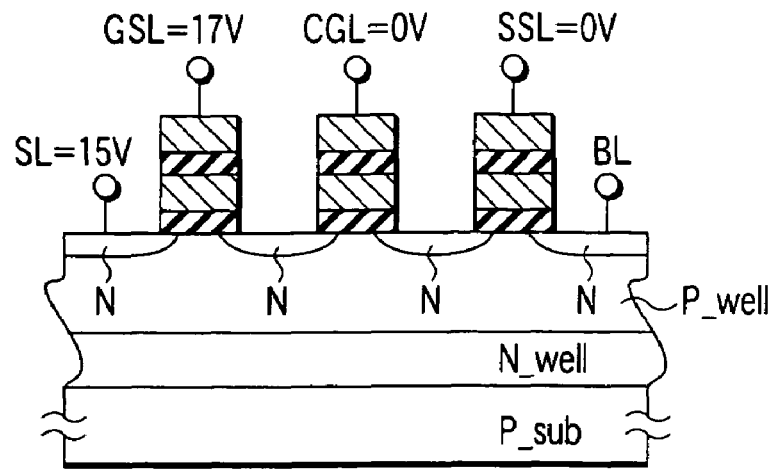
FIG. 38 is a diagram showing an example of the erase system using the FN tunnel current.

For example, as shown in FIG. 38 (only the positive bias is used), at the erase time, with respect to the selected memory cell, the potential of the control gate line CGL is set to about 0V, and the potential of the source line SL is set to about 15V. The potential of the select gate line GSL of the select gate transistor on the source side (source line side) of the memory cell is set to about 17V. At this time, the FN tunnel current flows between the control gate and source region of the memory cell, and the data is erased.

Figure 39:
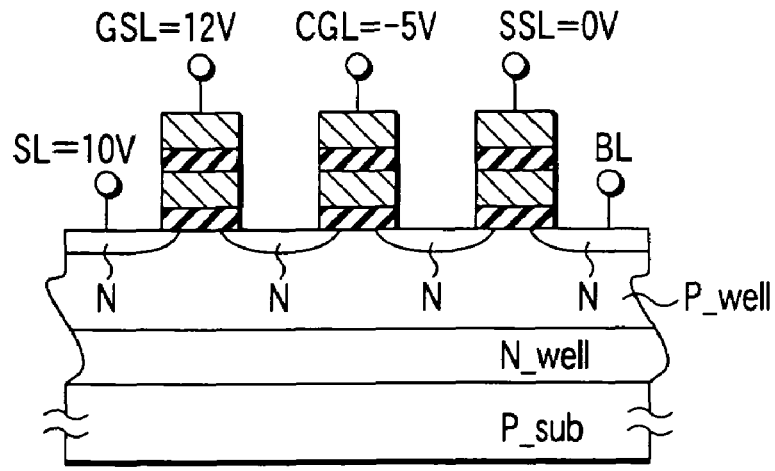
FIG. 39 is a diagram showing the example of the erase system using the FN tunnel current.

Moreover, for example, as shown in FIG. 39 (positive/negative bias is used), at the erase time, with respect to the selected memory cell, the potential of the control gate line CGL is set to about −5V, and the potential of the source line SL is set to about 10V. The potential of the select gate line GSL of the select gate transistor on the source side (source line side) of the memory cell is set to about 12V. At this time, the FN tunnel current flows between the control gate and source region of the memory cell, and the data is erased.

When this erase system is used, the byte renewal in the real meaning is possible in which the write and erase are performed with respect to only the memory cell as the object of the data renewal.

It is to be noted that at the erase time, for the concrete potential relation at the write time and read time, Tables 5 to 15 can be applied.

Additionally, in these tables, "selected/non-selected BL" needs to be changed to "selected/non-selected SL", "selected/non-selected SSL" needs to be changed to "selected/non-selected GSL", "selected/non-selected GSL" needs to be changed to "selected/non-selected SSL", and "source line SL" needs to be changed to "bit line BL".

(8) APPLIED EXAMPLES

Next, an example of a embedded memory chip and system associated with 2Tr. NAND and 3Tr. NAND according to the example of the present invention will be described.

Here, the 2Tr. NAND is a memory in which one memory cell and one select gate transistor constitute the memory cell unit and which includes the characteristics of the NOR type flash memory such as high-speed access. The 3Tr. NAND is a memory in which one memory cell and two select gate transistors holding the cell between them constitute the memory cell unit.

The memory cells and select gate transistors of the 2Tr./3Tr. NANDs include the same structures as those of the memory cell and select gate transistor of the NAND type flash memory, and for the write/erase principle, these three are the same. That is, since the 2Tr./3Tr. NANDs can be formed by the same process as that of the NAND type flash memory, these can easily be embedded in one chip.

Moreover, in recent years, a large number of embedded memory chips in which the logic and memory are embedded in one chip have been proposed. That is, according to the example of the present invention, the embedded memory chip can easily be realized in which at least two of the NAND type flash memory, 2Tr. NAND, 3Tr. NAND, and logic circuit are embedded in one chip.

① 2Tr. NAND

First the 2Tr. NAND will briefly be described.

A conventional NOR type flash memory is of a 1Tr. type constituted by only one transistor (memory cell), and the threshold value distributions of "0" and "1" have to be both positive. The write is performed by the hot electron injection in which excess erase problem is generated, and therefore there are disadvantages that the power consumption increases and a large number of bits cannot simultaneously be written.

To solve the problem, in the example of the present invention, there is proposed the cell unit of 2Tr. type constituted of one memory cell, and one select gate transistor connected between the memory cell and source line.

The cell unit has the characteristics of the NOR type flash memory, and the manufacturing process and write/erase principle are the same as those of the NAND type flash memory. That is, it is assumed that the cell unit includes one memory cell of the NAND cell unit and further the select gate transistor on the drain side is omitted.

Moreover, in the 2Tr. NAND, the data is written/erased with respect to the memory cell by the FN tunnel current. For example, the threshold value distribution of the erased state ("1" state) can be negative.

Therefore, as compared with the NOR type flash memory, the 2Tr. NAND has characteristics that the power consumption at the write time can be reduced, a large number of bits can simultaneously be written, there is not any excess erase problem, and the memory can be formed by the same process as that of the NAND type flash memory.

It is to be noted that as compared with the NAND type flash memory or the 3Tr. NAND, in the 2Tr. NAND, the select gate transistor does not exist on the drain side (bit line side). Therefore, disturb at the write time of the non-selected memory cell in the non-selected block (non-selected word line) raises a problem.

That is, in the 2Tr. NAND, since a write prohibition potential cannot be generated by the capacity coupling, a relatively high intermediate potential, for example, a potential of ½ of a write potential Vpp has to be supplied as the write prohibition potential to the bit line. Therefore, when the same block (word line) is selected many times, the electric field in a direction for extracting the charge in the floating gate electrode is repeatedly exerted in the memory cell in the non-selected block.

Therefore, the 2Tr. NAND is used as the embedded memory with the NAND type flash memory or the 3Tr. NAND, and the memory is used mainly as ROM exclusive for read. This is very effective.

② Examples of Embedded Memory Chip

FIRST EXAMPLE

FIG. 40 shows a first example of the embedded memory chip according to the embodiment of the present invention.

In a chip A, the NAND region, 3Tr. region, 2Tr. region, and logic region are disposed. In the NAND region, the NAND type flash memory is disposed. In the 3Tr. region, the 3Tr. NAND is disposed. In the 2Tr. region, the 2Tr. NAND is disposed.

The sense amplifier circuit (page buffer) disposed around the NAND region has, for example, not only a function of a write/read circuit but also a function of giving the erase potential to the selected bit line.

The sense amplifier circuit disposed around the 3Tr. region has a function of the read circuit. A data latch circuit has, for example, not only a function of a write circuit but also the function of giving the erase potential to the selected bit line.

The sense amplifier circuit disposed around the 2Tr. region has a function of a read circuit. The data latch circuit has, for example, not only the function of the write circuit but also the function of giving the erase potential to the selected bit line.

To select the control gate line (word line), driving circuits may separately be disposed in the NAND region, 3Tr. region, and 2Tr. region, or at least two driving circuits in these regions may be united into one to be common.

The NAND type flash memory in the NAND region can be used, for example, as a main memory for storing main data such as a dynamic image, and the 3Tr. NAND in the 3Tr. region can be used, for example, as a cache memory for the high-speed access.

The 2Tr. NAND in the 2Tr. region can be used, for example, as the ROM for storing the data for operation control. In the logic region, CPU, error correction circuit (ECC), and the like are disposed. When an RF circuit (resistance element, capacity element, and the like) can be formed in the chip A, such elements may also be formed.

Figure 41:
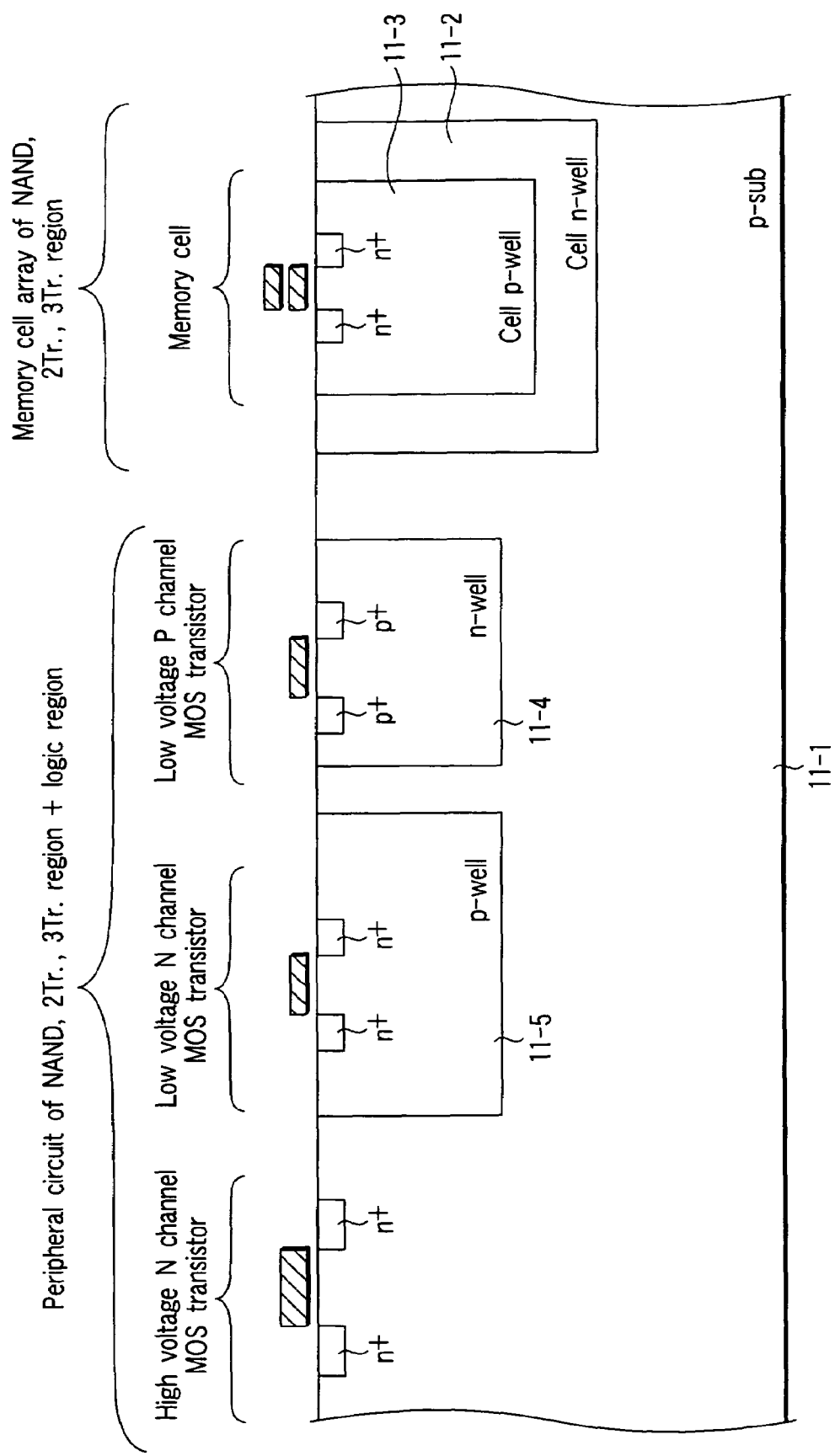
FIG. 41 is a diagram showing a structure example of a transistor in the embedded memory chip.

FIG. 41 shows a structure example of the transistor in the embedded memory chip.

In a p-type silicon substrate (p-sub) 11-1, a so-called double well region constituted of an n-type well region (Cell n-well) 11-2 and p-type well region (Cell p-well) 11-3, an n-type well region (n-well) 11-4, and a p-type well region (p-well) are formed.

The double well region is disposed in the memory cell array region, that is, in the NAND region, 3Tr. region, and 2Tr. region. The n-type well region 11-4 and p-type well region 11-5 are formed in the peripheral circuit region in the NAND region, 3Tr. region, and 2Tr. region, and in the logic region.

The memory cell is constituted of n channel MOS transistors, and is disposed in the p-type well region 11-3. The n-type well region 11-2 and p-type well region 11-3 are set to the same potential.

A high-voltage n channel MOS transistor to which a voltage higher than the power potential Vcc is applied is formed in the p-type silicon substrate (p-sub) 11-1. A low-voltage p channel MOS transistor to which the power potential Vcc is applied is formed in the n-type well region (n-well) 11-4. A low-voltage n channel MOS transistor to which the power potential Vcc is applied is formed in the p-type well region (p-well) 11-5.

The transistors constituting the memory cell array in the NAND region, 3Tr. region, and 2Tr. region, and the transistors in the peripheral circuit and logic circuit can simultaneously be formed by the common process.

FIG. 42 shows the structure example of the memory cell arrays of the NAND region, 3Tr. region, and 2Tr. region.

The memory cell arrays of the NAND region, 3Tr. region, and 2Tr. region are different from one another in the constitution of the cell unit, and are the same in the structure of the memory cell and select gate transistor. Therefore, the memory cell arrays in these regions can simultaneously be formed by the same process.

In the p-type silicon substrate 11-1, the double well region constituted of the n-type well region 11-2 and p-type well region 11-3 is formed.

In the NAND region, four memory cells M0, M1, M2, M3 connected in series are disposed in the p-type well region 11-3. The four memory cells M0, M1, M2, M3 are each constituted of the N channel MOS transistor, and include a stacked gate structure including floating gate electrodes FG and control gate electrodes WL0-0, WL1-0, WL2-0, WL3-0.

One end of a NAND array including the memory cells M0, M1, M2, M3 connected in series is cell transistor a select gate transistor S1, and the other end is connected to a select gate transistor S2. The select gate transistors S1, S2 are constituted of the N channel MOS transistors and include select gate lines SGS-0, SGD-0 including the structure similar to that of the memory cells M0, M1, M2, M3, that is, the stacked gate structure.

One end of the NAND cell unit, that is, a diffusion layer (drain diffusion layer) 14 of the select gate transistor S1 is connected to a first metal wiring layer M0 via a contact plug CB1. A first metal wiring layer M0 is connected to a second metal wiring layer M1 which is the bit line BL via a via plug V1. The bit line BL is connected to a data circuit.

The other end of the NAND cell unit, that is, a diffusion layer (source diffusion layer) 15 of the select gate transistor S2 is connected to the first metal wiring layer M0 which is a source line C-source via a contact plug CB2. The source line C-source is connected to a source potential control circuit.

The n-type well region (Cell n-well) 11-2 is connected to a C-p-well potential setting line 18 via an n-type diffusion layer 16, and the p-type well region Cell p-well) 11-3 is connected to the C-p-well potential setting line 18 via a p-type diffusion layer 17. That is, the n-type well region 11-2 and p-type well region 11-3 are set to the same potential. The C-p-well potential setting line 18 is connected to a well potential control circuit.

The floating gate electrode FG, control gate electrodes WL0-0, WL1-0, WL2-0, WL3-0, and select gate lines SGS-0, SGD-0 are constituted, for example, of conductive polysilicon containing impurities. The first and second metal wiring layer M0, M1 are constituted, for example, of aluminum, copper, and an alloy of these.

In the 3Tr. NAND region, one memory cell M0 is disposed in the p-type well region 11-3. The memory cell M0 is constituted of the N channel MOS transistor, and includes the stacked gate structure including the floating gate electrode FG and control gate electrode WL0.

One end of the memory cell M0 is connected to the select gate transistor S1 and the other end of the cell is connected to the select gate transistor S2. The select gate transistors S1, S2 are constituted of the N channel MOS transistors, and include the structure approximate to the memory cell M0, that is, the select gate lines SGS, SGD of the stacked gate structure.

One end of the 3Tr. NAND cell unit, that is, the diffusion layer (drain diffusion layer) 14 of the select gate transistor S1 is connected to the first metal wiring layer M0 via the contact plug CB1. The first metal wiring layer M0 is connected to the second metal wiring layer M1 which is the bit line BL via the via plug V1. The bit line BL is connected to the data circuit.

The other end of the 3Tr. NAND cell unit, that is, the diffusion layer (source diffusion layer) 15 of the select gate transistor S2 is connected to the first metal wiring layer M0 which is the source line C-source via the contact plug CB2. The source line C-source is connected to the source potential control circuit.

The n-type well region (Cell n-well) 11-2 and p-type well region (Cell p-well) 11-3 are connected to the well potential control circuit via the potential setting line in the same manner as in the NAND region.

The floating gate electrode FG, control gate electrode WL0, and select gate lines SGS, SGD are constituted, for example, of conductive polysilicon including the impurities. The first and second metal wiring layer M0, M1 are constituted, for example, of aluminum, copper, and the alloy of these.

In the 2Tr. NAND region, one memory cell M0 is disposed in the p-type well region 11-3. The memory cell M0 is constituted of the N channel MOS transistor, and includes the stacked gate structure including the floating gate electrode FG and control gate electrode WL0.

One end of the memory cell M0 is connected to the select gate transistor S2. The select gate transistor S2 is constituted of the N channel MOS transistor, and includes the structure approximate to the memory cell M0, that is, the select gate line SGD of the stacked gate structure.

One end of the 2Tr. NAND cell unit, that is, the diffusion layer (drain diffusion layer) 14 of the memory cell M0 is connected to the first metal wiring layer M0 via the contact plug CB1. The first metal wiring layer M0 is connected to the second metal wiring layer M1 which is the bit line BL via the via plug V1. The bit line BL is connected to the data circuit.

The other end of the 2Tr. NAND cell unit, that is, the diffusion layer (source diffusion layer) 15 of the select gate transistor S2 is connected to the first metal wiring layer M0 which is the source line C-source via the contact plug CB2. The source line C-source is connected to the source potential control circuit.

The n-type well region (Cell n-well) 11-2 and p-type well region (Cell p-well) 11-3 are connected to the well potential control circuit via the potential setting line in the same manner as in the NAND region.

The floating gate electrode FG, control gate electrode WL0, and select gate lines SGD are constituted, for example, of conductive polysilicon including the impurities. The first and second metal wiring layer M0, M1 are constituted, for example, of aluminum, copper, and the alloy of these.

It is to be noted that only one double well region may also be disposed in common in the NAND region, 3Tr. region, and 2Tr. region, or one double well region may also be disposed in each of these three regions. In each region, the double well region may also be divided into a plurality of regions.

In the embedded memory chip, as the data renewal system in the NAND region, 3Tr. region, and 2Tr. region, for example, the renewal system by the byte unit shown in FIG. 21 is used in common.

That is, in the NAND region, 3Tr. region, and 2Tr. region, the same data renewal system is applied: a. page read (reverse read)→b. byte overwrite→c. byte erase→d. page write. Additionally, steps b and c may be reversed or may be simultaneous.

Moreover, also for a data write/erase method, for example, the FN tunnel phenomenon is used. In this manner, the same data write/erase method is used in the NAND region, 3Tr. region, and 2Tr. region.

For the data renewal system, naturally, instead of the system of FIG. 21, the data renewal system shown in FIG. 26, 27, or 36 may also be used.

SECOND EXAMPLE

Figure 43:
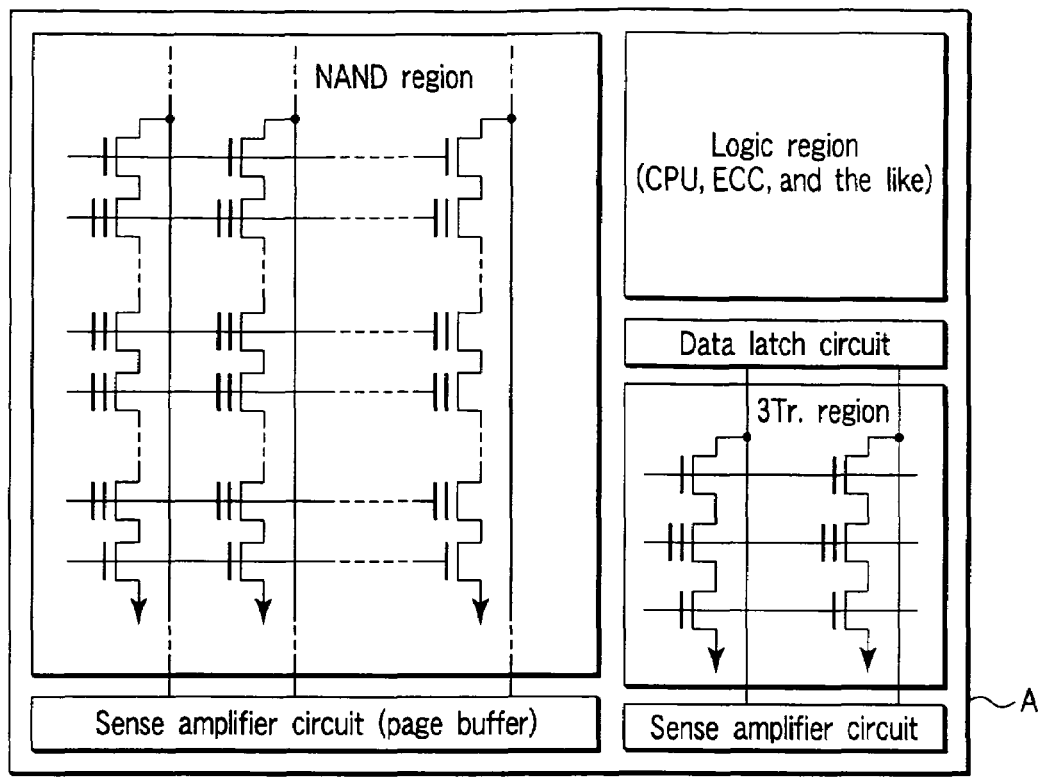
FIG. 43 is a diagram showing an example of the embedded memory chip according to the embodiment of the present invention.

FIG. 43 shows a second example of the embedded memory chip according to the embodiment of the present invention.

In the chip A, the NAND region, 3Tr. region, 2Tr. region, and logic region are disposed. In the NAND region, the NAND type flash memory is disposed. In the 3Tr. region, the 3Tr. NAND is disposed.

The sense amplifier circuit (page buffer) disposed around the NAND region has, for example, not only the function of the write/read circuit but also the function of giving the erase potential to the selected bit line.

The sense amplifier circuit disposed around the 3Tr. region has the function of the read circuit. The data latch circuit has, for example, not only the function of the write circuit but also the function of giving the erase potential to the selected bit line.

To select the control gate line (word line), the driving circuits may separately be disposed in the NAND region, and 3Tr. region, or at least two driving circuits in these regions may be united into one to be common.

The NAND type flash memory in the NAND region can be used, for example, as the main memory for storing the main data such as the dynamic image, and the 3Tr. NAND in the 3Tr. region can be used, for example, as the cache memory for the high-speed access. In the logic region, the CPU, error correction circuit (ECC), and the like are disposed. When the RF circuit (resistance element, capacity element, and the like) can be formed in the chip A, such elements may also be formed.

It is to be noted that the structures of the transistor formed in the NAND region, 3Tr. region, peripheral circuit region, and logic region are shown in FIGS. 41 and 42.

In the embedded memory chip, as the data renewal system in the NAND region and 3Tr. region, for example, the renewal system by the byte unit shown in FIG. 21 is used in common.

That is, in the NAND region and 3Tr. region, the same data renewal system is applied: a. page read (reverse read)→b. byte overwrite→c. byte erase→d. page write. Additionally, the steps b and c may be reversed or may be simultaneous.

Moreover, also for the data write/erase method, for example, the FN tunnel phenomenon is used. In this manner, the same data write/erase method is used in the NAND region and 3Tr. region.

For the data renewal system, naturally, instead of the system of FIG. 21, the data renewal system shown in FIG. 26, 27, or 36 may also be used.

THIRD EXAMPLE

Figure 44:
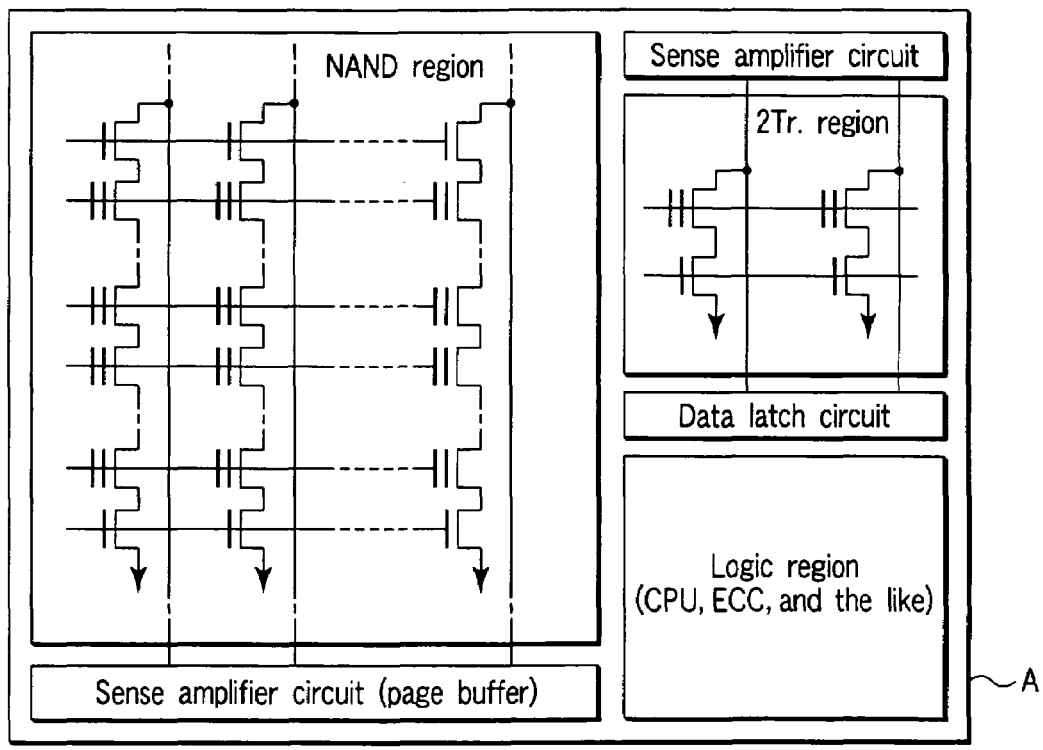
FIG. 44 is a diagram showing the example of the embedded memory chip according to the embodiment of the present invention.

FIG. 44 shows a third example of the embedded memory chip according to the embodiment of the present invention.

In the chip A, the NAND region, 2Tr. region, and logic region are disposed. In the NAND region, the NAND type flash memory is disposed. In the 2Tr. region, the 2Tr. NAND is disposed.

The sense amplifier circuit (page buffer) disposed around the NAND region has, for example, not only the function of the write/read circuit but also the function of giving the erase potential to the selected bit line.

The sense amplifier circuit disposed around the 2Tr. region has the function of the read circuit. The data latch circuit has, for example, not only the function of the write circuit but also the function of giving the erase potential to the selected bit line.

To select the control gate line (word line), the driving circuits may separately be disposed in the NAND region and 2Tr. region, or at least two driving circuits in these regions may be united into one to be common.

The NAND type flash memory in the NAND region can be used, for example, as the main memory for storing the main data such as the dynamic image, and the 2Tr. NAND in the 2Tr. region can be used, for example, as ROM for storing the data for the operation control. In the logic region, the CPU, error correction circuit (ECC), and the like are disposed. When the RF circuit (resistance element, capacity element, and the like) can be formed in the chip A, such elements may also be formed.

It is to be noted that the structures of the transistors formed in the NAND region, 2Tr. region, peripheral circuit region, and logic region are shown in FIGS. 41 and 42.

In the embedded memory chip, as the data renewal system in the NAND region and 2Tr. region, for example, the renewal system by the byte unit shown in FIG. 21 is used in common.

That is, in the NAND region and 2Tr. region, the same data renewal system is applied: a. page read (reverse read)→b. byte overwrite→c. byte erase→d. page write. Additionally, the steps b and c may be reversed or may be simultaneous.

Moreover, also for the data write/erase method, for example, the FN tunnel phenomenon is used. In this manner, the same data write/erase method is used in the NAND region and 2Tr. region.

For the data renewal system, naturally, instead of the system of FIG. 21, the data renewal system shown in FIG. 26, 27, or 36 may also be used.

FOURTH TO SIXTH EXAMPLES

An example in which the NAND region does not exist in the chip will be described hereinafter.

Figure 45:
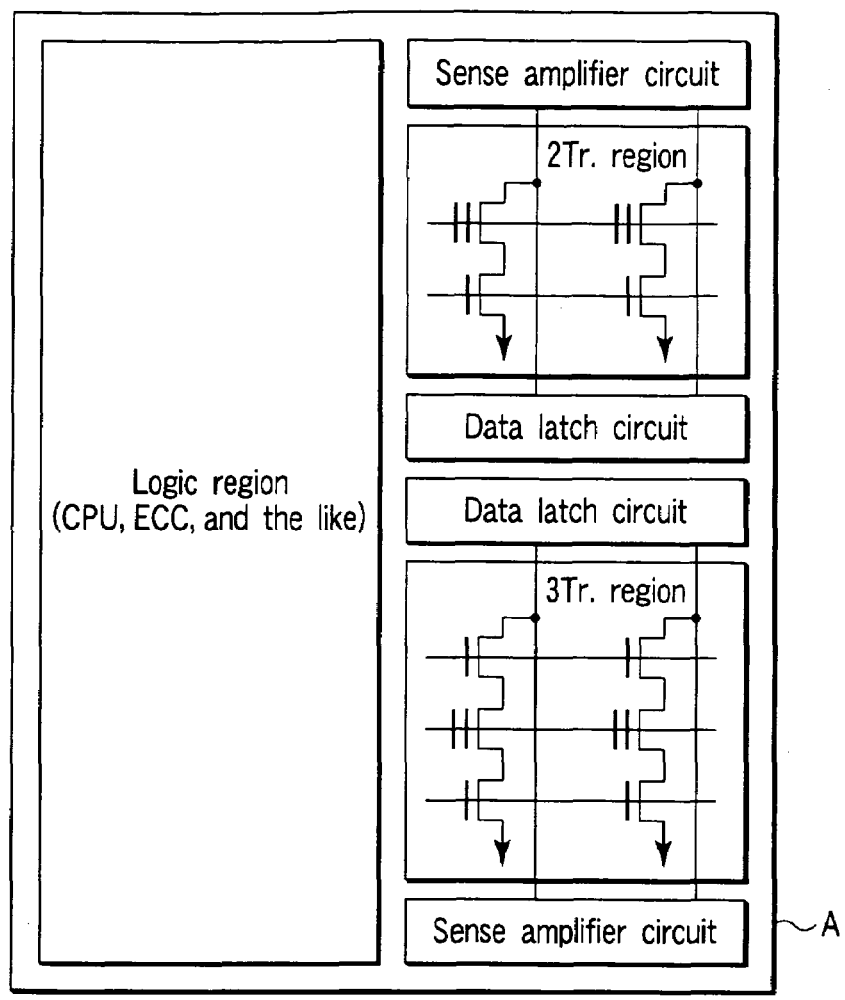
FIG. 45 is a diagram showing the example of the embedded memory chip according to the embodiment of the present invention.

FIG. 45 shows a fourth example of the embedded memory chip according to the embodiment of the present invention.

The fourth example is different from the first example (FIG. 40) only in that the NAND region does not exist in the chip A, and the other constitution is the same as that of the first example. In the present example, in the chip A, the logic region, 3Tr. region, and 2Tr. region are disposed.

Figure 46:
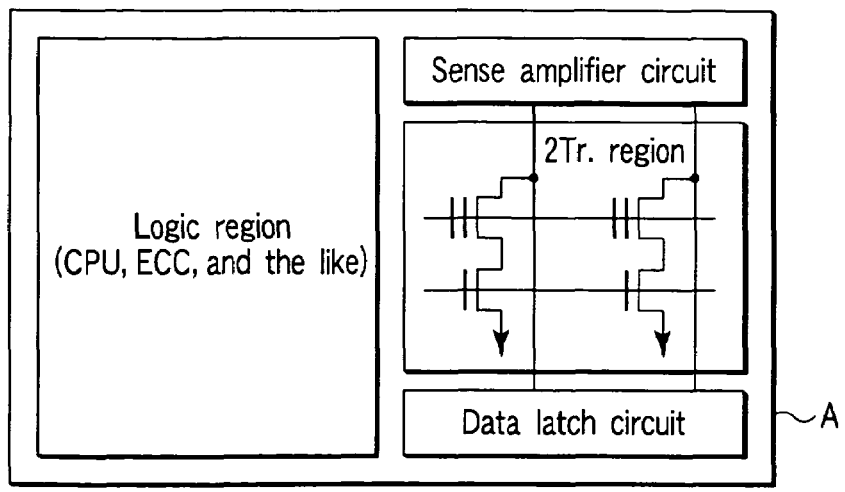
FIG. 46 is a diagram showing the example of the embedded memory chip according to the embodiment of the present invention.

FIG. 46 shows a fifth example of the embedded memory chip according to the embodiment of the present invention.

The fifth example is different from the first example (FIG. 40) only in that the NAND region and 3Tr. region do not exist in the chip A, and the other constitution is the same as that of the first example. In the present example, in the chip A, the logic region and 2Tr. region are disposed.

Figure 47:
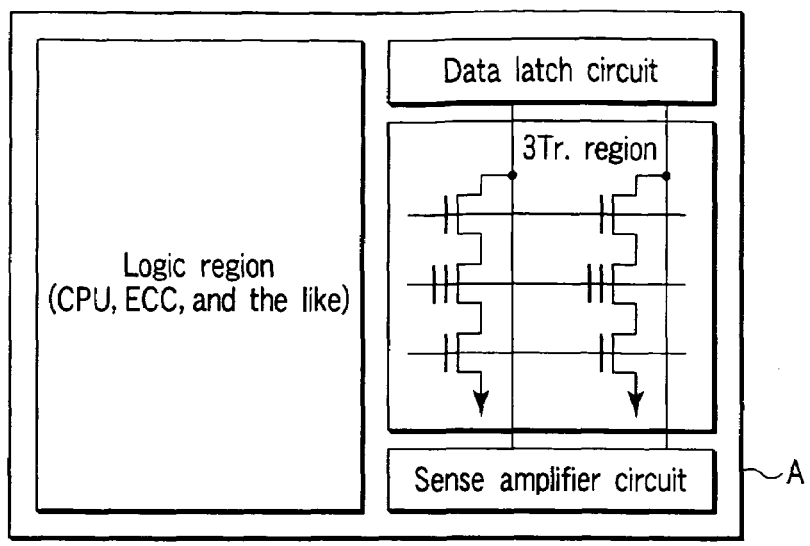
FIG. 47 is a diagram showing the example of the embedded memory chip according to the embodiment of the present invention.

FIG. 47 shows a sixth example of the embedded memory chip according to the embodiment of the present invention.

The sixth example is different from the first example (FIG. 40) only in that the NAND region and 2Tr. region do not exist in the chip A, and the other constitution is the same as that of the first example. In the present example, in the chip A, the logic region and 3Tr. region are disposed.

It is to be noted that the fourth to sixth examples can be said to be the same as the first example in the device structure and data renewal system.

SEVENTH TO NINTH EXAMPLES

An example in which the logic region does not exist in the chip will be described hereinafter.

Figure 48:
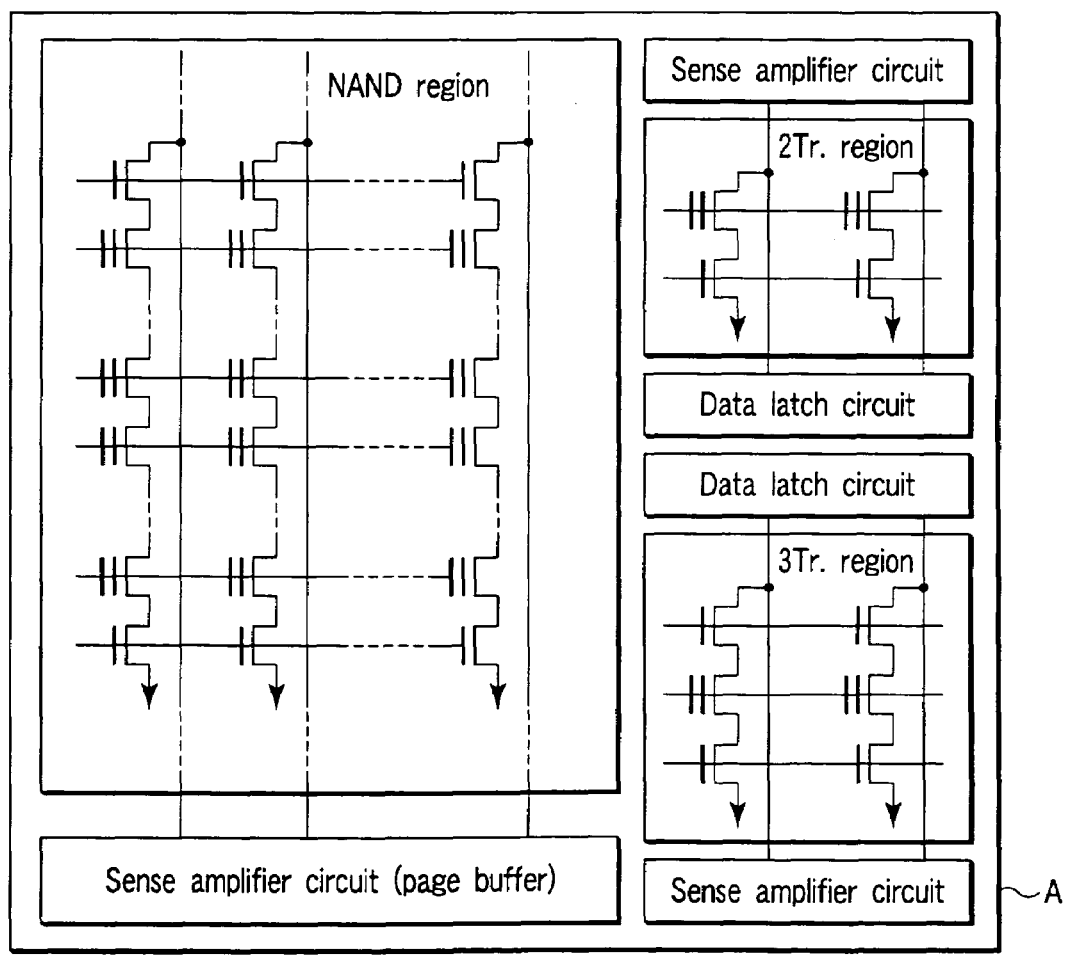
FIG. 48 is a diagram showing the example of the embedded memory chip according to the embodiment of the present invention.

FIG. 48 shows a seventh example of the embedded memory chip according to the embodiment of the present invention.

The seventh example is different from the first example (FIG. 40) only in that the logic region does not exist in the chip A, and the other constitution is the same as that of the first example. In the present example, in the chip A, the NAND region, 3Tr. region, and 2Tr. region are disposed.

Figure 49:
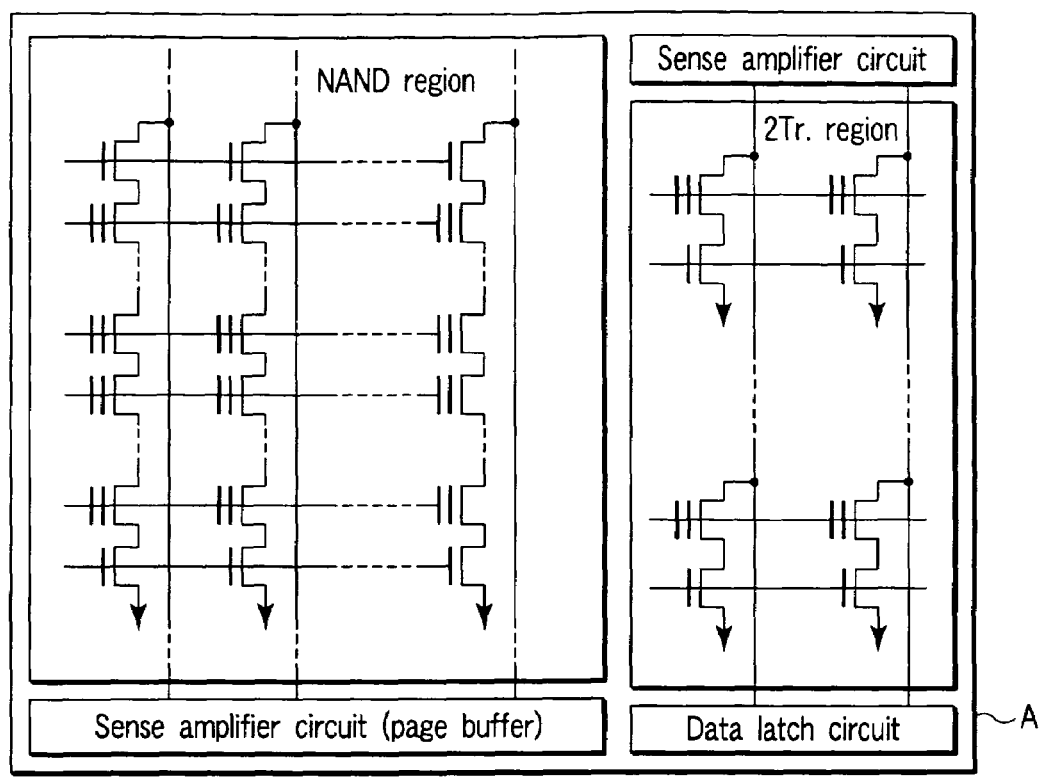
FIG. 49 is a diagram showing the example of the embedded memory chip according to the embodiment of the present invention.

FIG. 49 shows an eighth example of the embedded memory chip according to the embodiment of the present invention.

The eighth example is different from the first example (FIG. 40) only in that the logic region and 3Tr. region do not exist in the chip A, and the other constitution is the same as that of the first example. In the present example, in the chip A, the NAND region and 2Tr. region are disposed.

Figure 50:
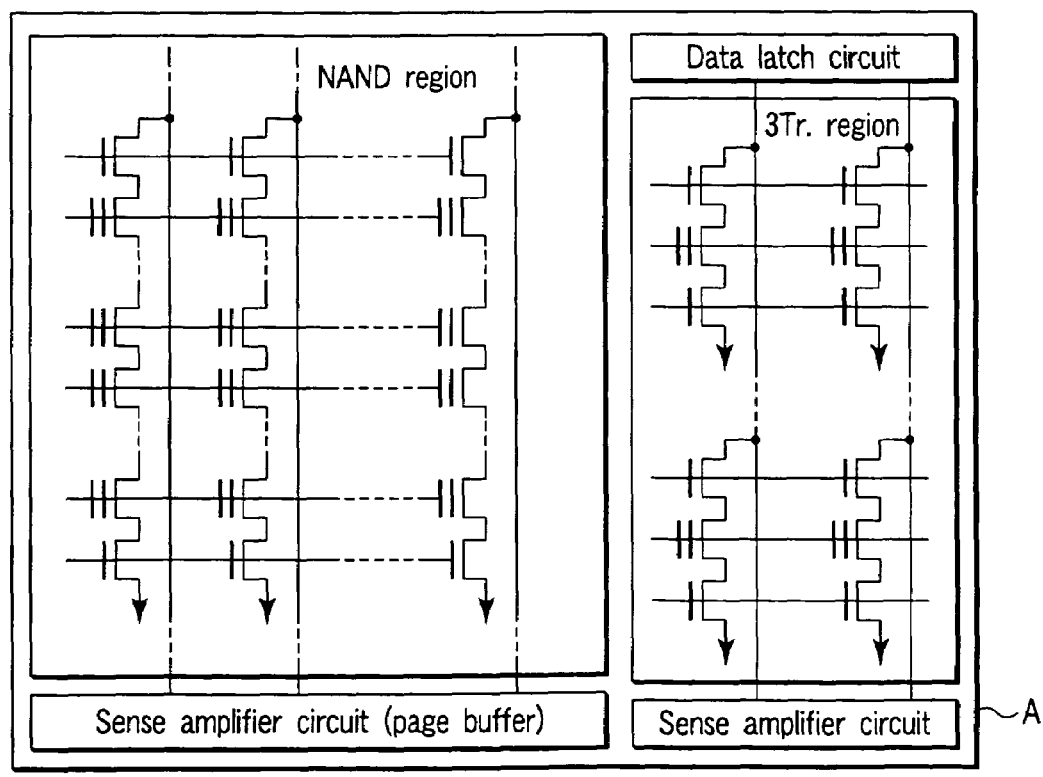
FIG. 50 is a diagram showing the example of the embedded memory chip according to the embodiment of the present invention.

FIG. 50 shows a ninth example of the embedded memory chip according to the embodiment of the present invention.

The ninth example is different from the first example (FIG. 40) only in that the logic region and 2Tr. region do not exist in the chip A, and the other constitution is the same as that of the first example. In the present example, in the chip A, the NAND region and 3Tr. region are disposed.

It is to be noted that the seventh to ninth examples can be said to be the same as the first example in the device structure and data renewal system.

TENTH TO FOURTEENTH EXAMPLES

Examples will be described in which two or more of the NAND region, 2Tr. region, and 3Tr. region are disposed in the chip and at least two of these two or more regions disposed in the chip share the bit line.

FIG. 51 shows a tenth example of the embedded memory chip according to the embodiment of the present invention.

The tenth example is a modification example of the first example (FIG. 40). The tenth example is different from the first example in that the three memory regions disposed in the chip A, that is, the NAND region, 3Tr. region, and 2Tr. region share the bit line. In the present example, the data latch circuit is used to write the data and the sense amplifier circuit is used to read the data in each of three memory regions.

Figure 52:
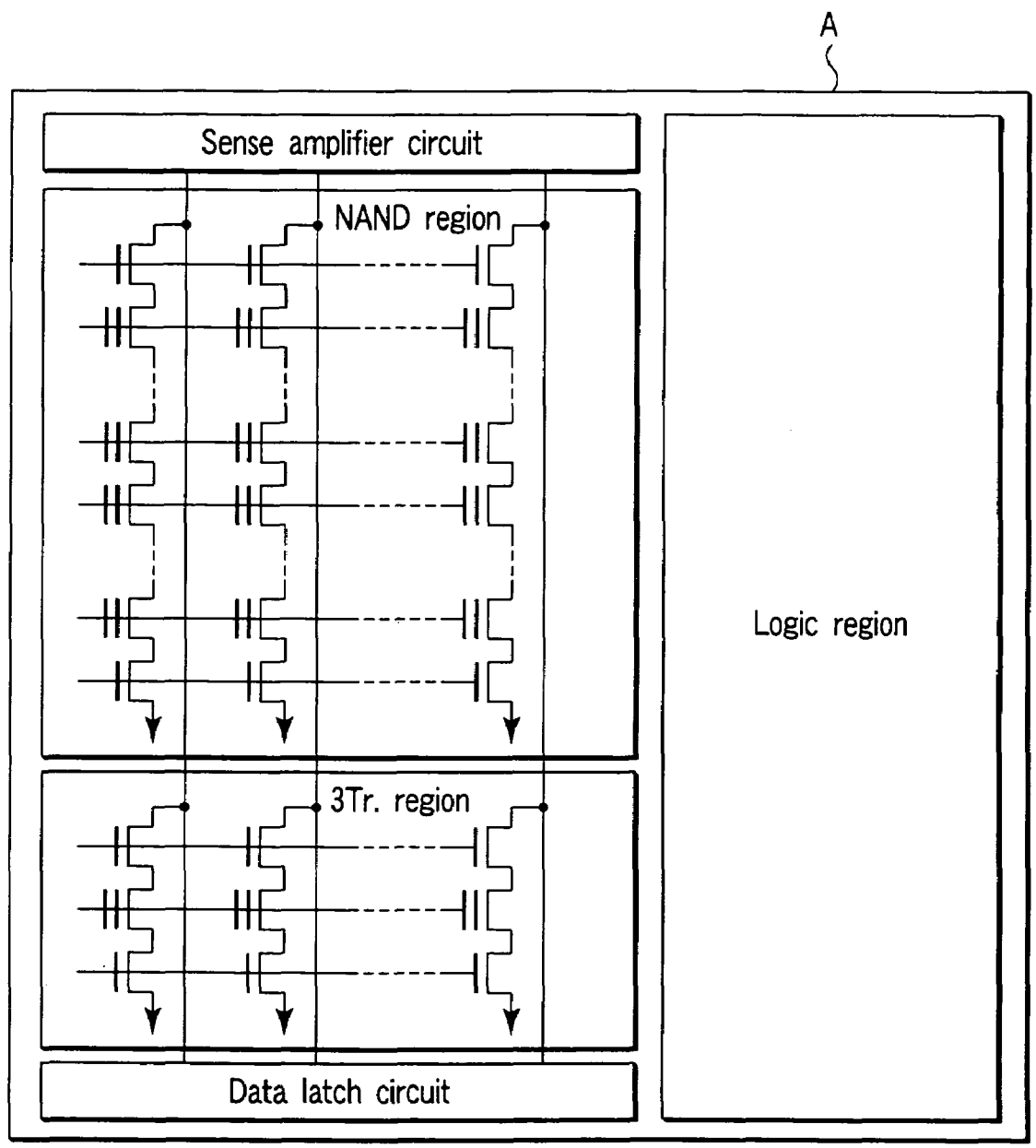
FIG. 52 is a diagram showing the example of the embedded memory chip according to the embodiment of the present invention.

FIG. 52 shows an eleventh example of the embedded memory chip according to the embodiment of the present invention.

The eleventh example is a modification example of the second example (FIG. 43). The eleventh example is different from the second example in that two memory regions disposed in the chip A, that is, the NAND region and 3Tr. region share the bit line. In the present example, the data latch circuit is used to write the data and the sense amplifier circuit is used to read the data in each of two memory regions.

Figure 53:
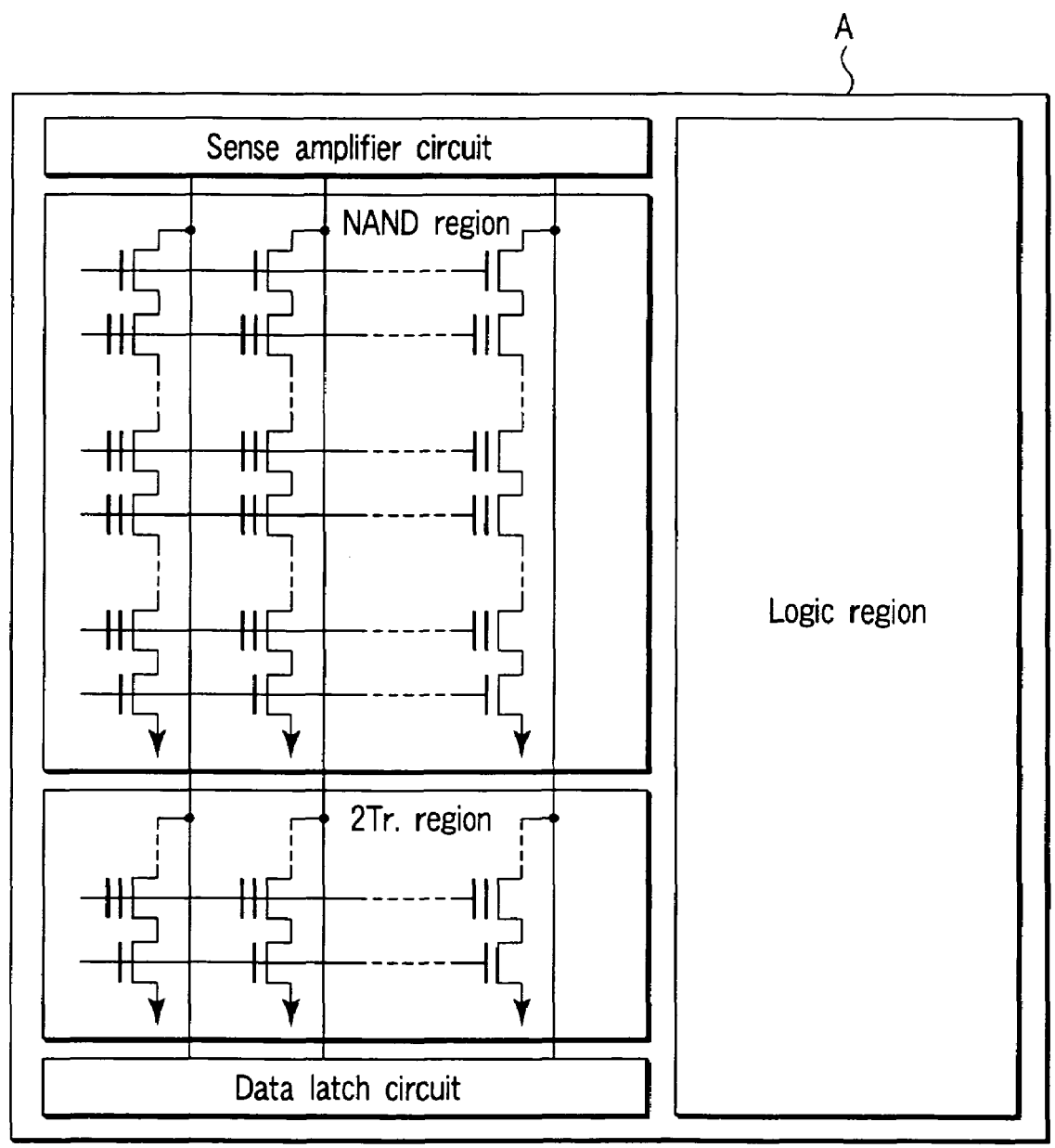
FIG. 53 is a diagram showing the example of the embedded memory chip according to the embodiment of the present invention.

FIG. 53 shows a twelfth example of the embedded memory chip according to the embodiment of the present invention.

The twelfth example is a modification example of the third example (FIG. 44). The twelfth example is different from the third example in that two memory regions disposed in the chip A, that is, the NAND region and 2Tr. region share the bit line. In the present example, the data latch circuit is used to write the data and the sense amplifier circuit is used to read the data in each of two memory regions.

Figure 54:
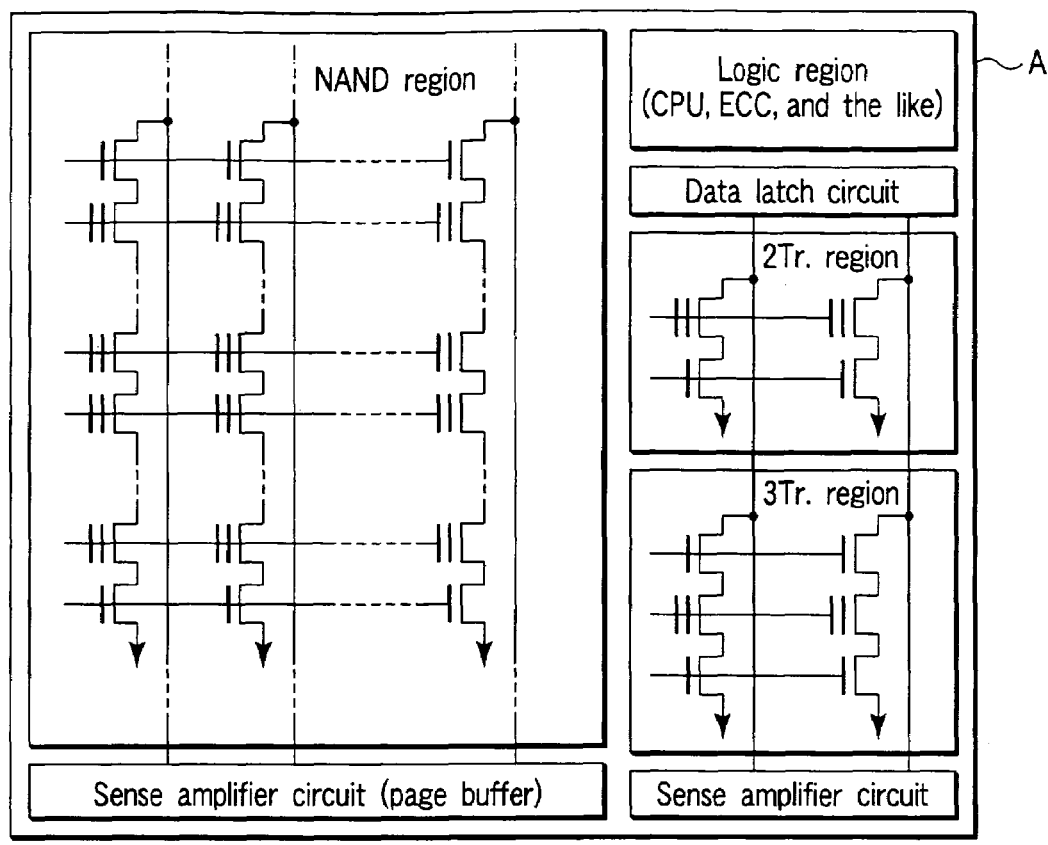
FIG. 54 is a diagram showing the example of the embedded memory chip according to the embodiment of the present invention.

FIG. 54 shows a thirteenth example of the embedded memory chip according to the embodiment of the present invention.

The thirteenth example is a modification example of the first example (FIG. 40). The thirteenth example is different from the first example in that two of three memory regions disposed in the chip A including the NAND region, 3Tr. region, and 2Tr. region, that is, the 3Tr. region and 2Tr. region share the bit line. In the present example, the data latch circuit is used to write the data and the sense amplifier circuit is used to read the data in each of the 3Tr. and 2Tr. regions.

Figure 55:
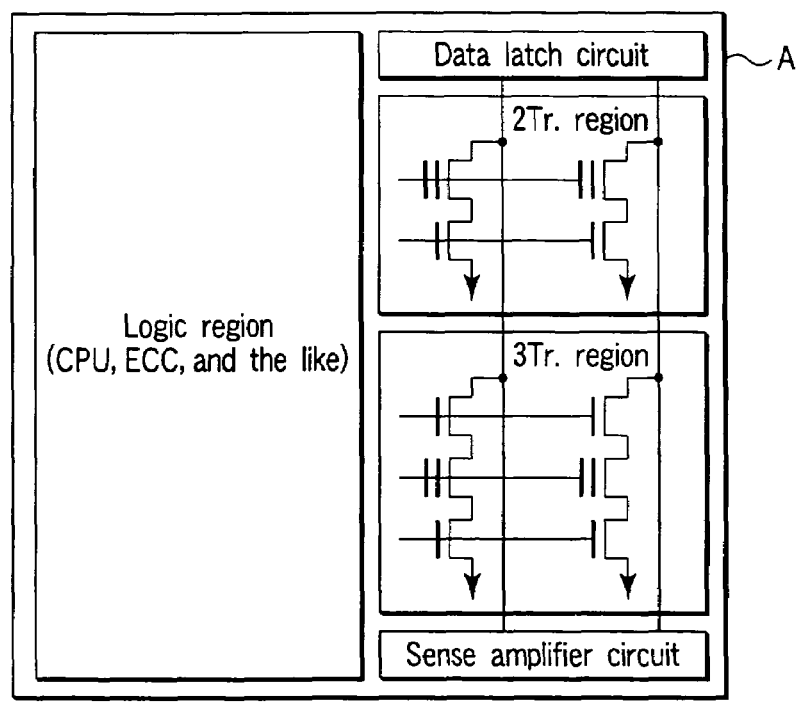
FIG. 55 is a diagram showing the example of the embedded memory chip according to the embodiment of the present invention.

FIG. 55 shows a fourteenth example of the embedded memory chip according to the embodiment of the present invention.

The fourteenth example is a modification example of the fourth example (FIG. 45). The fourteenth example is different from the fourth example in that two memory regions disposed in the chip A, that is, the 3Tr. region and 2Tr. region share the bit line. In the present example, the data latch circuit is used to write the data and the sense amplifier circuit is used to read the data in each of two memory regions.

It is to be noted that in the tenth to fourteenth examples, concerning the device structure or the data renewal system, the same thing as that in the first example can. be said.

③ Concerning Memory Cell

FIG. 56 shows the memory cell of 1Tr. type and the threshold value distribution, and FIG. 57 shows the memory cell of 2Tr. type and the threshold value distribution.

In the memory cell of 1Tr. type, the memory cell is constituted of only one transistor. However, for example, the threshold value distributions of binary data ("0" and "1") are both positive. Therefore, when the threshold value of the memory cell in the erased state is negative by the so-called excess erase, and even when 0V is supplied to the non-selected control gate line at the read time, the non-selected memory cell in the excessively erased state is constantly in the on state, and erroneous read is therefore generated. The read potential supplied to the selected control gate line also has to be set to a high potential such as the power potential Vcc.

In the memory cell of 2Tr. type, the memory cell is constituted of two transistors, that is, one cell transistor and one select gate transistor. Therefore, for example, the threshold value distribution of one of the binary data, that is, "0" is positive, and the distribution of the other data, that is, "1" can be negative. The selection/non-selection of the memory cell can be controlled by turning on/off the select gate transistor. Therefore, a problem of erroneous read by the so-called excess erase is not generated. Moreover, the read potential supplied to the control gate line may be 0V.

Figure 59:
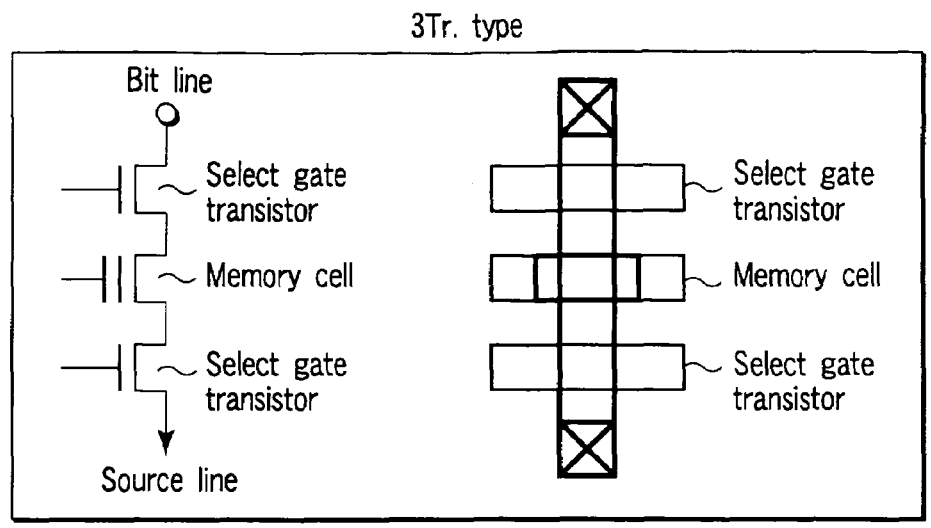
FIG. 59 is a diagram showing the memory cell of 3Tr. type.

As shown in FIGS. 58 and 59, the structure of the memory cell of the 2Tr. type according to the embodiment of the present invention is different only in the number of transistors, and the other structure is the same as that of the 3Tr. NAND. That is, the memory cell of the 2Tr. type can be formed in the NAND process in the same manner as in the 3Tr. NAND.

As compared with the 3Tr. NAND, the memory cell of the 2Tr. type has an advantage that the cell size is small, but has a problem of disturb at the write time, and is therefore used as a read-only ROM for storing the data for the operation control as described above. Moreover, as compared with the memory cell of the 2Tr. type, the 3Tr. NAND has a short read time and can obtain a satisfactory result concerning the program disturb, and is therefore used, for example, as the cache memory for the high-speed access as described above.

④ Other Examples

The following memory can also be embedded in the chip A of FIGS. 40, 43 to 55.

Figure 60:
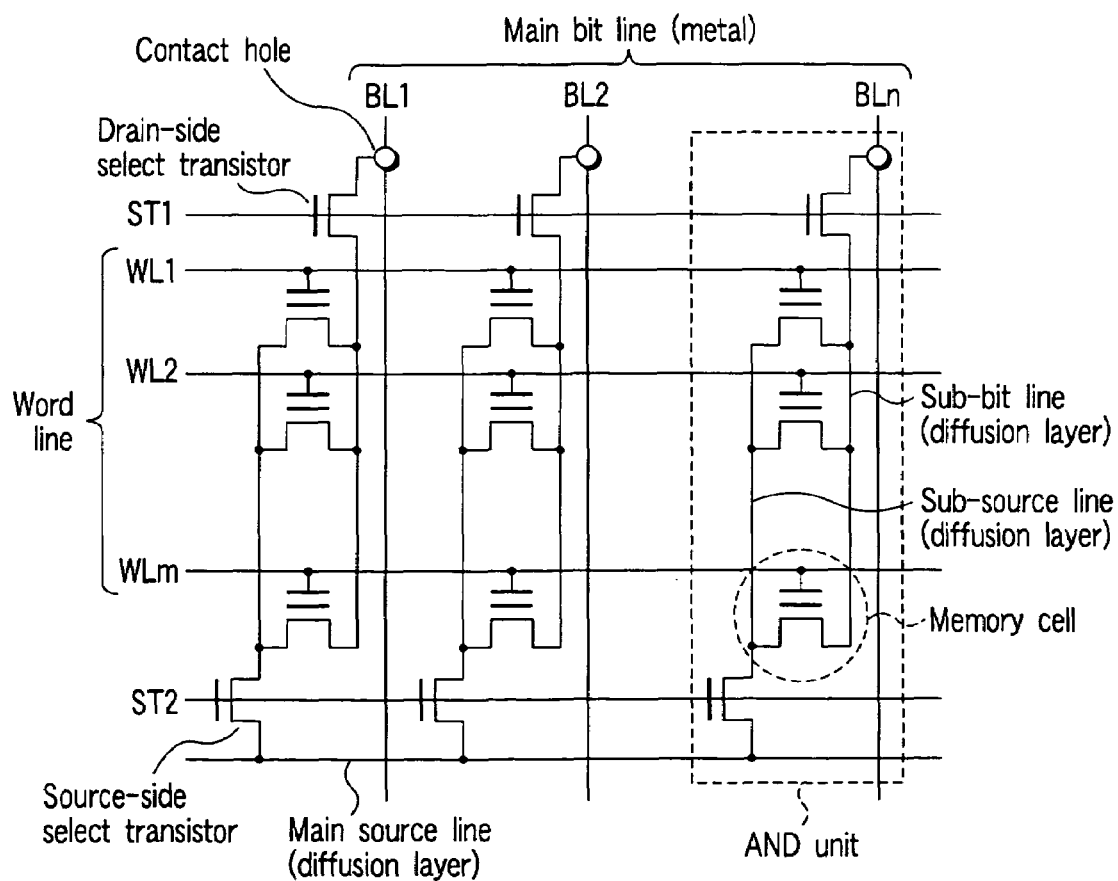
FIG. 60 is a diagram showing the memory cell array of an AND type flash memory.
Figure 63:
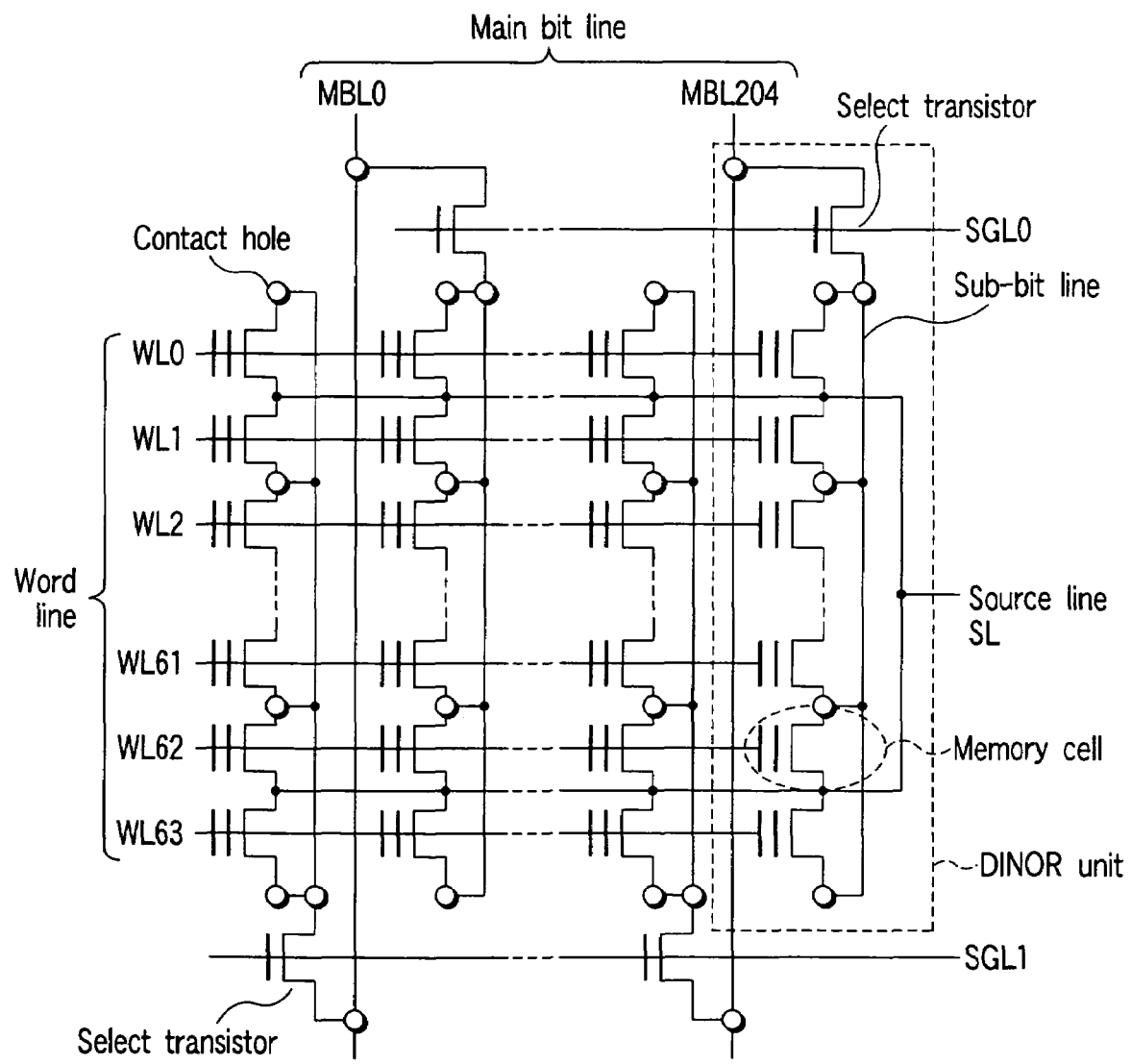
FIG. 63 is a diagram showing the memory cell array of a DINOR type flash memory.

The memory cell array shown in FIG. 60 is the memory cell array of an AND type flash memory. The memory cell array shown in FIG. 63 is the memory cell array of a DINOR type flash memory.

An AND unit of the AND type flash memory of FIG. 60 includes a plurality of memory cells connected in parallel between a sub-bit line and sub-source line. The sub-bit line is connected to a main bit line via a drain-side select gate transistor. The sub-source line is connected to a main source line via a source-side select gate transistor.

For example, with a 64-megabits AND type flash memory, one AND unit is constituted of 128 memory cells (m=128) and two select gate transistors.

The characteristics of the memory cell array lie in that the bit lines (data lines) and source lines are stratified. Each of the bit line and source line includes a main wiring and sub-wiring, and the sub-wiring includes a pseudo contactless structure formed by the diffusion layer.

The write/erase of the data with respect to the memory cell is performed by the Fowler-Nordheim (FN) tunnel current.

Figure 61:
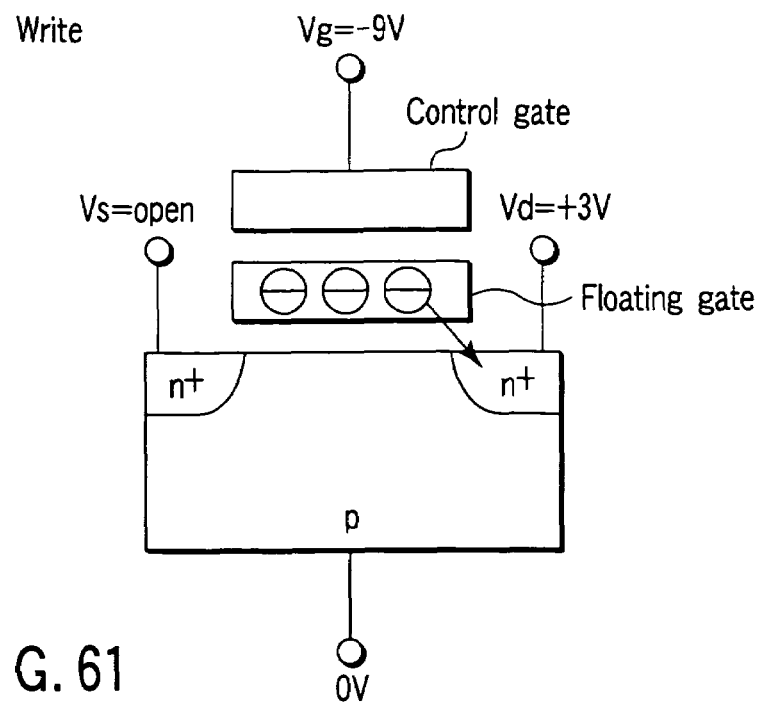
FIG. 61 is a diagram showing an example of a write operation.
Figure 62:
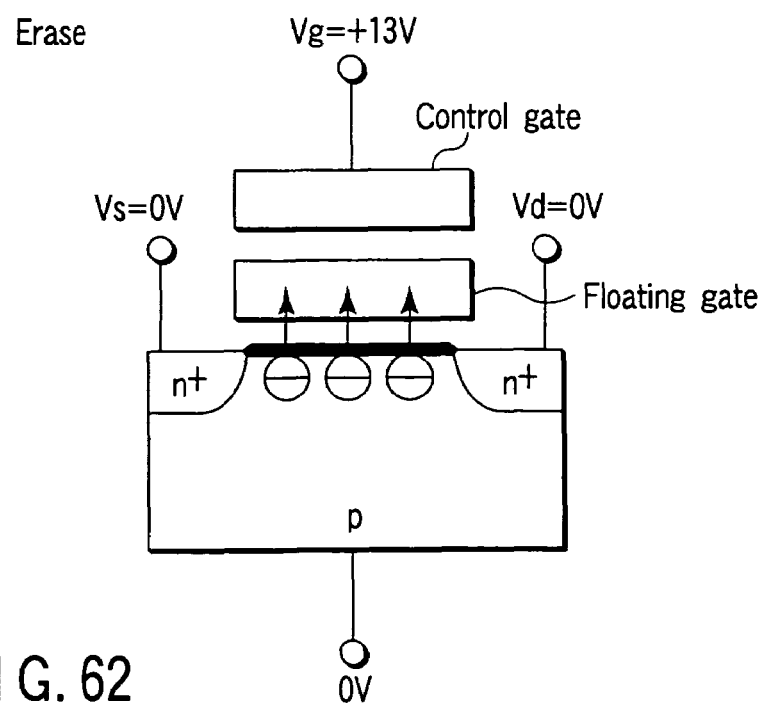
FIG. 62 is a diagram showing an example of an erase operation.

As shown in FIG. 61, the data is written by using the FN tunnel current to extract the electrons of the floating gate into the drain. As shown in FIG. 62, the data is erased by using the FN tunnel current to inject the electrons into the floating gate from the substrate (channel whole surface).

In the divide bit line NOR (DINOR) type flash memory of FIG. 63, single power operation is possible as in the NAND type flash memory. Moreover, the memory has both a feature that the memory cell size is small and a feature that a high-speed random access is possible like the NOR type flash memory.

In the cell unit of the DINOR type flash memory, since the main bit lines and the sub-bit line in the memory cell array are formed in a stratified structure, the size is substantially equal to that of the AND unit of the AND type. The structure of the memory cell is of a stacked gate type in the same manner as the structure of the memory cell of the NOR type flash memory or the NAND type flash memory, and the drain of the memory cell is connected to the sub-bit line formed of polysilicon.

For example, in a 16-megabits DINOR type flash memory, the sub-bit line is connected to 64 memory cells. When the contact with respect to the memory cell is achieved by a so-called embedded contact between polysilicon and the diffusion layer, the memory cell size can be reduced.

A mechanism of the write/erase of the data with respect to the memory cell is the same as that of the AND type flash memory, and the data is written/erased by the Fowler-Nordheim (FN) tunnel current.

That is, the data is written with respect to the memory cell, when the FN tunnel current is used to extract the electrons of the floating gate into the drain. The data is erased, when the FN tunnel current is used to inject the electrons into the floating gate from the substrate (channel whole surface).

The main bit lines of FIGS. 60 and 63 are connected to the sense amplifier circuit, and the data renewal is performed by the byte unit.

Even when the memory cell array shown in FIG. 60 or 63 is embedded in the chip A of FIGS. 40, 43 to 55 in this manner, it is possible to renew the data by the byte unit with respect to each cell unit of the memory cell array.

Moreover, the memory cell called a silicon-oxide-nitride-silicon cell (SONOS) cell has heretofore been known. The characteristics of the memory cell lie in that the data ("0" of "1") is specified by the amount of the electrons trapped in a silicon nitride film right under the gate electrode (word line). This memory cell may also be embedded in the chip A of FIGS. 40, 43 to 55.

⑤ Example of System

The example of FIG. 64 relates to a memory card including a controller and the embedded chip according to the embodiment of the present invention.

In a memory card 12, a controller 11 and a plurality of memory chips 10*a*, 10*b* are mounted. The controller 11 includes RAM and CPU. Various host interfaces are considered such as an ATA interface, PC card interface, and USB, but the embodiment of the present invention can also be applied. to any interface.

In the present example, the controller (a microcomputer is generally mounted) 11 in the memory card 12 controls various operations of the memories (such as 3Tr. NAND) in the memory chips 10*a*, 10*b*, especially the renewal operation by the byte unit. That is, the controller 11 generates commands for the byte erase, byte write, and the like, and supplies these commands to the memory chips 10*a*, 10*b*.

It is to be noted that the controller 11 and memory chips 10*a*, 10*b* may also be disposed in one chip, or may also be formed in separate chips.

The example of FIG. 65 relates to the memory card on which the controller is not mounted.

In the present example, a card 12*a* on which only the memory chip 10*a* is mounted, or a card 12*b* on which a relatively small-sized logic circuit (ASIC) 14 is mounted is the object. In this case, for example, assuming that the apparatus on the host side connected to the cards 12*a*, 12*b* is a digital camera 13, the controller for controlling the memory chip card 11 disposed in the digital camera 13 supplies the commands for the page erase and byte erase to the memory chips 10*a*, 10*b* in the cards 12*a*, 12*b*.

The example of FIG. 66 relates to the memory chip on which the control circuit for performing all or a part of the control according to the embodiment of the present invention is mounted.

The controller 11 and memory chip 10 are mounted on the memory card 12. The memory chip 10 includes, for example, a control circuit 15 which generates information on the data renewal operation by the byte unit according to the embodiment of the present invention. In the memory chip 10, the control circuit 15 generates the information on the data renewal operation by the byte unit, and stores the information, for example, in a redundant portion of the memory cell array (storage region of an error correction code, and the like). A function of being capable of referring to the information on the data renewal operation by the byte unit from the outside may also be added to the memory chip 10.

The information on the data renewal operation by the byte unit may also be stored in a special memory cell region which cannot directly be referred to from the outside of the memory chip. In this case, the information may also be read to the outside of the memory chip 10 by a specific command.

The control circuit 15 in the memory chip 10 may also have a function of responding to the specific command, for example, returning information indicating whether or not the data renewal by the byte unit is possible or whether or not the data renewal by the byte unit has been normally performed to the controller 11.

In this case, the controller 11 disposed outside the memory chip 10 interprets the response to the specific command, and performs the data renewal operation by the byte unit if necessary.

Moreover, the control circuit 15 embedded on the memory chip 10 may also have a function of controlling not only the operation concerning the data renewal by the byte unit as described above but also an operation of judging refresh conditions or a concrete refresh operation.

Figure 67:
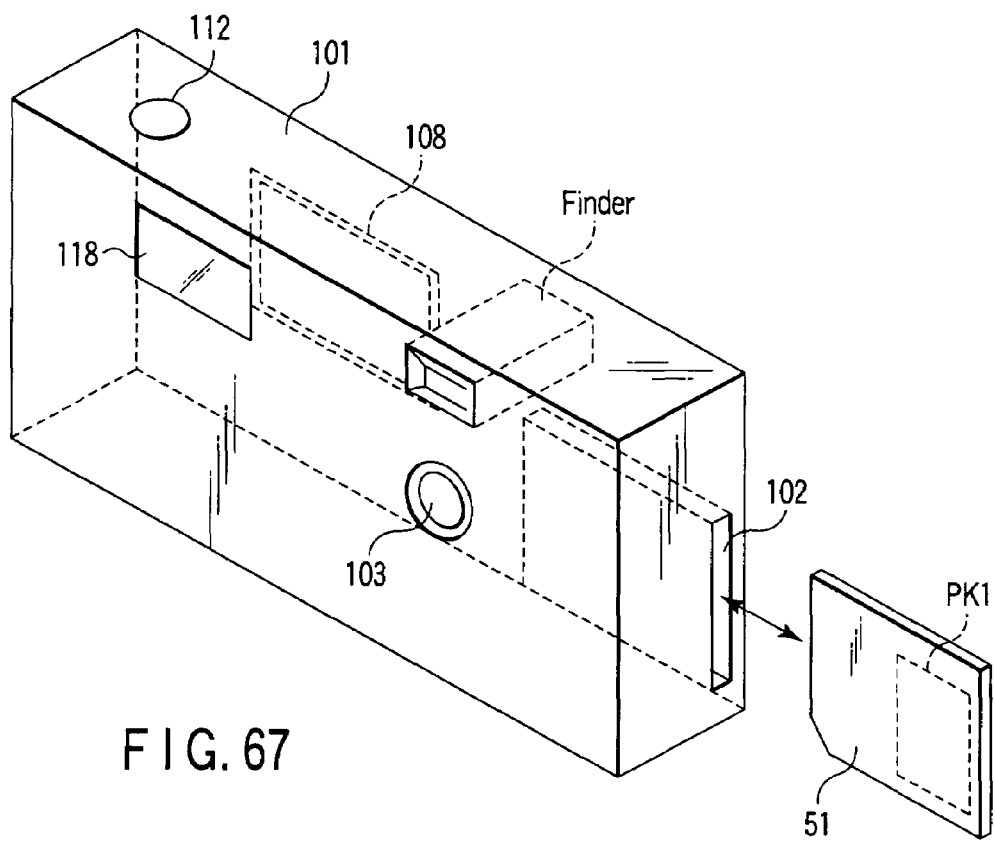
FIG. 67 is a diagram showing a digital still camera to which the embodiment of the present invention is applied.

FIG. 67 shows an example of a system including: the memory card including the embedded chip according to the present invention; and an electronic apparatus using this memory card.

Here, a digital still camera will be described as an example of the electronic apparatus. A memory card 51 is used as a recording medium of a digital still camera 101, and a package (memory chip) PK1 according to the embodiment of the present invention is mounted inside the card. The digital still camera 101 includes a card slot 102 for the memory card 51.

It is to be noted that the memory card 51 may be a contact type IC card or a non-contact type IC card. In the latter case, after the memory card 51 is inserted into the card slot 102, the data is exchanged between the memory card 51 and digital still camera 101 by a radio signal.

Figure 68:
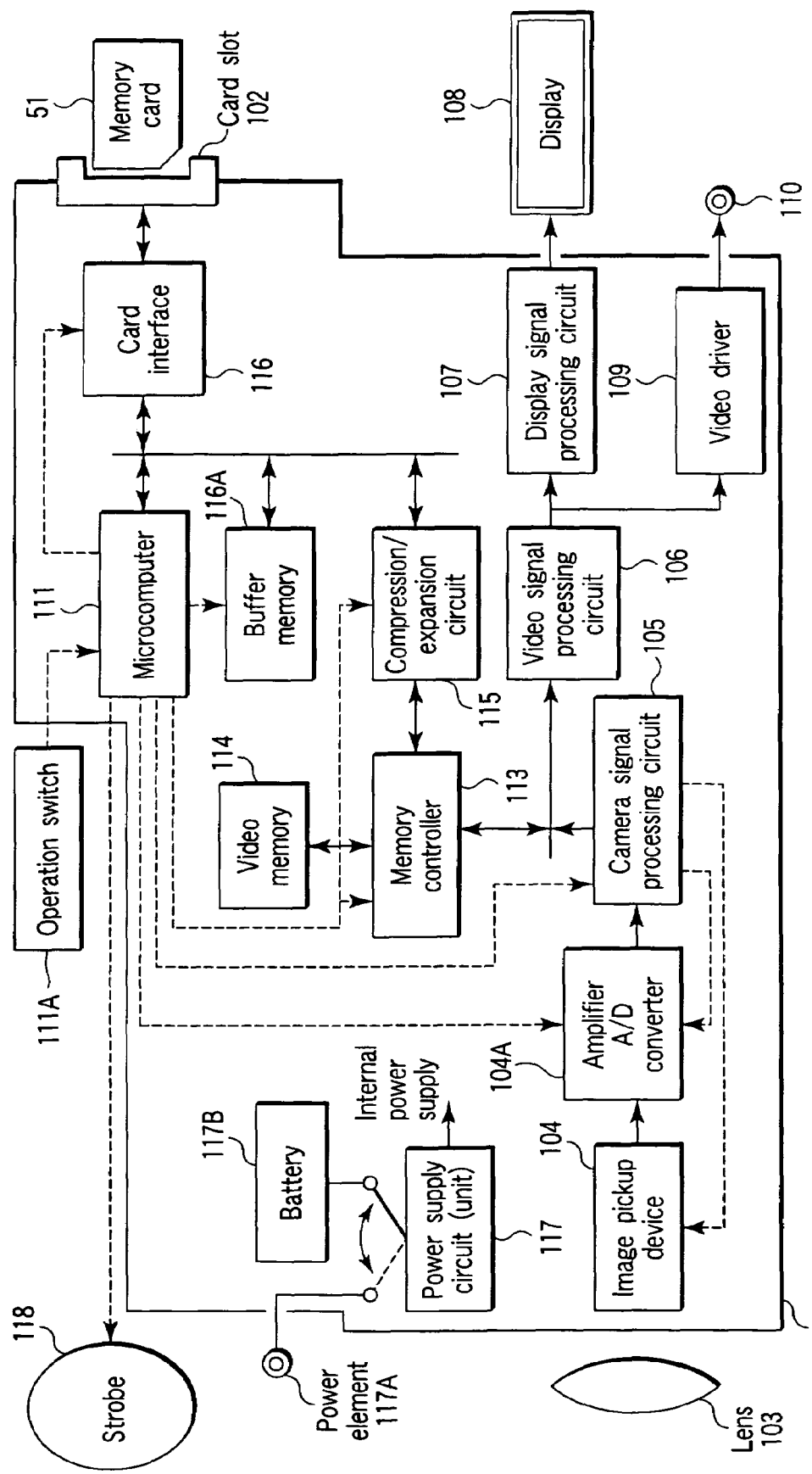
FIG. 68 is a diagram showing an example of a circuit constitution of the camera of FIG. 67.

FIG. 68 shows an example of a circuit constitution of the digital still camera. In FIG. 68, the same components as those of FIG. 67 are denoted with the same reference numerals.

Reference numeral 100 denotes a circuit substrate. After light from a subject is focused by a lens 103, the light is inputted into an image pickup device 104. The image pickup device 104 is, for example, a CMOS image sensor which photoelectrically converts the input light and outputs an analog signal.

The analog signal is amplified by an amplifier 104A and converted to a digital signal by an A/D converter 104A. The digital signal is inputted into a camera signal processing circuit 105. The camera signal processing circuit 105 performs, for example, an automatic exposure control (AE), automatic white balance control (AWB), color separation processing, generation of a luminance signal and color difference signal, and the like.

To monitor the image, the output signal of the camera signal processing circuit 105 is inputted into a video signal processing circuit 106. The video signal processing circuit 106 generates a video signal. For a system of the video signal, for example, the system of National Television System Committee (NTSC) can be used.

The video signal is supplied to a display 108 via a display signal processing circuit 107. The display 108 is, for example, a liquid crystal display disposed in the digital still camera.

Moreover, the video signal is transferred to an output terminal 110 via a video driver 109. When the output terminal 110 is connected to the other display devices such as a plasma display and CRT monitor, these display devices can be used to display the image.

A microcomputer 111 controls the operations of the image pickup device 104, amplifier/A/D converter 104A, and camera signal processing circuit 105.

To capture the image, an operation switch 111A is pressed. At this time, the microcomputer 111 informs a memory controller 113 of this. The memory controller 113 records the output signal of the camera signal processing circuit 105 as a frame image in a video memory 114.

The frame image recorded in the video memory 114 is compressed by a compression/expansion circuit 115, and subsequently recorded in the memory card 51 attached to the card slot 102 via a card interface 116. The frame image recorded in the memory card 51 is inputted into the compression/expansion circuit 115 via the card interface 116. The frame image is expanded by the compression/expansion circuit 115, and subsequently recorded in the video memory 114.

A power supply circuit 117 generates an internal power potential based on the power potential supplied from an external terminal 117A or battery 117B.

In the present example, on the circuit substrate 100, there are mounted the card slot 102, image pickup device 104, amplifier/A/D converter 104A, camera signal processing circuit 105, video signal processing circuit 106, display signal processing circuit 107, video driver 109, microcomputer 111, memory controller 113, video memory 114, compression/expansion circuit 115, card interface 116, buffer memory 116A, power supply circuit 117, and battery 117B.

Additionally, the card slot 102 may also be connected to the circuit substrate 100 by a connector, a cable, and the like.

FIGS. 69 to 78 show another example of the system constituted of the memory card including the embedded chip according to the present invention, and the electronic apparatus using the memory card.

Figure 69:
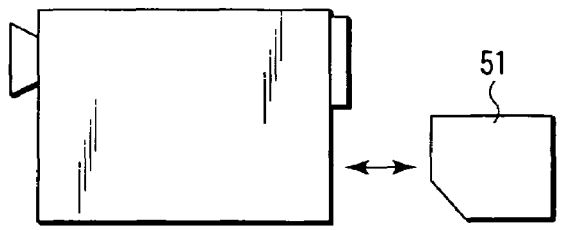
FIG. 69 is a diagram showing a system to which the embodiment of the present invention is applied.
Figure 71:
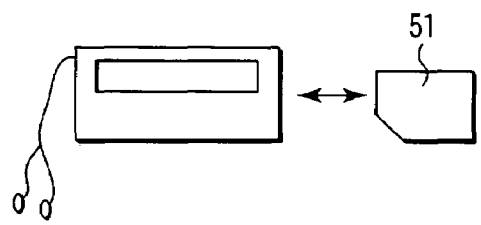
FIG. 71 is a diagram showing the system to which the embodiment of the present invention is applied.
Figure 70:
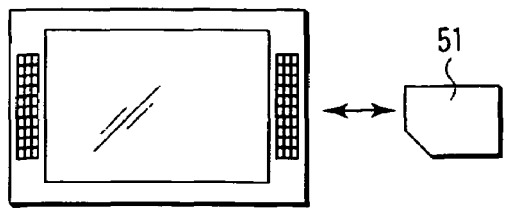
FIG. 70 is a diagram showing the system to which the embodiment of the present invention is applied.

FIG. 69 shows a system constituted of the memory card and a video camera, FIG. 70 shows a system including the memory card and portable television (including a monitor for a car which has a GPS function), and FIG. 71 shows a system including the memory card and an audio apparatus.

Figure 72:
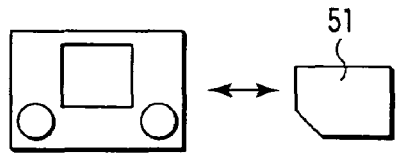
FIG. 72 is a diagram showing the system to which the embodiment of the present invention is applied.

FIG. 72 shows a system including the memory card and a game apparatus, FIG. 73 shows a system including the memory card and an electronic musical instrument, FIG. 74 shows a system including the memory card and a cellular phone, and FIG. 75 shows a system including the memory card and a personal computer.

FIG. 76 shows a system including the memory card and a personal digital assistant (PDA), and FIG. 77 shows a system including the memory card and a voice recorder, and FIG. 78 shows a system including the memory card and a PC card for connecting the memory card to the personal computer.

The above-described example is one example, and the memory including the embedded chip according to the example of the present invention can be applied to various electronic apparatuses.

3. Others

In the above-described embodiment, the data renewal operation by the byte unit in the 3Tr. NAND has mainly been described, and the data renewal operation according to the embodiment of the present invention can also be applied to the nonvolatile semiconductor memories of the NAND, NOR, AND, and DINOR types. In addition to these nonvolatile semiconductor memories, the operation can also be applied to: a magnetic random access memory (MRAM) and resistance random access memory (RRAM) using magnetic materials in the memory cells which have been noticed in recent years; a ferroelectric random access memory (FeRAM) using a ferroelectric material in the memory cell; and an avonics unified memory (OUM) using chalcogenide.

Moreover, the embodiment of the present invention in which the one-bit data is stored in one memory cell has been described, but the present invention can also be applied to a multi-level type memory in which data of a plurality of bits is stored in one memory cell. In this case, the data for a plurality of pages is sometimes stored in the memory cell connected to one control gate line (word line). However, even in this case, no difference is made in renewing the data by the byte unit.

As described above, according to the nonvolatile semiconductor memory of the embodiment of the present invention, particularly in the 3Tr. NAND including the cell unit constituted of one memory cell and two select gate transistors holding the cell between them, when viewed inside and outside the chip, the data renewal by the byte unit is completely possible. Therefore, with respect to the memory cell which is not the object of the renewal, the useless erase/write operation is eliminated, and this can contribute to enhancement of reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A nonvolatile semiconductor memory comprising:
    first cell units each comprising one memory cell and two select gate transistors between which the memory cell is held;
    a word line connected in common to each memory cell of the first cell units;
    bit lines individually connected to the first cell units;
    sense amplifiers disposed for the bit lines; and
    an erase circuit which divides the first cell units into blocks and which sets potentials of the bit lines by a block unit at an erase time;
    wherein the erase circuit comprises high-voltage transistors which supply an erase potential to the bit lines; and
    the high voltage transistors in the same block are controlled by the same column selection signal.

2. The nonvolatile semiconductor memory according to claim 1, wherein each of the blocks comprises two or more first cell units.

3. The nonvolatile semiconductor memory according to claim 1, wherein each of the blocks includes the first cell units for one byte.

4. The nonvolatile semiconductor memory according to claim 1, wherein at the erase time, data is erased by the block unit.

5. The nonvolatile semiconductor memory according to claim 1, wherein at a data renewal time, data is erased with respect to at least one block which is a renewal object and data program is executed with respect to at least one block.

6. The nonvolatile semiconductor memory according to claim 1, wherein at a data renewal time, the data is erased with respect to all the blocks and data program is executed with respect to all the blocks.

7. The nonvolatile semiconductor memory according to claim 1, wherein the high voltage transistor which bears the erase potential is
connected between the bit lines and sense amplifiers.

8. The nonvolatile semiconductor memory according to claim 1, wherein wells are disposed for the blocks, and the first cell units are disposed in the same well by the block unit.

9. The nonvolatile semiconductor memory according to claim 1, wherein at the erase time, the data erase comprises: generating a high electric field between
a drain region and control gate electrode of the memory cell which is an erase object; and extracting electrons into the drain region from a floating gate electrode.

10. The nonvolatile semiconductor memory according to claim 9, wherein the data is erased by hot hole injection into the floating gate electrode from the drain region.

11. The nonvolatile semiconductor memory according to claim 9, wherein the data is erased by electrons flowing into the drain region from the floating gate electrode.

12. The nonvolatile semiconductor memory according to claim 1, wherein data write comprises: generating a high electric field between a channel region and control gate electrode of the memory cell which is a write object; and injecting electrons into a floating gate electrode from the channel region.

13. The nonvolatile semiconductor memory according to claim 1, wherein each memory cell in the first cell units stores the data of one bit or more.

14. The nonvolatile semiconductor memory according to claim 1, further comprising:
second cell units including one or more memory cells; and
one or more word lines connected in common to the second cell units,
wherein the second cell units are individually connected to the bit lines.

15. The nonvolatile semiconductor memory according to claim 14, wherein the number of memory cells included in each of the second cell units is equal to that of word lines connected to the second cell units.

16. The nonvolatile semiconductor memory according to claim 14, wherein the second cell unit is an NAND cell unit in which memory cells are connected in series.

17. A nonvolatile semiconductor memory comprising:
first cell units each comprising one memory cell and two select gate transistors between which the memory cell is held;
a word line connected in common to each memory cell of the first cell units;
bit lines individually connected to the first cell units;
sense amplifiers disposed for the bit lines; source lines which divide the first cell units into blocks and which are connected to the first cell units;
an erase circuit which sets potentials of the source lines by a block unit at an erase time;
wherein the erase circuit comprises high voltage transistors which supply an erase potential to the source lines; and the high voltage transistors in the same block are controlled by the same column selection signal.

18. The nonvolatile semiconductor memory according to claim 17, wherein each of the blocks comprises two or more first cell units.

19. The nonvolatile semiconductor memory according to claim 17, wherein each of the blocks includes the first cell units for one byte.

20. The nonvolatile semiconductor memory according to claim 17, wherein at the erase time, data is erased by the block unit.

21. The nonvolatile semiconductor memory according to claim 17, wherein at a data renewal time, data is erased with respect to at least one block which is a renewal object and data program is executed with respect to at least one block.

22. The nonvolatile semiconductor memory according to claim 17, wherein at a data renewal time, the data is erased with respect to all the blocks and data program is executed with respect to all the blocks.

23. The nonvolatile semiconductor memory according to claim 17, wherein wells are disposed for the blocks, and the first cell units are disposed in the same well by the block unit.

24. The nonvolatile semiconductor memory according to claim 17, wherein at the erase time, the data erase comprises: generating a high electric field between a source region and control gate electrode of the memory cell which is an erase object; and extracting electrons into the source region from a floating gate electrode.

25. The nonvolatile semiconductor memory according to claim 24, wherein the data is erased by hot hole injection into the floating gate electrode from the source region.

26. The nonvolatile semiconductor memory according to claim 24, wherein the data is erased by electrons flowing into the drain region from the floating gate electrode.

27. The nonvolatile semiconductor memory according to claim 17, wherein data write comprises: generating a high electric field between a channel region and control gate electrode of the memory cell which is a write object; and injecting electrons into a floating gate electrode from the channel region.

28. The nonvolatile semiconductor memory according to claim 17, wherein each memory cell in the first cell units stores the data of one bit or more.

29. The nonvolatile semiconductor memory according to claim 17, further comprising:
second cell units including one or more memory cells; and
one or more word lines connected in common to the second cell units,
wherein the second cell units are individually connected to the bit lines.

30. The nonvolatile semiconductor memory according to claim 29, wherein the number of memory cells included in each of the second cell units is equal to that of word lines connected to the second cell units.

31. The nonvolatile semiconductor memory according to claim 29, wherein the second cell unit is an NAND cell unit in which memory cells are connected in series.

32. A nonvolatile semiconductor memory comprising:
first cell units each comprising memory cells connected in series and two select gate transistors between which the memory cells are held;
second cell units each comprising one memory cell and one select gate transistor;
bit lines which are individually connected to the first cell units and which are individually connected to the second cell units and which are connected in common to the first and second cell units;

sense amplifiers disposed for the bit lines, wherein at least an FN tunnel current is used with respect to the respective memory cells in the first and second cell units to perform write/erase; and an erase circuit which divides the first and second cell units into blocks and which sets potentials of the bit lines by a block unit at an erase time, comprising high-voltage transistors which supply an erase potential to the bit lines, wherein the high voltage transistors in the same block are controlled by the same column selection signal.

33. The nonvolatile semiconductor comprising:

first cell units each comprising memory cells connected in series and two select gate transistors between which the memory cells are held;

second cell units each comprising one memory cell and one select gate transistor;

bit lines which are individually connected to the first cell units and which are individually connected to the second cell units and which are connected in common to the first and second cell units;

sense amplifiers disposed for the bit lines, wherein at least an FN tunnel current is used with respect to the respective memory cells in the first and second cell units to perform write/erase source lines which divide the first and second cell units into blocks and which are connected in common to the first and second cell units; and an erase circuit which sets potentials of the source lines by a block unit at an erase time, comprising high-voltage transistors which supply an erase potential to the source lines;

wherein the high-voltage transistors in the same block are controlled by the same column selection signal.

* * * * *